US012813256B2

(12) United States Patent
Zhou et al.

(10) Patent No.: US 12,813,256 B2
(45) Date of Patent: Nov. 24, 2026

(54) THREE-DIMENSIONAL MEMORY DEVICE AND METHOD OF MAKING THEREOF USING ION IMPLANTED ETCH STOP LAYER ON A SACRIFICIAL FILL MATERIAL

(71) Applicant: Sandisk Technologies, Inc., Milpitas, CA (US)

(72) Inventors: Bing Zhou, San Jose, CA (US); Senaka Kanakamedala, San Jose, CA (US); Raghuveer S. Makala, Campbell, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 496 days.

(21) Appl. No.: 18/361,594

(22) Filed: Jul. 28, 2023

(65) Prior Publication Data

US 2024/0371761 A1 Nov. 7, 2024

Related U.S. Application Data

(60) Provisional application No. 63/499,549, filed on May 2, 2023.

(51) Int. Cl.
*H10W 20/41* (2026.01)
*G11C 16/04* (2006.01)
(Continued)

(52) U.S. Cl.
CPC ....... *H10W 20/435* (2026.01); *G11C 16/0483* (2013.01); *H10B 41/10* (2023.02);
(Continued)

(58) Field of Classification Search
None
See application file for complete search history.

(56) References Cited

U.S. PATENT DOCUMENTS 8,614,126 B1 12/2013 Lee et al.
8,884,357 B2 11/2014 Wan et al.
(Continued)

OTHER PUBLICATIONS

Endoh et al., "Novel Ultra High-Density Memory with a Stacked-Surrounding Gate Transistor (S-SGT) Structured Cell," IEDM Proc. (2001) 33-36.

(Continued)

*Primary Examiner* — Sarah K Salerno
(74) *Attorney, Agent, or Firm* — THE MARBURY LAW GROUP PLLC

(57) ABSTRACT

A method includes forming a first alternating stack of first insulating layers and first sacrificial material layers over a substrate, forming a first in-process inter-tier dielectric layer over the first alternating stack, forming a first memory opening through the first in-process inter-tier dielectric layer and the first alternating stack, forming a sacrificial memory opening fill structure in the first memory opening, doping an upper portion of the sacrificial memory opening fill structure with atoms of at least one dopant species, forming a second alternating stack of second insulating layers and second sacrificial material layers over the first alternating stack, forming a second memory opening through the second alternating stack by performing an anisotropic etch process, and removing the sacrificial memory opening fill structure.

14 Claims, 49 Drawing Sheets

(51) Int. Cl.

| | |
|---|---|
| ***H10B 41/10*** | (2023.01) |
| ***H10B 41/27*** | (2023.01) |
| ***H10B 43/10*** | (2023.01) |
| ***H10B 43/27*** | (2023.01) |
| ***H10W 20/42*** | (2026.01) |

(52) U.S. Cl.
CPC ............. *H10B 41/27* (2023.02); *H10B 43/10* (2023.02); *H10B 43/27* (2023.02); *H10W 20/42* (2026.01)

(56) References Cited

U.S. PATENT DOCUMENTS

| | | | | |
|---|---|---|---|---|
| 8,946,023 | B2 | 2/2015 | Makala et al. | |
| 8,969,153 | B2 | 3/2015 | Lee et al. | |
| 9,023,719 | B2 | 5/2015 | Pachamuthu et al. | |
| 9,230,979 | B1 | 1/2016 | Pachamuthu et al. | |
| 9,379,124 | B2 | 6/2016 | Sharangpani et al. | |
| 9,437,606 | B2 | 9/2016 | Makala et al. | |
| 9,449,982 | B2 | 9/2016 | Lu et al. | |
| 9,460,931 | B2 | 10/2016 | Pachamuthu et al. | |
| 9,515,080 | B2 | 12/2016 | Takahashi et al. | |
| 9,520,406 | B2 | 12/2016 | Makala et al. | |
| 9,524,976 | B2 | 12/2016 | Pachamuthu et al. | |
| 9,530,788 | B2 | 12/2016 | Oginoe et al. | |
| 9,698,153 | B2 | 7/2017 | Liu et al. | |
| 9,768,192 | B1 | 9/2017 | Nakamura et al. | |
| 9,768,270 | B2 | 9/2017 | Gunji-Yoneoka et al. | |
| 9,780,034 | B1 | 10/2017 | Tsutsumi et al. | |
| 10,242,994 | B2 | 3/2019 | Inomata et al. | |
| 10,748,925 | B1 | 8/2020 | Tsutsumi et al. | |
| 10,854,513 | B2 | 12/2020 | Kawasaki et al. | |
| 10,964,715 | B2 | 3/2021 | Kakazu et al. | |
| 11,018,152 | B2 | 5/2021 | Hinoue et al. | |
| 11,101,284 | B2 | 8/2021 | Pachamuthu et al. | |
| 11,296,101 | B2 | 4/2022 | Lee et al. | |
| 2015/0076580 | A1 | 3/2015 | Pachamuthu et al. | |
| 2017/0271261 | A1 | 9/2017 | Tsutsumi et al. | |
| 2017/0271352 | A1 | 9/2017 | Nakamura | |
| 2018/0006049 | A1 | 1/2018 | Inomata et al. | |
| 2018/0331117 | A1* | 11/2018 | Titus ...................... | H10B 43/27 |
| 2020/0251486 | A1 | 8/2020 | Tsutsumi et al. | |
| 2021/0005627 | A1 | 1/2021 | Hinoue et al. | |
| 2023/0328981 | A1* | 10/2023 | Fujimura ............... | H10B 41/10<br>257/314 |
| 2023/0328984 | A1* | 10/2023 | Fujimura ............... | H10B 41/27<br>257/314 |
| 2023/0345720 | A1* | 10/2023 | Nagase .................. | H10B 41/27 |
| 2023/0389317 | A1* | 11/2023 | Togo ...................... | H10B 41/10 |
| 2024/0138149 | A1* | 4/2024 | Zhou ...................... | H10B 43/50 |

OTHER PUBLICATIONS

U.S. Appl. No. 18/350,524, filed Jul. 11, 2023, SanDisk Technologies LLC.

U.S. Appl. No. 18/350,552, filed Jul. 11, 2023, SanDisk Technologies LLC.

U.S. Appl. No. 18/358,702, filed Jul. 25, 2023, SanDisk Technologies LLC.

U.S. Appl. No. 18/358,727, filed Jul. 25, 2023, SanDisk Technologies LLC.

* cited by examiner

THREE-DIMENSIONAL MEMORY DEVICE AND METHOD OF MAKING THEREOF USING ION IMPLANTED ETCH STOP LAYER ON A SACRIFICIAL FILL MATERIAL

FIELD

The present disclosure relates generally to the field of semiconductor devices, and particularly to methods for forming a three-dimensional memory device including forming an ion implanted etch stop layer on a sacrificial opening fill material, and a memory device formed by the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a semiconductor structure is provided, which comprises: a first alternating stack of first insulating layers and first electrically conductive layers; a second alternating stack of second insulating layers and second electrically conductive layers that overlies the first alternating stack; a first inter-tier dielectric layer stack located between the first alternating stack and the second alternating stack and comprising a lower first inter-tier dielectric layer having a first material composition and an upper first inter-tier dielectric layer having a second material composition that differs from the first material composition by presence of atoms of at least one dopant species therein; a memory opening vertically extending at least through each layer within the first alternating stack and the second alternating stack; and a memory opening fill structure located in the memory opening and comprising a vertical semiconductor channel and a vertical stack of memory elements located at levels of the first electrically conductive layers and the second electrically conductive layers.

According to another aspect of the present disclosure, a method of forming a semiconductor structure is provided. The method comprises: forming a first alternating stack of first insulating layers and first sacrificial material layers over a substrate; forming a first in-process inter-tier dielectric layer over the first alternating stack; forming a first memory opening through the first in-process inter-tier dielectric layer and the first alternating stack; forming a sacrificial memory opening fill structure in the first memory opening; doping an upper portion of the sacrificial memory opening fill structure with atoms of at least one dopant species, wherein a lower portion of the sacrificial memory opening fill structure comprises a sacrificial fill material that is not doped with the at least one dopant species and an upper portion of the sacrificial memory opening fill structure comprises a doped sacrificial fill material that is doped with the atoms of the at least one dopant species; forming a second alternating stack of second insulating layers and second sacrificial material layers over the first alternating stack; forming a second memory opening through the second alternating stack by performing an anisotropic etch process that has an etch chemistry to which the doped sacrificial fill material provides a higher etch resistance than the sacrificial fill material; forming an multi-tier memory opening that includes a volume of the second memory opening and a volume of the first memory opening by removing the sacrificial memory opening fill structure; forming a memory opening fill structure in the multi-tier memory opening, wherein the memory opening fill structure comprises a vertical semiconductor channel and a vertical stack of memory elements; and replacing the first sacrificial material layers and the second sacrificial material layers with first electrically conductive layers and second electrically conductive layers, respectively.

DETAILED DESCRIPTION

Figure 1:
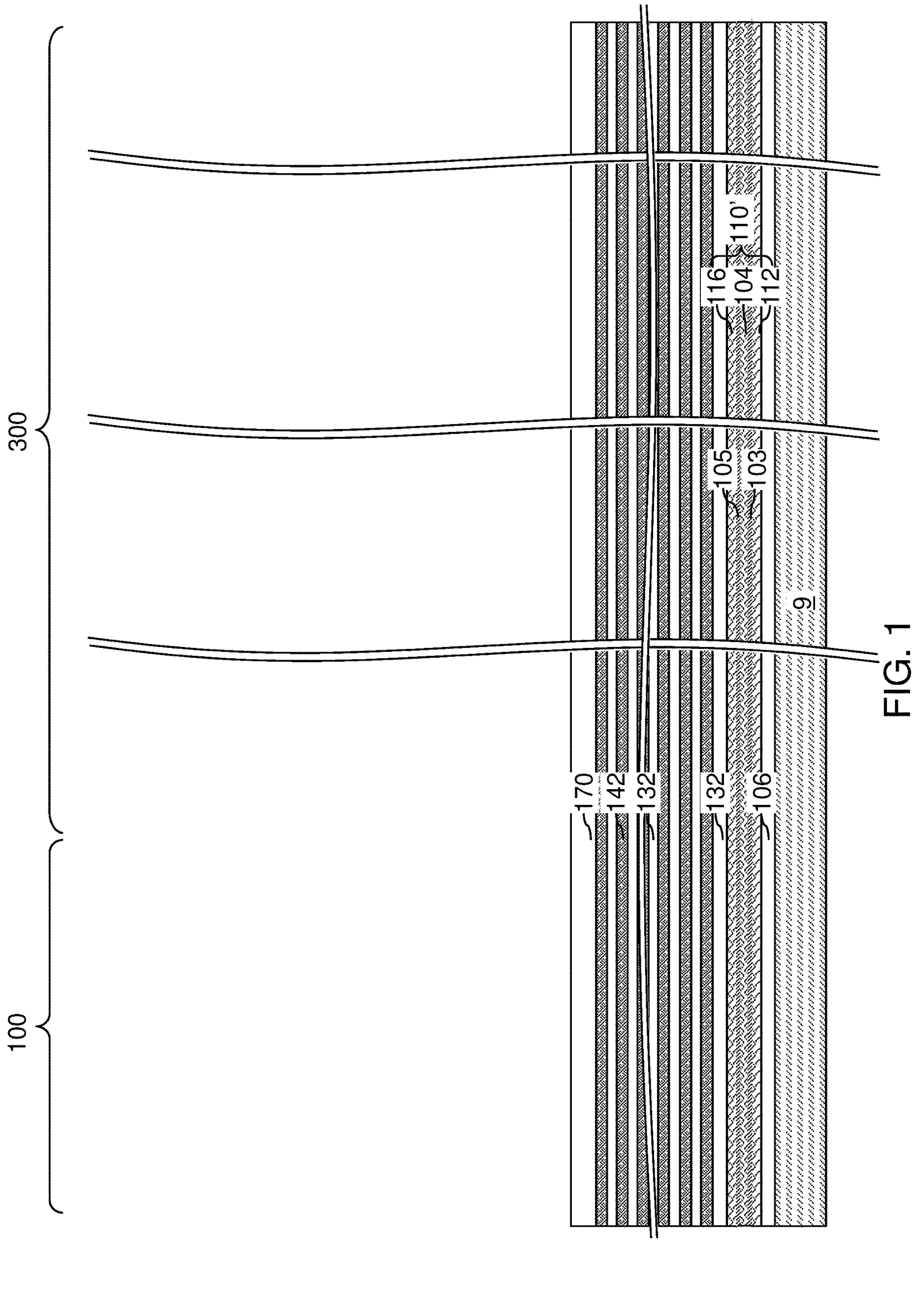
FIG. 1 is a schematic vertical cross-sectional view of a first exemplary structure for forming a memory die after formation of a stopper insulating layer, in-process source-level material layers, a first alternating stack of first insulating layers and first sacrificial material layers, and a first in-process inter-tier dielectric layer over a carrier substrate according to an embodiment of the present disclosure.

As discussed above, the embodiments of the present disclosure are directed to methods for forming a three-dimensional memory device including forming an ion implanted etch stop layer on a sacrificial opening fill material, and a memory device formed by the same, of which various aspects are now described in detail. Embodiments of the disclosure can be employed to form semiconductor devices, such as three-dimensional memory devices comprising a plurality of memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0\times10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to an embodiment of the present disclosure is illustrated. The first exemplary structure comprises a carrier substrate 9, which may be a semiconductor substrate. For example, the carrier substrate 9 may comprise a commercially available silicon wafer. Alternatively, the carrier substrate 9 may comprise any material that may be removed selective the materials of overlying materials which are subsequently formed.

An optional insulating material layer can be formed on a top surface of the carrier substrate 9. The insulating material layer can be subsequently employed as a stopping material layer for an optional process that removes the carrier substrate 9, and is herein referred to as a stopper insulating layer 106. In one embodiment, the stopper insulating layer 106 comprises a dielectric material such as undoped silicate glass (i.e., silicon oxide), a doped silicate glass, or silicon nitride. The thickness of the stopper insulating layer 106 may be in a range from 50 nm to 600 nm, such as from 100 nm to 300 nm, although lesser and greater thicknesses may also be employed.

In-process source-level material layers 110' can be formed over the stopper insulating layer 106. The in-process source-level material layers 110' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 110' may include, from bottom to top, a lower source-level semiconductor layer 112, an optional lower sacrificial liner 103, a source-level sacrificial layer 104, an optional upper sacrificial liner 105, and an upper source-level semiconductor layer 116.

The lower source-level semiconductor layer 112 and the upper source-level semiconductor layer 116 may include a doped semiconductor material such as doped polysilicon or doped amorphous silicon. The conductivity type of the lower source-level semiconductor layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level semiconductor layer 112 and the upper source-level semiconductor layer 116 have a doping of a second conductivity type that is the opposite of the first conductivity type. The thickness of each of the lower source-level semiconductor layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 (or selective to the lower source-level semiconductor layer 112) and the upper sacrificial liner 105 (or selective to the upper source-level semiconductor layer 116). In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used. The lower sacrificial liner 103 (if present) and the upper sacrificial liner 105 (if present) include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

A first alternating stack of first insulating layers 132 and first spacer material layers can be formed over the in-process source-level material layer 110'. In one embodiment, the first spacer material layers may comprise first sacrificial material layers 142. In this case, a first alternating stack (132, 142) of first insulating layers 132 and first sacrificial material layers 142 can be formed over the in-process source-level material layer 110'. The first insulating layers 132 comprise an insulating material, such as undoped silicate glass (i.e., silicon oxide) or a doped silicate glass, and the first sacrificial material layers 142 comprise a sacrificial material, such as silicon nitride or silicon-germanium. In one embodiment, the first insulating layers 132 may comprise silicon oxide layers, and the first sacrificial material layers 142 may comprise silicon nitride layers. The first alternating stack (132, 142) may comprise multiple repetitions of a unit layer stack including a first insulating layer 132 and a first sacrificial material layer 142. The total number of repetitions of the unit layer stack within the first alternating stack (132, 142) may be, for example, in a range from 8 to 1,024, such as from 32 to 256, although lesser and greater number of repetitions may also be employed.

Each of the first insulating layers 132 may have a thickness in a range from 20 nm to 100 nm, such as from 30 nm to 60 nm, although lesser and greater thicknesses may also be employed. Each of the first sacrificial material layers 142 may have a thickness in a range from 20 nm to 100 nm, such as from 30 nm to 60 nm, although lesser and greater thicknesses may also be employed.

A first in-process inter-tier dielectric layer 170 can be formed over the first alternating stack (132, 142). In one embodiment, the first in-process inter-tier dielectric layer 170 has a homogeneous material composition throughout. In one embodiment, the first in-process inter-tier dielectric layer 170 comprises, and/or consists essentially of, a dielectric material selected from undoped silicate glass and a doped silicate glass. In one embodiment, the first in-process inter-tier dielectric layer 170 may have a thickness in a range from 60 nm to 400 nm, such as from 100 nm to 300 nm, although lesser and greater thicknesses may also be employed.

The first in-process inter-tier dielectric layer 170 may be formed by chemical vapor deposition. In one embodiment, the first in-process inter-tier dielectric layer 170 comprises a silicon oxide material formed by decomposition of a precursor material (such as tetraethylorthosilicate (TEOS)) for silicon oxide deposition. In one embodiment, the first in-process inter-tier dielectric layer 170 may include residual carbon atoms and/or residual hydrogen atoms. In one embodiment, the carbon concentration in the first in-process inter-tier dielectric layer 170 may be in a range from 2 parts per million to 5,000 parts per million, such as from 10 parts per million to 1,000 parts per million. In one embodiment, the hydrogen concentration in the first in-process inter-tier dielectric layer 170 may be in a range from 100 parts per million to 10,000 parts per million, such as from 300 parts per million to 5,000 parts per million.

The first exemplary structure comprises a memory array region 100 in which a three-dimensional array of memory elements is to be subsequently formed, and a contact region 300 in which layer contact via structures contacting word lines are to be subsequently formed.

While an embodiment is described in which the first spacer material layers are formed as first sacrificial material layers 142, the first spacer material layers may be formed as first electrically conductive layers in an alternative embodiment. Generally, the spacer material layers formed in any alternating stack of insulating layers and spacer material layers of the present disclosure may be formed as, or may be subsequently replaced at least partly with, electrically conductive layers. Such variations of embodiments of the present disclosure are expressly contemplated herein.

Figure 2:
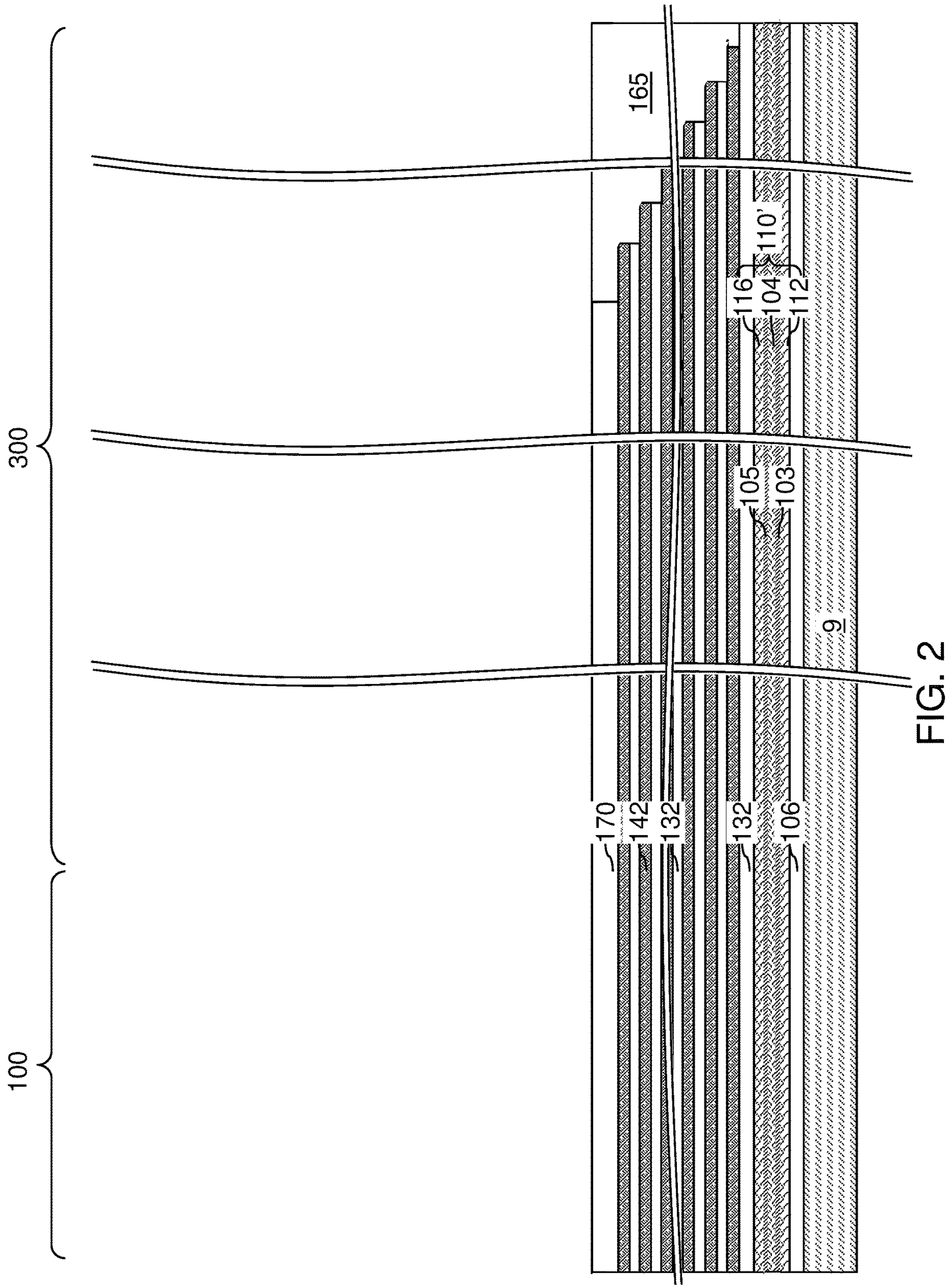
FIG. 2 is a schematic vertical cross-sectional view of the first exemplary structure after formation of first stepped surfaces and a first retro-stepped dielectric material portion according to an embodiment of the present disclosure.

Referring to FIG. 2, optional first stepped surfaces are formed in the contact region 300. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A first stepped cavity is formed within the volume from which portions of the first alternating stack (132, 142) and the first in-process inter-tier dielectric layer 170 are removed through formation of the first stepped surfaces. A "stepped cavity" refers to a cavity having stepped surfaces.

The first stepped cavity can have various first stepped surfaces such that the horizontal cross-sectional shape of the first stepped cavity changes in steps as a function of the vertical distance from the top surface of the in-process source-level material layer 110'. In one embodiment, the first stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each first sacrificial material layer 142 other than a topmost first sacrificial material layer 142 within the first alternating stack (132, 142) laterally extends farther than any overlying first sacrificial material layer 142 within the first alternating stack (132, 142) in the terrace region. The first stepped surfaces of the first alternating stack (132, 142) continuously extend from a bottommost layer within the first alternating stack (132, 142) to the first in-process inter-tier dielectric layer 170. Generally, the first stepped surfaces continuously extend from a bottommost layer within the first alternating stack (132, 142) at least to a topmost layer within the first alternating stack (132, 142).

A first retro-stepped dielectric material portion 165 (i.e., an insulating fill material portion) can be formed in the first stepped cavity by deposition of a dielectric material therein. For example, a dielectric material such as silicon oxide can be deposited in the first stepped cavity. Excess portions of the deposited dielectric material can be removed from above the top surface of the first in-process inter-tier dielectric layer 170, for example, by chemical mechanical planarization (CMP). The remaining portion of the deposited dielectric material filling the first stepped cavity constitutes the first retro-stepped dielectric material portion 165. As used herein, a "retro-stepped" element refers to an element that has first stepped surfaces and a horizontal cross-sectional area that increases monotonically as a function of a vertical distance from a top surface of a substrate on which the element is present. If silicon oxide is employed for the first retro-stepped dielectric material portion 165, the silicon oxide of the first retro-stepped dielectric material portion 165 may, or may not, be doped with dopants such as B. P, and/or F. In one embodiment, the first retro-stepped dielectric material portion 165 overlies and contacts the first stepped surfaces, and has a top surface that is coplanar with the top surface of the first in-process inter-tier dielectric layer 170.

Figure 3A:
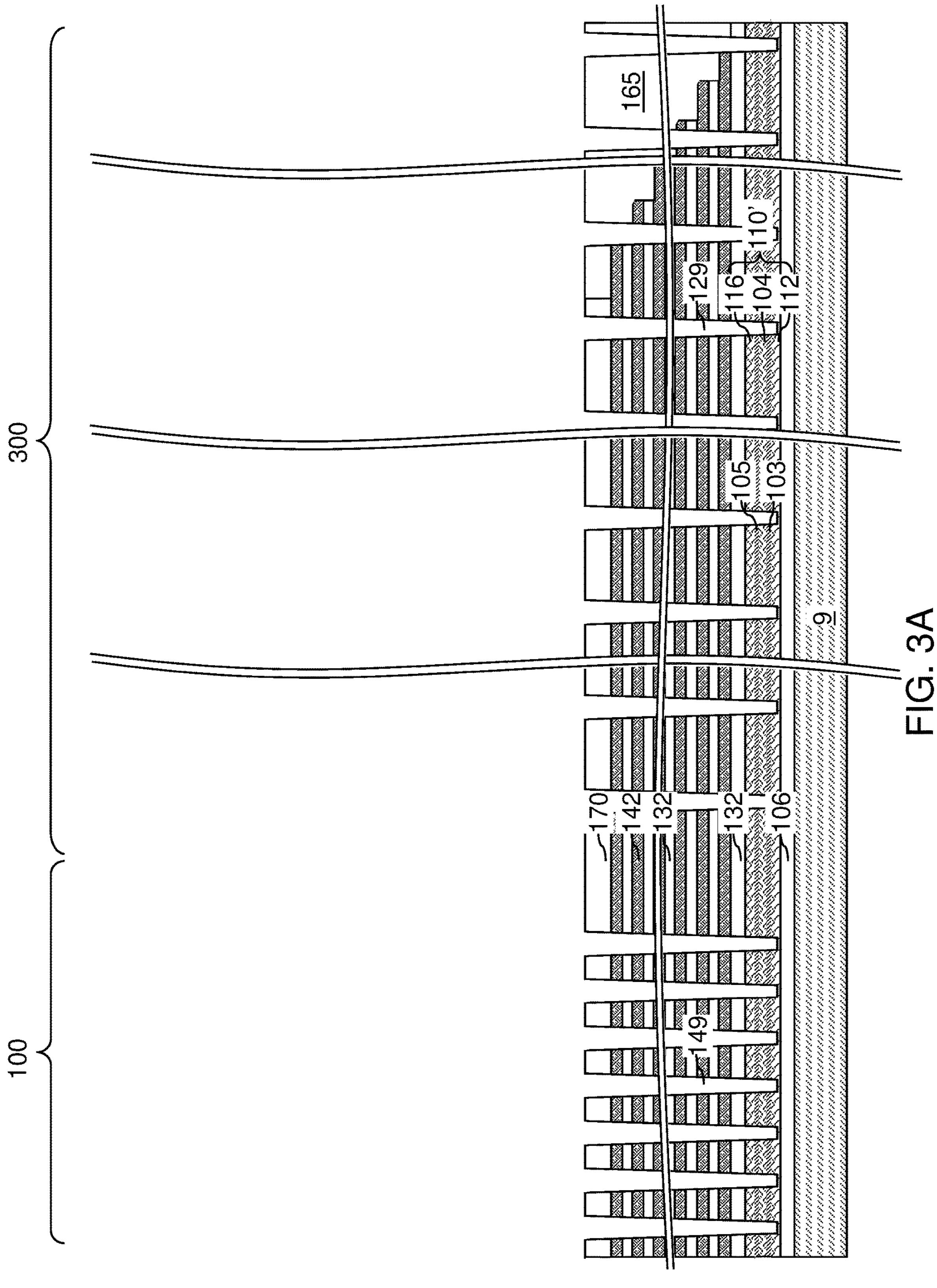
FIG. 3A is a schematic vertical cross-sectional view of the first exemplary structure after forming first memory openings and first support openings according to an embodiment of the present disclosure.
Figure 3B:
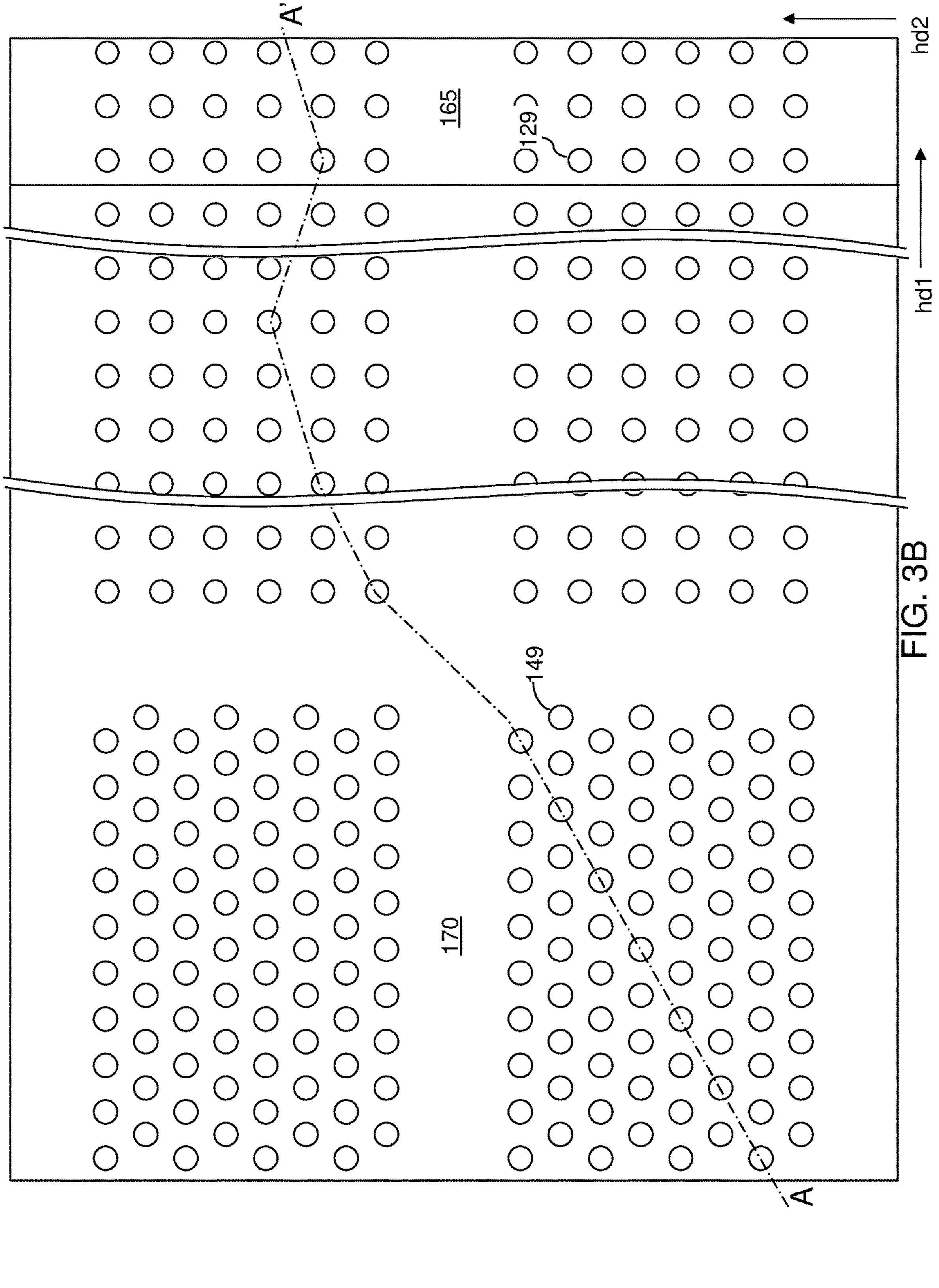
FIG. 3B is a top-down view of the first exemplary structure of FIG. 3A. The vertical plane A-A' is the cut plane of the vertical cross-sectional view of FIG. 3A.

Referring to FIGS. 3A and 3B, a first etch mask layer (not shown) can be formed over the first in-process inter-tier dielectric layer 170, and can be lithographically patterned to form various openings therein. A first anisotropic etch process can be performed to transfer the pattern of the openings in the first etch mask layer through the first alternating stack (132, 142) and the first retro-stepped dielectric material portion 165. Various openings can be formed through the first alternating stack (132, 142) and the first retro-stepped dielectric material portion 165. The various openings may comprise first memory openings 149 that are formed in the memory array region 100 and first support openings 129 that are formed in the contact region 300. Each of the first memory openings 149 and the first support openings 129 can vertically extend through the first alternating stack (132, 142) and into the in-process source-level material layers 110' In one embodiment, bottom surfaces of the first memory openings 149 and the first support openings 129 may be formed within the lower source-level semiconductor layer 112 or at an interface between the lower source-level semiconductor layer and the stopper insulating layer 106.

The first support openings 129 may have a maximum diameter in a range from 50 nm to 400 nm, such as from 70 nm to 300 nm, although lesser and greater maximum diameters may be employed. The first memory openings 149 may have a maximum diameter in a range from 50 nm to 400 nm, such as from 70 nm to 300 nm, although lesser and greater maximum diameters may be employed.

In one embodiment, the memory array region 100 may be laterally spaced apart from the contact region 300 along a first horizontal direction hd1. The first memory openings 149 may comprise rows of first memory openings 149 that are arranged along the first horizontal direction hd1 and laterally spaced apart along a second horizontal direction hd2 that is perpendicular to the first horizontal direction hd2. Multiple clusters of first memory openings 149, each containing a respective two-dimensional periodic array of first memory openings 149, may be formed in the memory array region 100. The clusters of first memory openings 149 may be laterally spaced apart along the second horizontal direction hd2.

Figure 4:
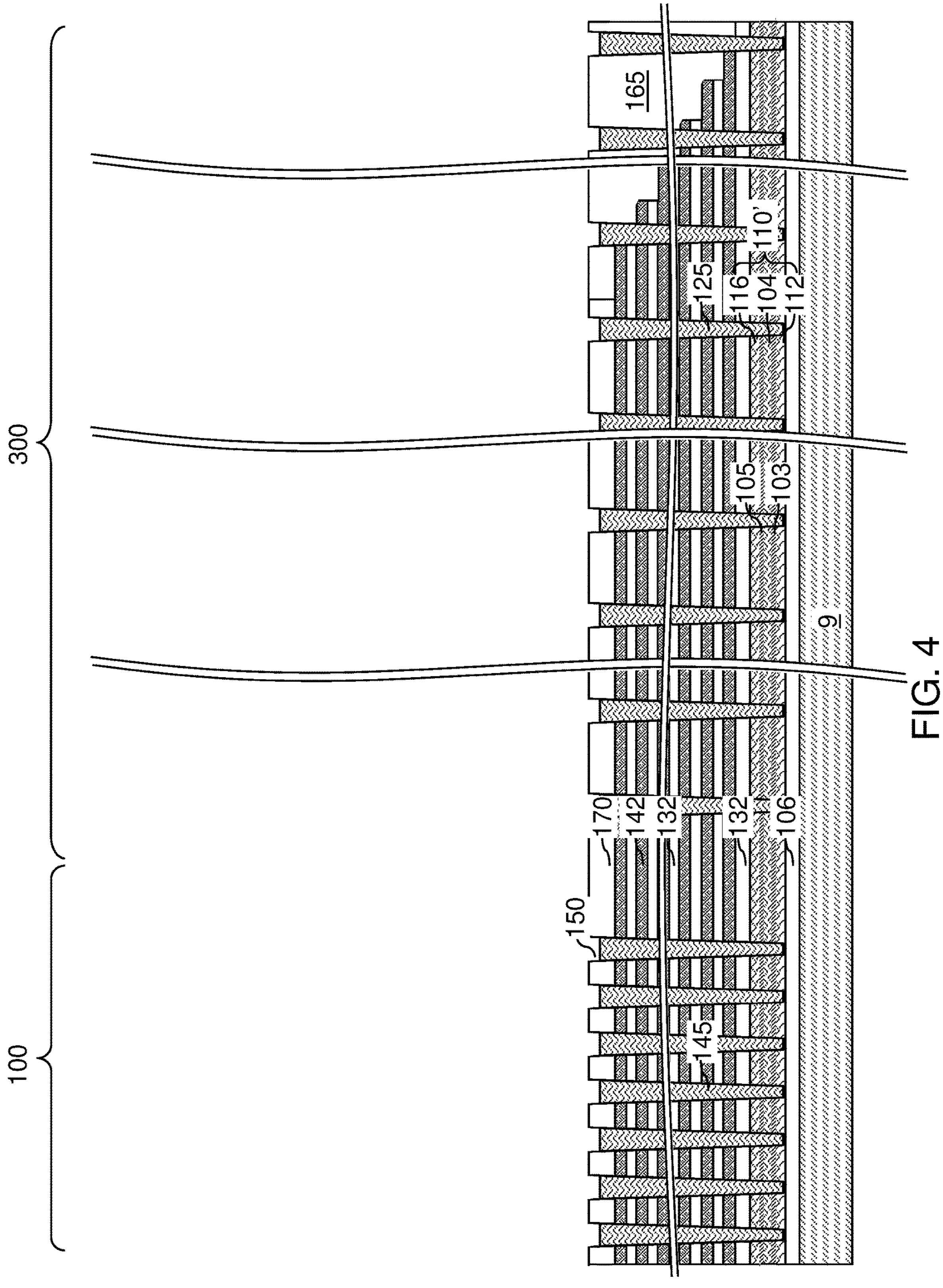
FIG. 4 is a schematic vertical cross-sectional view of the first exemplary structure after formation of first lower sacrificial opening fill material portions according to an embodiment of the present disclosure.

Referring to FIG. 4, an optional etch stop liner (not shown) and a first sacrificial fill material can be deposited in the first memory openings 149 and the first support openings 129. The optional etch stop liner (if present) comprises a thin silicon oxide layer having a thickness in a range from 1 nm to 6 nm. The first sacrificial fill material may comprise a carbon-based material, such as amorphous carbon or diamond-like carbon.

A recess etch process can be performed to remove portions of the first sacrificial fill material from above the horizontal plane including the top surface of the first in-process inter-tier dielectric layer 170. The recess etch process can be continued such that each remaining portion of the first sacrificial fill material has a top surface between a horizontal plane including a top surface of the first in-process inter-tier dielectric layer 170 and a horizontal plane including a bottom surface of the first in-process inter-tier dielectric layer 170. Remaining portions of the first sacrificial fill material that fill the first memory openings 149 and the first support openings 129 constitute first lower sacrificial opening fill material portions (145, 125). The first lower sacrificial opening fill material portions (145, 125) comprise first lower sacrificial memory opening fill material portions 145 that are formed in the first memory openings 149, and first lower sacrificial support opening fill material portions 125 that are formed in the first support openings 129. A recess cavity 150 is formed above each first lower sacrificial opening fill material portions (145, 125). The depth of the recess cavities may be in a range from 10% to 60%, such as from 20% to 50%, of the thickness of the first in-process inter-tier dielectric layer 170.

Figure 5:
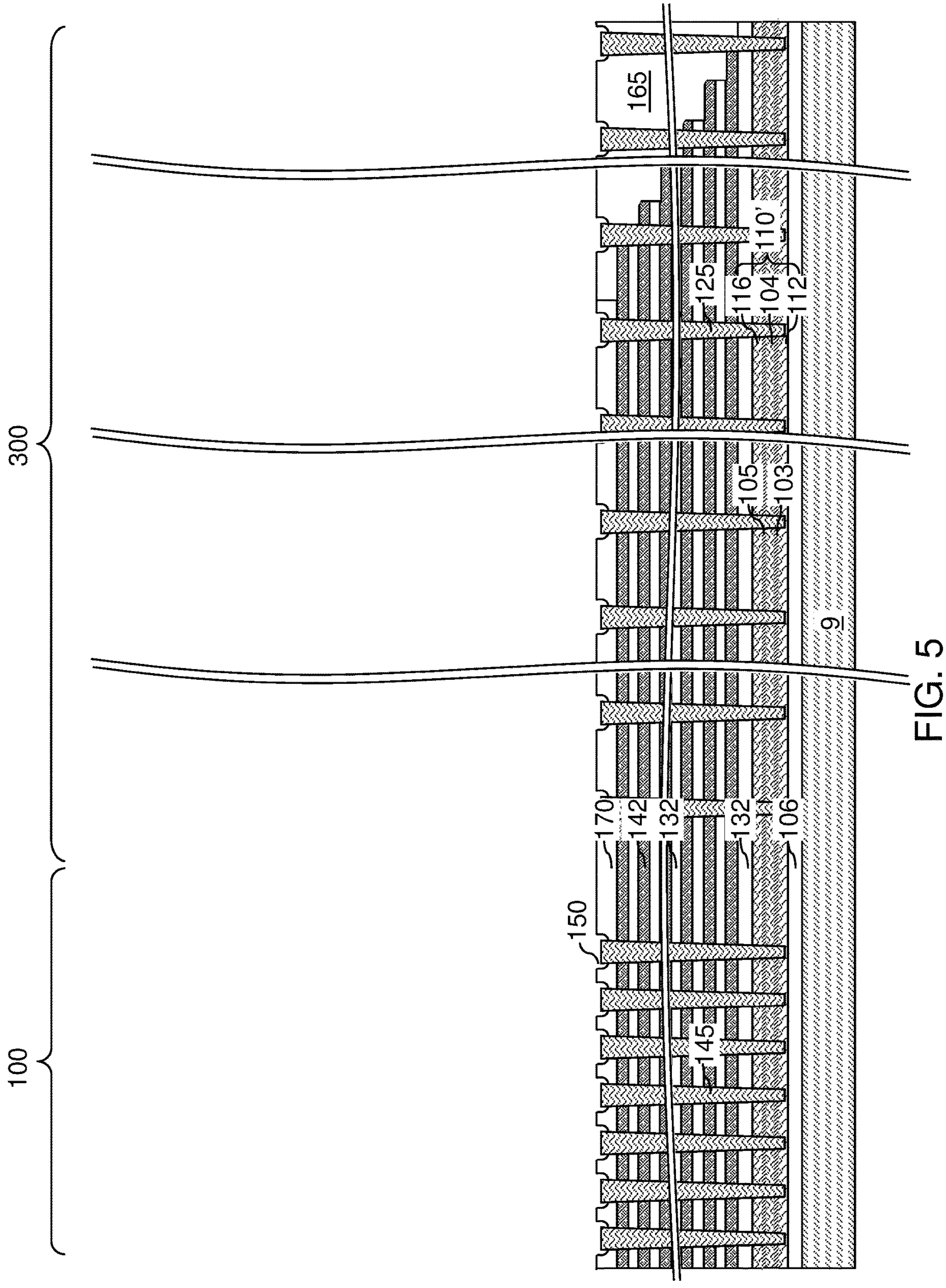
FIG. 5 is a schematic vertical cross-sectional view of the first exemplary structure after isotropically recessing the first in-process inter-tier dielectric layer according to an embodiment of the present disclosure.

Referring to FIG. 5, an isotropic etch process can be performed to etch the material of the first in-process inter-tier dielectric layer 170 selective to the material of the first lower sacrificial opening fill material portions (145, 125). Each recess cavity 150 overlying the first lower sacrificial opening fill material portions (145, 125) can be isotropically expanded as the surface portions of the first lower sacrificial opening fill material portions (145, 125) are isotropically recessed by during the isotropic etch process.

The etch distance of the isotropic etch process may be in a range from 10% to 40%, such as from 15% to 30%, of the thickness of the first in-process inter-tier dielectric layer 170 as provided after the processing steps of FIG. 4 prior to the processing steps of FIG. 5. The etch distance may be in a range from 10 nm to 160 nm, such as from 20 nm to 100 nm, although lesser and greater etch distances may also be employed. The top surface of the first in-process inter-tier dielectric layer 170 can be vertically recessed by the etch distance of the isotropic etch process. The thickness of the first in-process inter-tier dielectric layer 170 after the isotropic etch process may be in a range from 50 nm to 360 nm, such as from 80 nm to 240 nm, although lesser and greater thicknesses may also be employed. Each recessed surface around a cavity 150 in an upper portion of a respective one of the first memory openings 149 and the first support openings 129 may comprise a cylindrical surface segment and an annular tapered concave surface segment that is adjoined to a bottom periphery of the cylindrical surface segment. The annular tapered concave surface segment may have a radius of curvature that is the same as the etch distance of the isotropic etch process.

Figure 6:
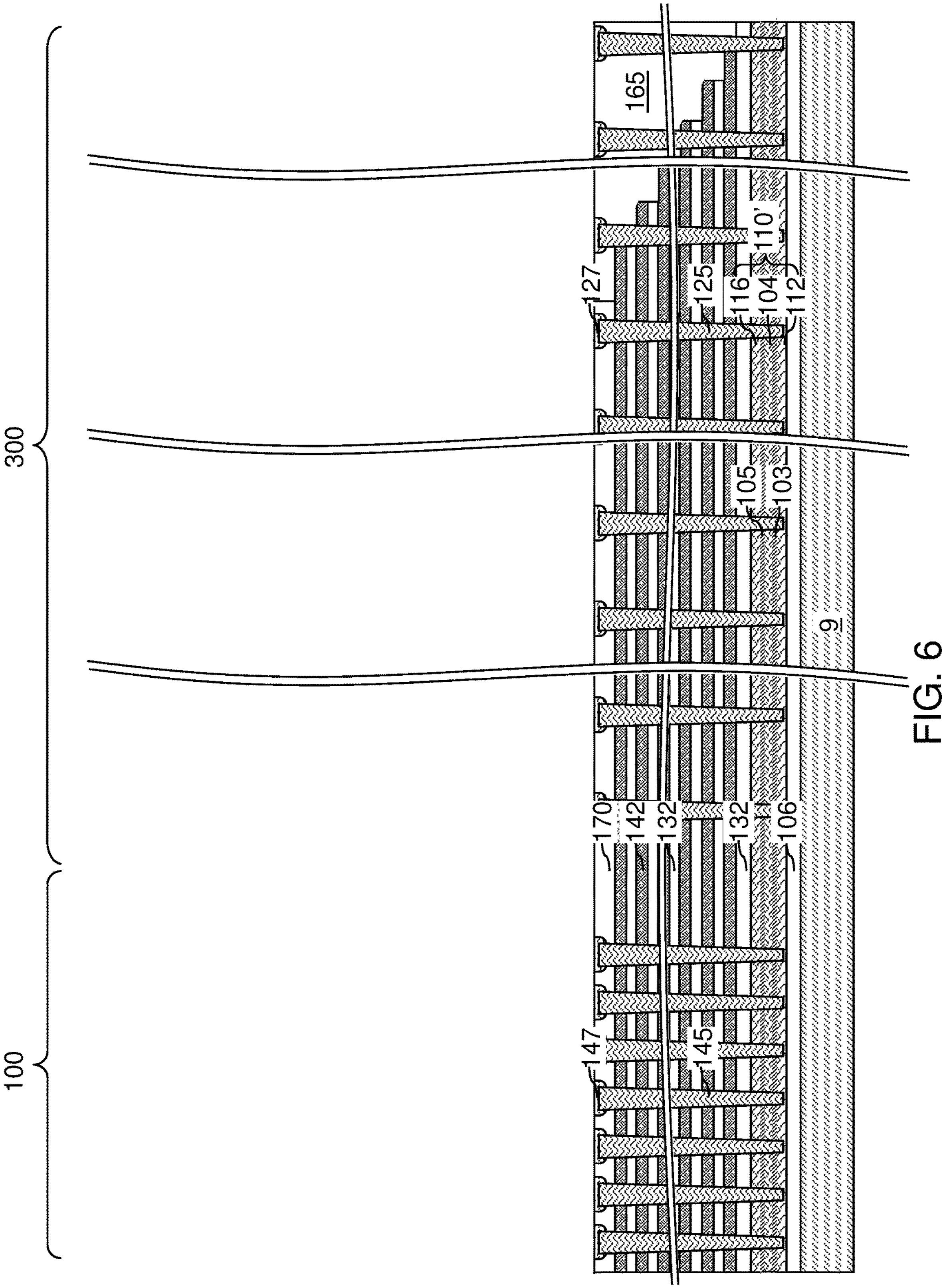
FIG. 6 is a schematic vertical cross-sectional view of the first exemplary structure after formation of first upper sacrificial opening fill material portions according to an embodiment of the present disclosure.

Referring to FIG. 6, a first sacrificial capping material can be deposited in the cavities 150 in the upper portions of the first memory openings 149 and the first support openings 129. The first sacrificial capping material may comprise a carbon-based material, such as amorphous carbon or diamond-like carbon. In one embodiment, the first sacrificial capping material may be the same as the first sacrificial fill material.

A planarization process can be performed to remove portions of the first sacrificial capping material from above the horizontal plane including the top surface of the first in-process inter-tier dielectric layer 170. For example, a chemical mechanical polishing process can be performed to remove the portions of the first sacrificial capping material the overlie the horizontal plane including the first in-process inter-tier dielectric layer 170. Remaining portions of the first sacrificial capping material that fill the first memory openings 149 and the first support openings 129 constitute first upper sacrificial opening capping material portions (147, 127). The first upper sacrificial opening capping material portions (147, 127) comprise first upper sacrificial memory opening capping material portions 147 that are formed in the first memory openings 149, and first upper sacrificial support opening capping material portions 127 that are formed in the first support openings 129.

Each contiguous combinations of first lower sacrificial opening capping material portions (145, 125) and respective first upper sacrificial opening capping material portions (147, 127) constitute first sacrificial opening fill structures {(145, 147), (125, 127)}. The first sacrificial opening fill structures {(145, 147), (125, 127)} comprise first sacrificial memory opening fill structures (145, 147) and first sacrificial support opening fill structures (125, 127). Each first sacrificial memory opening fill structure (145, 147) comprises a first lower sacrificial memory opening fill material portion 145 and a first upper sacrificial memory opening capping material portion 147. Each first sacrificial support opening fill structure (125, 127) comprises a first lower sacrificial support opening fill material portion 125 and a first upper sacrificial support opening capping material portion 127.

Figure 7:
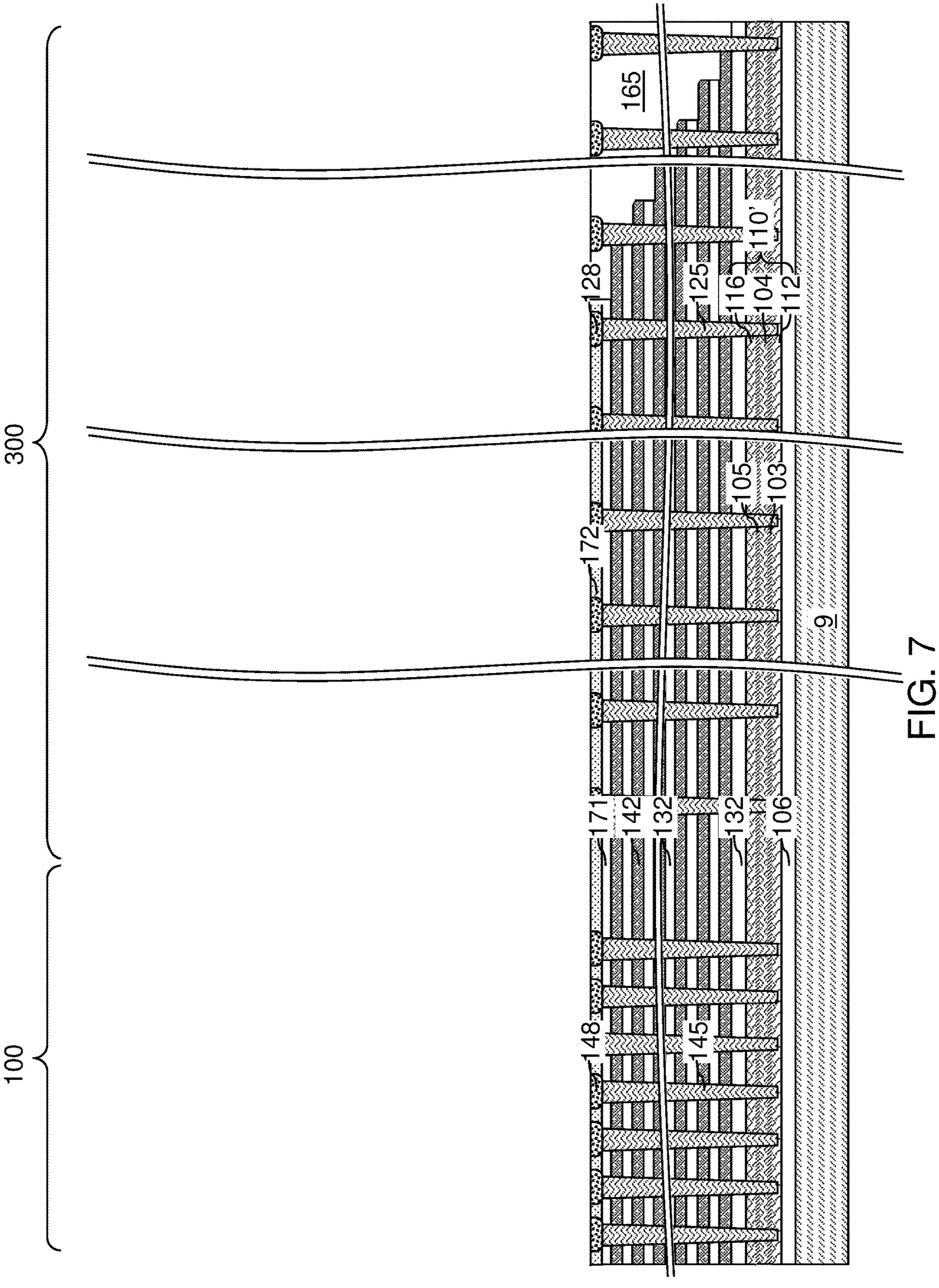
FIG. 7 is a schematic vertical cross-sectional view of the first exemplary structure after performing a first ion implantation process according to an embodiment of the present disclosure.

Referring to FIG. 7, a first ion implantation process can be performed to implant atoms of at least one dopant species into an upper portion of the first in-process inter-tier dielectric layer 170 and into at least the upper portions of the capping material portions (127, 147). According to an aspect of the present disclosure, the at least one dopant species is selected from elements that increase the etch resistance (i.e., etch selectivity) of the first sacrificial capping material of the capping material portions (127, 147).

Specifically, the at least one dopant species can be selected to increase the etch resistance of the first sacrificial capping material (and optionally the first sacrificial fill material) during a subsequent anisotropic etch process to be employed to form openings through a second alternating stack of second insulating layers and second spacer material layers to be formed above the first in-process inter-tier dielectric layer 170. In one embodiment, the at least one dopant species may comprise noble gas elements (i.e., Group 18 elements of the Periodic Table), such as He, Ne, Ar, Kr, etc. The noble gas elements implanted into the silicon oxide dielectric layer 170 do not affect the device performance.

In one embodiment, the implantation depth of the first ion implantation process can be less than the thickness of the first in-process inter-tier dielectric layer 170. For example, the implantation depth of the first ion implantation process may be in a range from 40 nm to 300 nm, such as from 80 nm to 200 nm, although lesser and greater implantation depths can also be employed. The implantation depth in the first retro-stepped dielectric material portion 165 may be the same as the implantation depth in the first in-process inter-tier dielectric layer 170.

Generally, the upper portion of each first sacrificial opening fill structure {(145, 147), (125, 127)} can be doped by performing an ion implantation process that implants the atoms of at least one dopant species. The implanted upper portion of each first sacrificial opening fill structure {(145, 147), (125, 127)} can be converted into a doped sacrificial material portion (148, 128). The doped sacrificial material portions (148, 128) comprise first doped sacrificial memory opening capping portions 148 that are formed in the first memory openings 149, and first doped sacrificial support opening capping portions 128 that are formed in the first support openings 129. Each first sacrificial memory opening fill structure (145, 148) can comprise a respective first lower sacrificial memory opening fill material portion 145 and a respective first doped sacrificial memory opening capping portion 148. Each first sacrificial support opening fill structure (125, 128) can comprise a respective first lower sacrificial support opening fill material portion 125 and a respective first doped sacrificial support opening capping portion 128.

Generally, a lower portion (145 or 125), i.e., a first lower sacrificial opening fill material portion (145 or 125), of the first sacrificial opening fill structures {(145, 148), (125, 128)} comprises a lower first sacrificial fill material that is not doped with the at least one dopant species and an upper portion doped sacrificial material portion (148, 128) which comprises a first doped sacrificial fill material that is doped with the atoms of the at least one dopant species. The ion implantation process may comprise an unmasked ion implantation process that implants atoms of the at least one first dopant species into an upper portion of the first in-process inter-tier dielectric layer 170 and into an upper portion of the first retro-stepped dielectric material portion 165.

According to an aspect of the present disclosure, the first in-process inter-tier dielectric layer 170 is converted into an optional lower first inter-tier dielectric layer 171 and an upper first inter-tier dielectric layer 172. The upper first inter-tier dielectric layer 172 comprises a portion of the first in-process inter-tier dielectric layer 170 that is doped with atoms of the at least one dopant species. The optional lower first inter-tier dielectric layer 171 (if present) comprises a portion of the first in-process inter-tier dielectric layer 170 that is not doped with the at least one dopant species, i.e., the unimplanted portion of the first in-process inter-tier dielectric layer 170. The layer stack comprising the lower first inter-tier dielectric layer 171 and the upper first inter-tier dielectric layer 172 is herein referred to as a first inter-tier dielectric layer stack (171, 172). The lower first inter-tier dielectric layer 171 has a first material composition. The upper first inter-tier dielectric layer 172 has a second material composition that differs from the first material composition by presence of atoms of at least one dopant species therein. In one embodiment, the first material composition can be a homogeneous material composition, and the second material composition can be an inhomogeneous material composition having a non-uniform vertical atomic concentration profile of the atoms of the at least one dopant species. For example, the lower first inter-tier dielectric layer 171 may comprise undoped silicon oxide, and the upper first inter-tier dielectric layer 172 may comprise noble gas doped silicon oxide.

In one embodiment, the first alternating stack (132, 142) comprises first stepped surfaces that continuously extends from a bottommost layer within the first alternating stack (132, 142) to a topmost layer within the first alternating stack (132, 142). A first retro-stepped dielectric material portion 165 overlies and contacts the first stepped surfaces, and has a top surface that is coplanar with a top surface of the first inter-tier dielectric layer stack (171, 172). The upper surface portion of the first retro-stepped dielectric material portion 165 is doped with additional atoms of at least one dopant species.

The dose of the at least one dopant species employed in the first ion implantation process may be selected such that the average atomic percentage of atoms of the at least one dopant species (e.g., noble gas atoms) in the implanted portions of the first in-process inter-tier dielectric layer 170 (i.e., in the upper first inter-tier dielectric layer 172) and in the implanted portion of the first retro-stepped dielectric material portion 165 is in a range from $1\times10^{15}$ $cm^{-3}$ to $5\times10^{21}$ $cm^{-3}$, although lesser and greater atomic percentages may also be employed.

Figure 8:
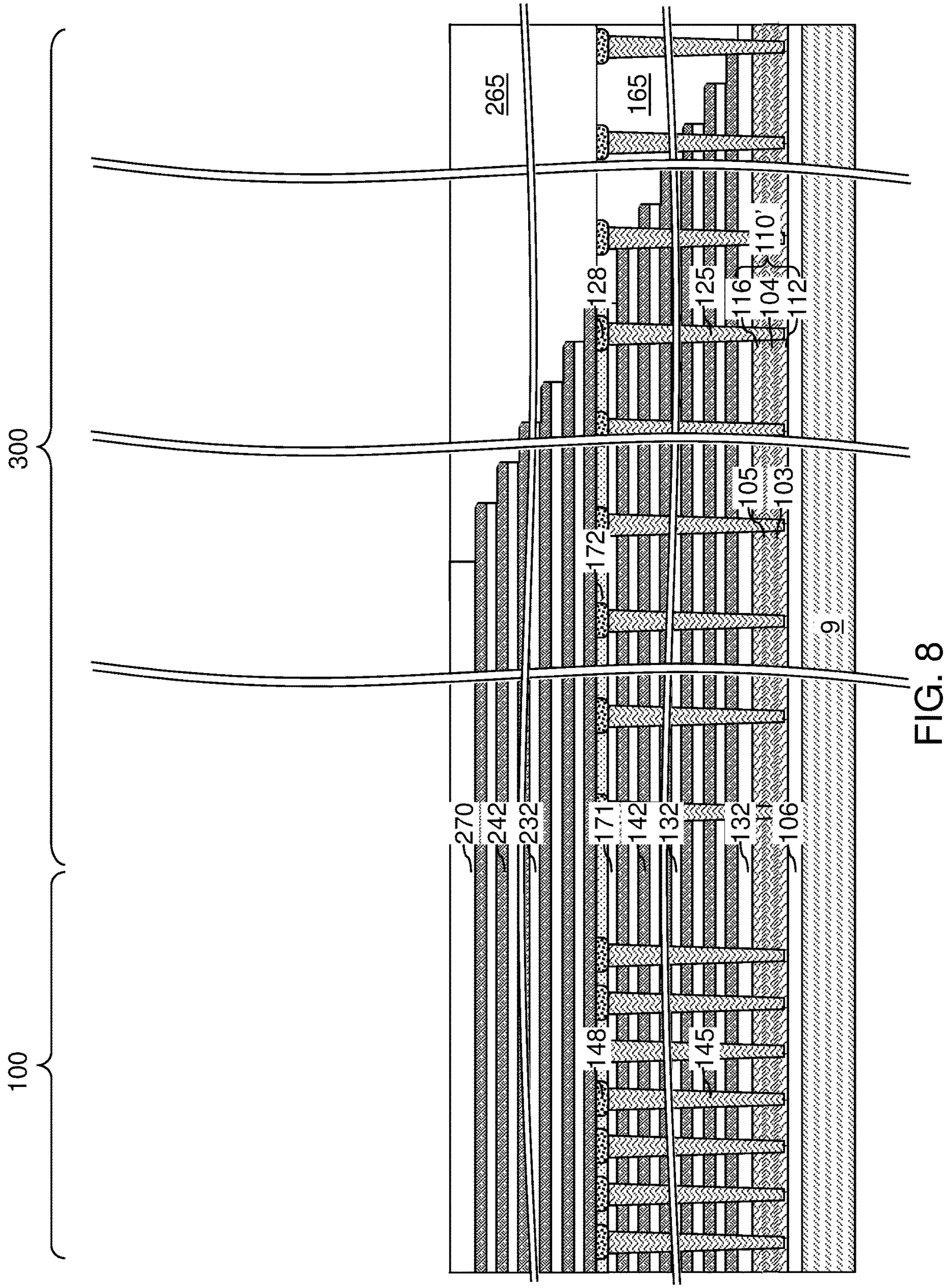
FIG. 8 is a schematic vertical cross-sectional view of the first exemplary structure after formation of a second alternating stack of second insulating layers and second sacrificial material layers, a second first in-process inter-tier dielectric layer, second stepped surfaces, and a second retro-stepped dielectric material portion according to an embodiment of the present disclosure.

Referring to FIG. 8, a second alternating stack of second insulating layers 232 and second spacer material layers can be formed over the first inter-tier dielectric layer stack (171, 172). In one embodiment, the second spacer material layers may comprise second sacrificial material layers 242. In this case, a second alternating stack (232, 242) of second insulating layers 232 and second sacrificial material layers 242 can be formed over the first inter-tier dielectric layer stack (171, 172). In one embodiment, the second insulating layers 232 may comprise silicon oxide layers, and the second sacrificial material layers 242 may comprise silicon nitride layers. The second alternating stack (232, 242) may comprise multiple repetitions of a unit layer stack including a second insulating layer 232 and a second sacrificial material layer 242. The total number of repetitions of the unit layer stack within the second alternating stack (232, 242) may be, for example, in a range from 8 to 2,024, such as from 32 to 256, although lesser and greater number of repetitions may also be employed.

A second in-process inter-tier dielectric layer 270 can be formed over the second alternating stack (232, 242). In one embodiment, the second in-process inter-tier dielectric layer 270 has a homogeneous material composition throughout. In one embodiment, the second in-process inter-tier dielectric layer 270 comprises, and/or consists essentially of silicon oxide. The second in-process inter-tier dielectric layer 270 may have the same thickness and composition as the first in-process inter-tier dielectric layer 270.

Second stepped surfaces are formed in the contact region 300. A second stepped cavity is formed within the volume from which portions of the second alternating stack (232, 242) and the second in-process inter-tier dielectric layer 270 are removed through formation of the second stepped surfaces. A second retro-stepped dielectric material portion 265 (i.e., an insulating fill material portion) can be formed in the second stepped cavity by deposition of a dielectric material followed by planarization. The second retro-stepped dielectric material portion 265 may have the same composition and configuration as the first retro-stepped dielectric material portion 165.

Figure 9:
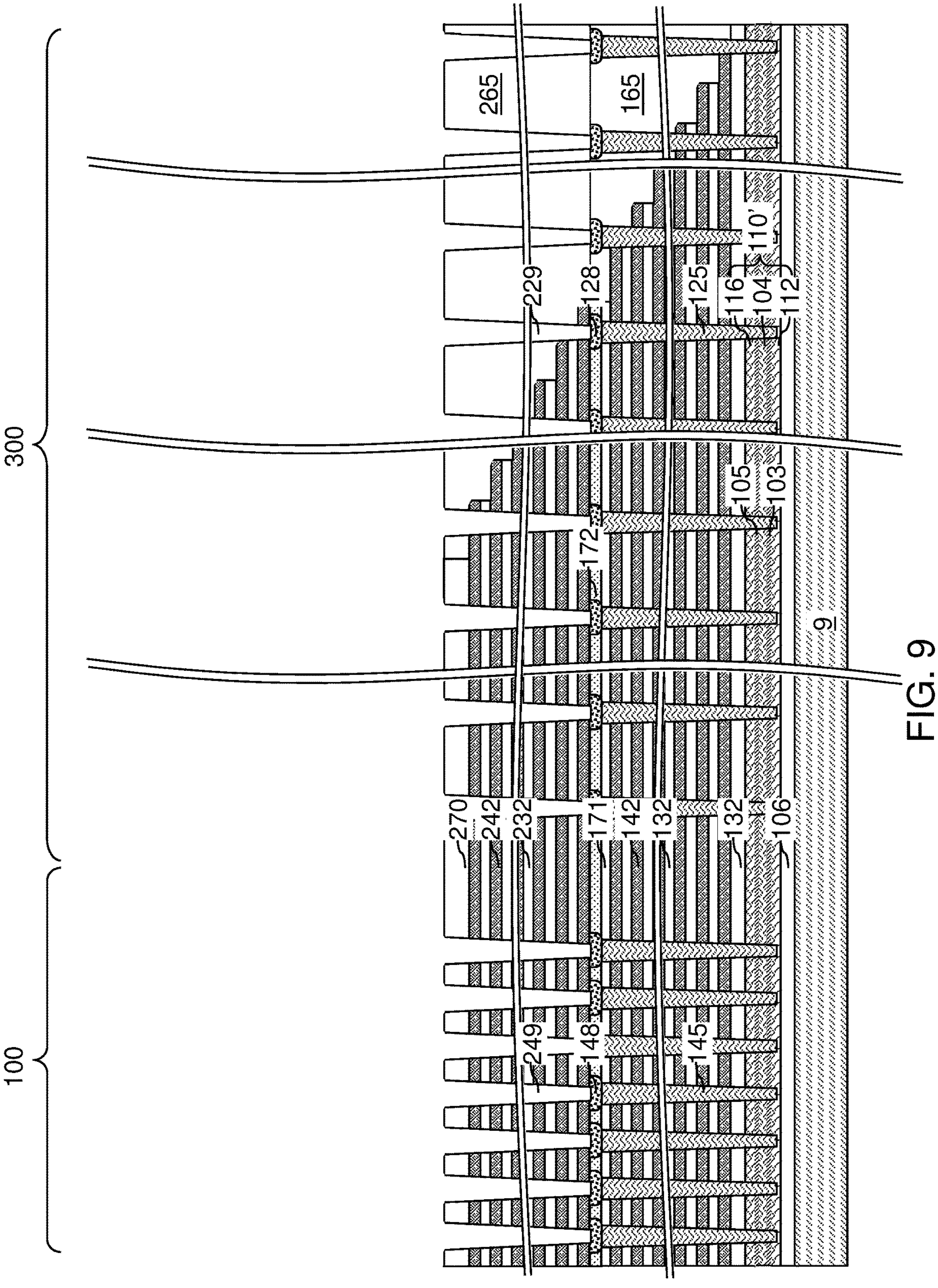
FIG. 9 is a schematic vertical cross-sectional view of the first exemplary structure after forming second memory openings and second support openings according to an embodiment of the present disclosure.

Referring to FIG. 9, a second etch mask layer (not shown) can be formed over the second in-process inter-tier dielectric layer 270, and can be lithographically patterned to form various openings therein. A second anisotropic etch process can be performed to transfer the pattern of the openings in the second etch mask layer through the second alternating stack (232, 242) and the second retro-stepped dielectric material portion 265. Various openings can be formed through the second alternating stack (232, 242) and the second retro-stepped dielectric material portion 265. The various openings may comprise second memory openings 249 that are formed in the memory array region 100 and second support openings 229 that are formed in the contact region 300. Each of the second memory openings 249 and the second support openings 229 can vertically extend through the second alternating stack (232, 242) and on a top surface of a respective one of the first sacrificial opening fill structures {(145, 148), (125, 128)}. Specifically, a top surface of a first doped sacrificial memory opening capping portion 148 can be physically exposed underneath each second memory opening 249, and a top surface of a first doped sacrificial support opening capping portion 128 can be physically exposed underneath each second support opening 229. The diameter of the second memory openings 249 and the second support openings 229 may be the same as that of the respective first memory openings 149 and the first support openings 129.

According to an aspect of the present disclosure, the etch chemistry of the second anisotropic etch process and the species of the at least one dopant in the first doped sacrificial opening capping portions (148, 128) can be selected such that the first doped sacrificial fill material of the first doped sacrificial opening capping portions (148, 128) provides a higher etch resistance (i.e., etch selectivity) than the first sacrificial fill material of the first lower sacrificial opening fill material portions (145, 125) which is not doped with the at least one dopant. In an illustrative example, the second insulating layers 232 may comprise silicon oxide and the second sacrificial material layers 242 may comprise silicon nitride, and the second anisotropic etch process may employ $CF_4$, $CHF_3$, $C_4F_8$, $SF_6$, and/or $NF_3$ as an etchant gas. Examples of etch chemistries that can etch silicon oxide and silicon nitride include a combination of $CF_4$ and $CHF_3$, a combination of $C_4F_8$ and Ar, a combination of $SF_6$ and $O_2$, or a combination of $NF_3$ and Ar.

As discussed above, the first sacrificial fill material of the first lower sacrificial opening fill material portions (145, 125) may comprise and/or may consist essentially of an undoped carbon-based material (such as amorphous carbon or diamond-like carbon) while the first doped sacrificial opening capping portions (148, 128) may comprise and/or may consist essentially of noble gas doped carbon.

According to an aspect of the present disclosure, the increase in the etch resistivity (i.e., etch selectivity) of the first doped sacrificial fill material of the first doped sacrificial opening capping portions (148, 128) relative to the first sacrificial fill material of the first lower sacrificial opening fill material portions (145, 125) reduces the depth of the overetch into the first doped sacrificial fill material of the first doped sacrificial opening capping portions (148, 128). Thus, a more aggressive over etch may be used to form the second memory openings 249 and the second support openings 229, which leads to an improved control of the bottom critical diameter (BCD) of these openings. Therefore, a more uniform distribution of diameter as a function of depth of the openings (249, 229) and decreased bow of these openings may be achieved. This leads to a reduced delta critical diameter (i.e., bow minus BCD) of these openings. Furthermore, the critical diameter (CD) of the openings (249, 229) may be reduced, due to a smaller CD bias. This increases the device density.

Figure 10A:
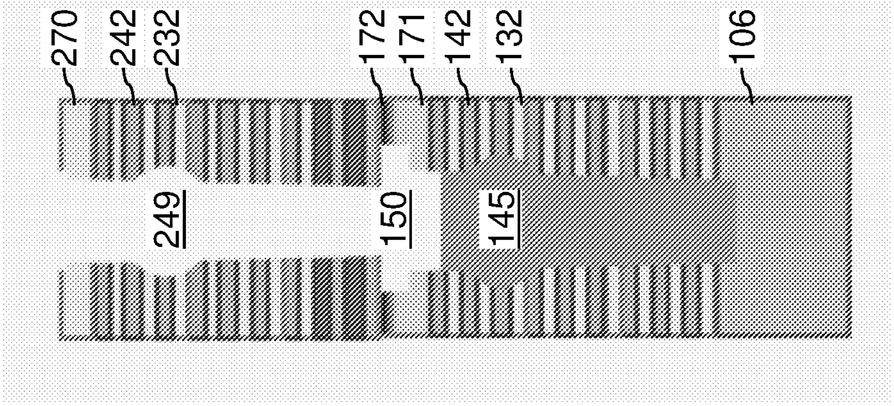
FIGS. 10A, 10B and 10C are schematic vertical cross-sectional views of the first exemplary structure after optional controlled ashing, regrowth and wet etching steps, according to an embodiment of the present disclosure.
Figure 10B:
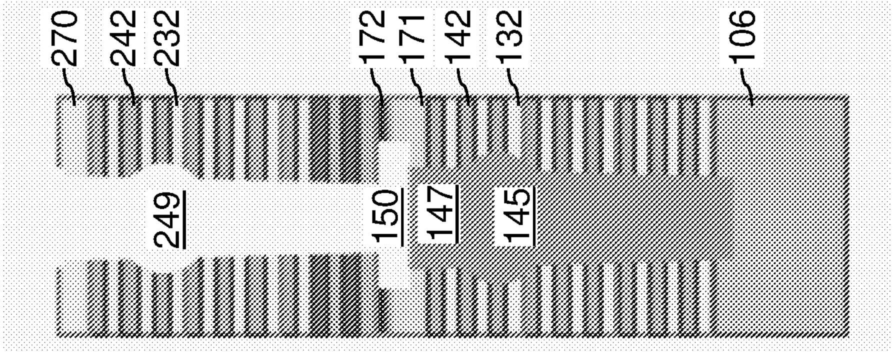
Figure 10C:
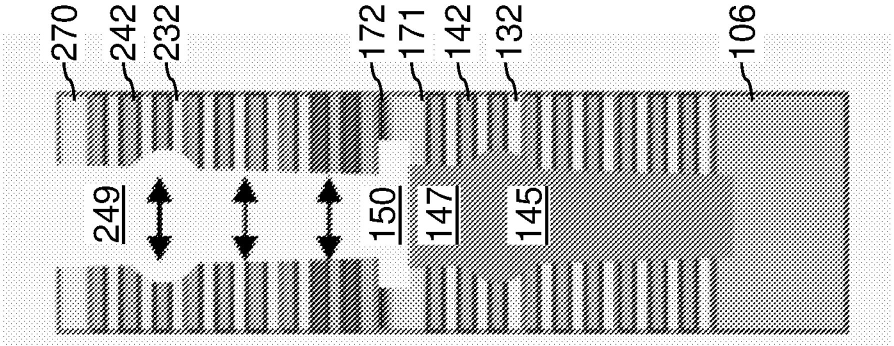

FIGS. 10A, 10B and 10C illustrate schematic vertical cross-sectional views of the first exemplary structure after optional controlled ashing, regrowth and wet etching steps, according to an embodiment of the present disclosure.

Referring to FIG. 10A, the first doped sacrificial opening capping portions (148, 128) may optionally be removed. For example, if the first doped sacrificial opening capping portions (148, 128) comprise a carbon material, then the first doped sacrificial opening capping portions (148, 128) may be removed by a controlled ashing processing. The controlled ashing process may comprise a timed ashing process which is conducted for a time sufficient to remove the first doped sacrificial opening capping portions (148, 128) without removing the entire first lower sacrificial opening fill material portions (145, 125).

Referring to FIG. 10B, the first upper sacrificial memory opening capping material portions 147 and the first upper sacrificial support opening capping material portions 127 are selectively regrown on the respective first lower sacrificial opening fill material portions (145, 125) in the second memory openings 249 and the second support openings 229, respectively. For example, the first upper sacrificial memory opening capping material portions 147 and the first upper sacrificial support opening capping material portions 127 may comprise undoped carbon portions which are grown by selective carbon deposition on the respective sacrificial opening fill material portions (145, 125). The top surface of the first upper sacrificial memory opening capping material portions 147 and the first upper sacrificial support opening capping material portions 127 may be located below the top surface of the first inter-tier dielectric layer stack (171, 172), such that the recess cavities 150 remain exposed.

Referring to FIG. 10C, the second memory openings 249 and the second support openings 229 are optionally wet etched to widen these openings at least at the levels of the second sacrificial material layers 242. For example, the second sacrificial material layers 242 and the second insulating material layers 232 may be recessed around the respective openings (249, 232) using an isotropic wet etch, such as dilute hydrofluoric acid etch. The first upper sacrificial memory opening capping material portions 147 and the first upper sacrificial support opening capping material portions 127 function as etch stop layers during the wet etching process.

Figure 11:
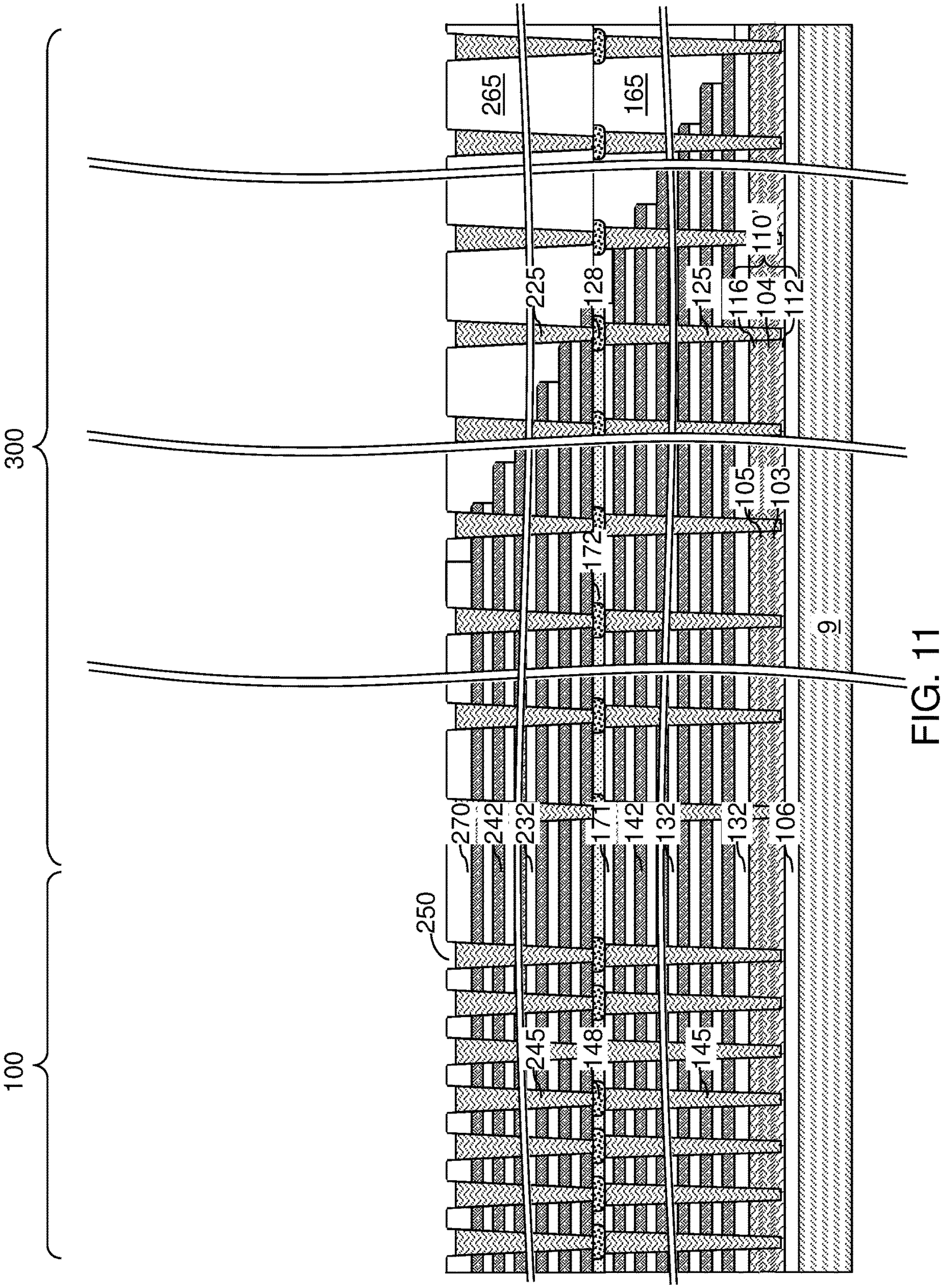
FIG. 11 is a schematic vertical cross-sectional view of the first exemplary structure after formation of second lower sacrificial opening fill material portions according to an embodiment of the present disclosure.

Referring to FIG. 11, an optional etch stop liner (not shown) and a second sacrificial fill material can be deposited in the second memory openings 249 and the second support openings 229. The optional etch stop liner (if present) comprises a thin silicon oxide layer having a thickness in a range from 2 nm to 6 nm. The second sacrificial fill material may comprise a carbon-based material such as amorphous carbon or diamond-like carbon.

A recess etch process can be performed to remove portions of the second sacrificial fill material from above the horizontal plane including the top surface of the second in-process inter-tier dielectric layer 270, as described above with respect to FIG. 4. Remaining portions of the second sacrificial fill material that fill the second memory openings

249 and the second support openings 229 constitute second lower sacrificial opening fill material portions (245, 225). The second lower sacrificial opening fill material portions (245, 225) comprise second lower sacrificial memory opening fill material portions 245 that are formed in the second memory openings 249, and second lower sacrificial support opening fill material portions 225 that are formed in the second support openings 229. A recess cavity 250 is formed above each second lower sacrificial opening fill material portions (245, 225).

Figure 12:
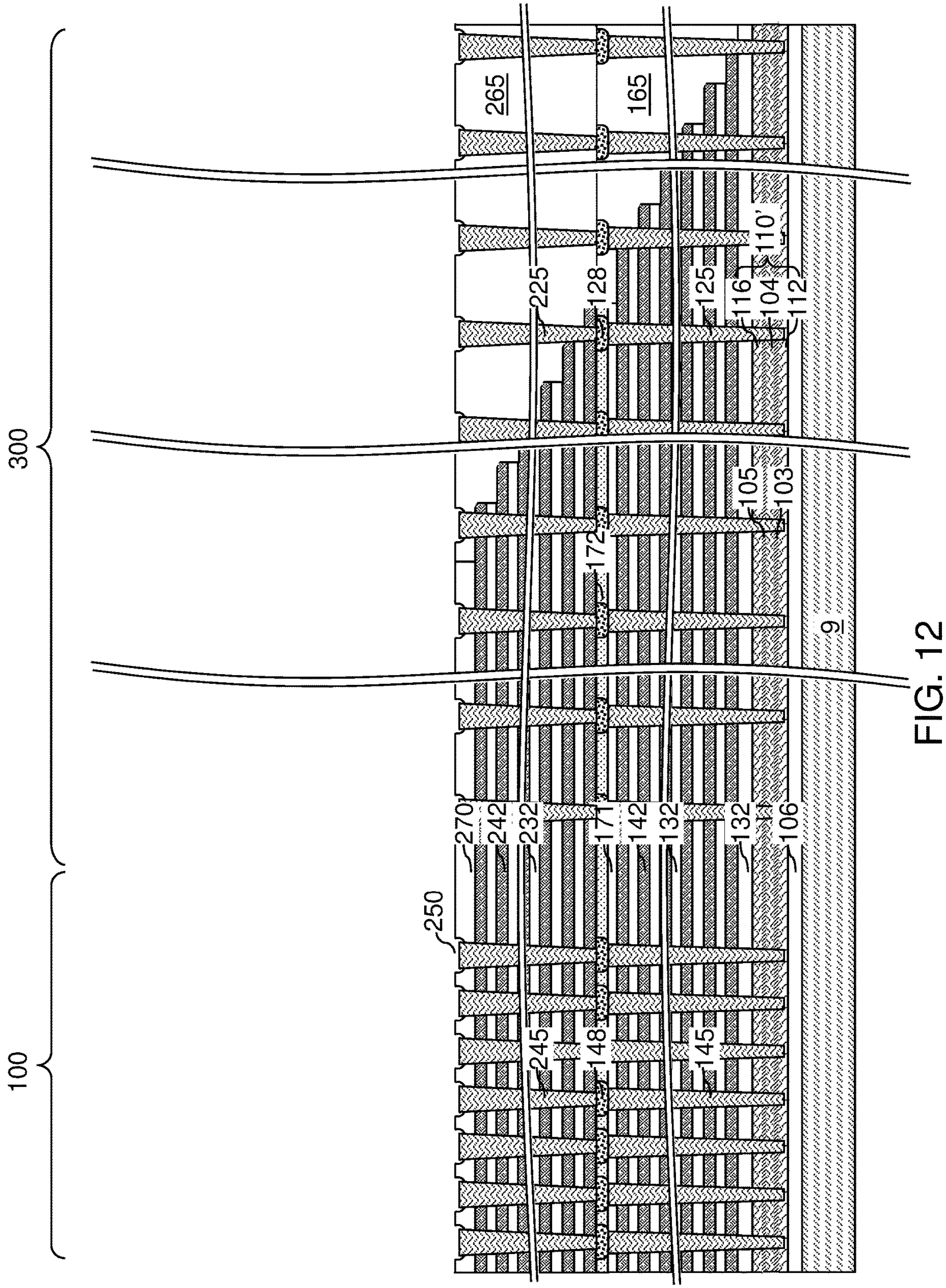
FIG. 12 is a schematic vertical cross-sectional view of the first exemplary structure after isotropically recessing the second first in-process inter-tier dielectric layer according to an embodiment of the present disclosure.

Referring to FIG. 12, an isotropic etch process can be performed to etch the material of the second in-process inter-tier dielectric layer 270 selective to the material of the second lower sacrificial opening fill material portions (245, 225), as described above with respect to FIG. 5. Each recessed surface around the recess cavity 250 in an upper portion of a respective one of the second memory openings 249 and the second support openings 229 may comprise a cylindrical surface segment and an annular tapered concave surface segment that is adjoined to a bottom periphery of the cylindrical surface segment. The annular tapered concave surface segment may have a radius of curvature that is the same as the etch distance of the isotropic etch process.

Figure 13:
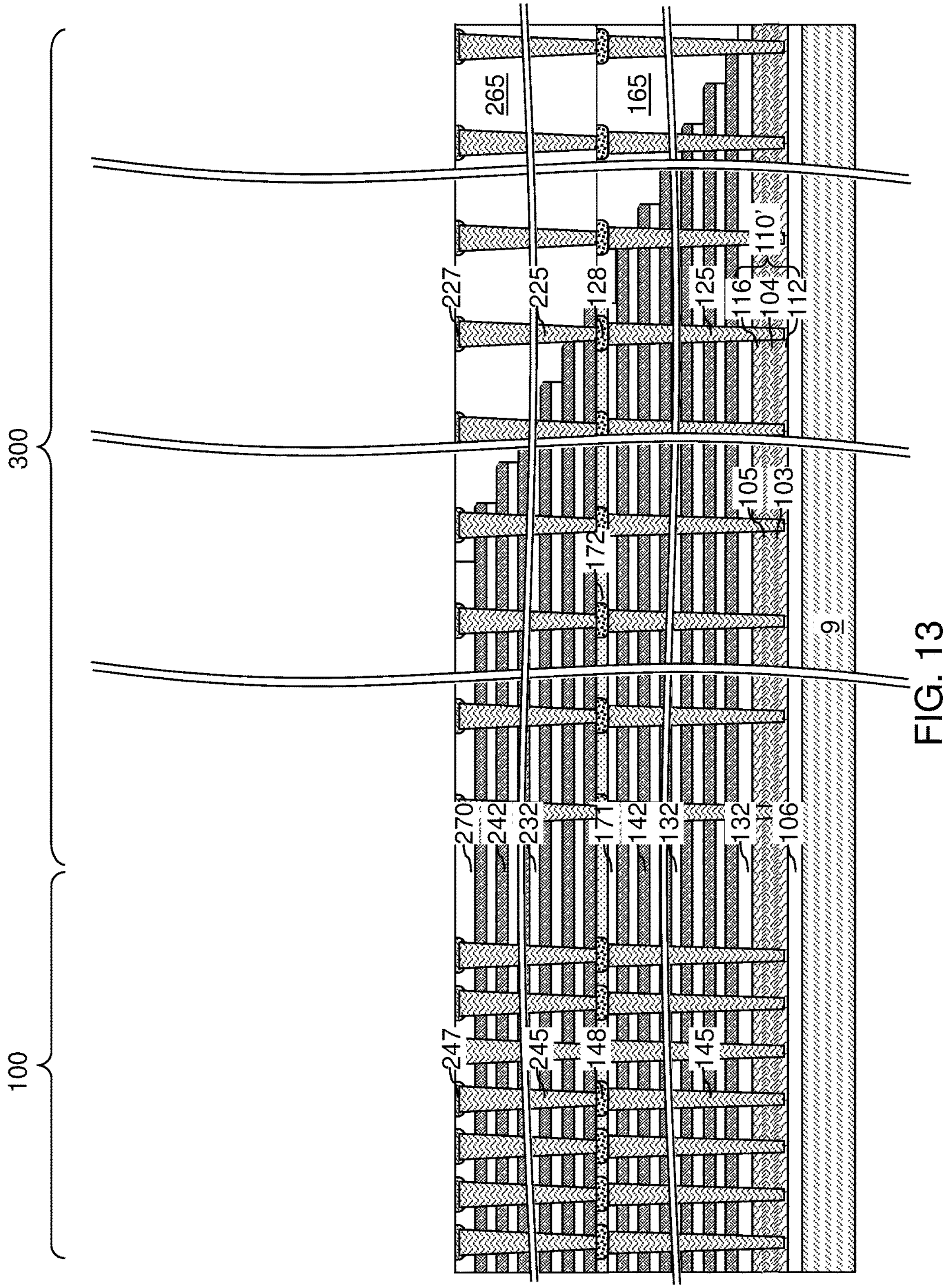
FIG. 13 is a schematic vertical cross-sectional view of the first exemplary structure after formation of second upper sacrificial opening fill material portions according to an embodiment of the present disclosure.

Referring to FIG. 13, a second sacrificial capping material can be deposited in the cavities in the upper portions of the second memory openings 249 and the second support openings 229. The second sacrificial capping material may comprise a carbon-based material such as amorphous carbon or diamond-like carbon. In one embodiment, the second sacrificial capping material may be the same as the second sacrificial fill material.

A planarization process can be performed to remove portions of the second sacrificial capping material from above the horizontal plane including the top surface of the second in-process inter-tier dielectric layer 270. Remaining portions of the second sacrificial capping material that fill the second memory openings 249 and the second support openings 229 constitute second upper sacrificial opening capping material portions (247, 227). The second upper sacrificial opening capping material portions (247, 227) comprise second upper sacrificial memory opening capping material portions 247 that are formed in the second memory openings 249, and second upper sacrificial support opening capping material portions 227 that are formed in the second support openings 229.

Each contiguous combination of second lower sacrificial opening capping material portions (245, 225) and second upper sacrificial opening capping material portions (247, 227) constitute second sacrificial opening fill structures {(245, 247), (225, 227)} which comprise second sacrificial memory opening fill structures (245, 247) and second sacrificial support opening fill structures (225, 227). Each second sacrificial memory opening fill structure (245, 247) comprises a second lower sacrificial memory opening fill material portion 245 and a second upper sacrificial memory opening capping material portion 247. Each second sacrificial support opening fill structure (225, 227) comprises a second lower sacrificial support opening fill material portion 225 and a second upper sacrificial support opening capping material portion 227.

Figure 14:
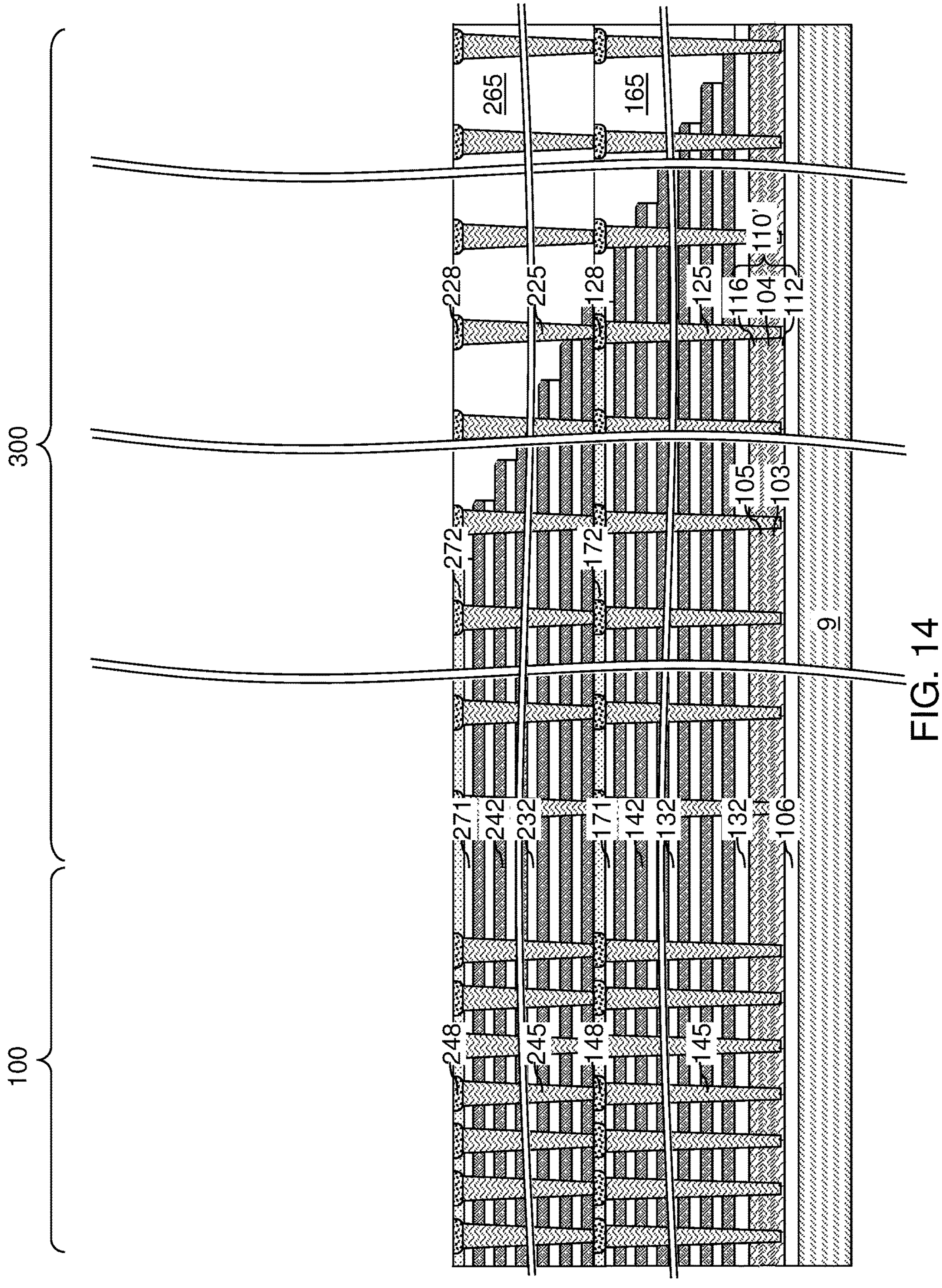
FIG. 14 is a schematic vertical cross-sectional view of the first exemplary structure after performing a second ion implantation process according to an embodiment of the present disclosure.

Referring to FIG. 14, a second ion implantation process can be performed to implant atoms of at least one dopant species into an upper portion of the second in-process inter-tier dielectric layer 270. According to an aspect of the present disclosure, the at least one dopant species comprises noble gas ions. The implanted upper portion of each second sacrificial opening fill structure {(245, 247), (225, 227)} is converted into a doped sacrificial material portion (248, 228), such as a noble gas doped carbon portion. The noble gas dopant concentration and implantation depth may be the same as those of the first doped sacrificial material portions (148, 128).

The doped sacrificial material portions (248, 228) comprise second doped sacrificial memory opening capping portions 248 that are formed in the second memory openings 249, and second doped sacrificial support opening capping portions 228 that are formed in the second support openings 229. Each second sacrificial memory opening fill structure (245, 248) can comprise a respective second lower sacrificial memory opening fill material portion 245 and a respective second doped sacrificial memory opening capping portion 248. Each second sacrificial support opening fill structure (225, 228) can comprise a respective second lower sacrificial support opening fill material portion 225 and a respective second doped sacrificial support opening capping portion 228.

According to an aspect of the present disclosure, the second in-process inter-tier dielectric layer 270 is converted into an optional lower second inter-tier dielectric layer 271 and an upper second inter-tier dielectric layer 272. The upper second inter-tier dielectric layer 272 comprises a portion of the second in-process inter-tier dielectric layer 270 that is doped with atoms of the at least one dopant species. The lower second inter-tier dielectric layer 271 comprises a portion of the second in-process inter-tier dielectric layer 270 that is not doped with the at least one dopant species, i.e., the unimplanted portion of the second in-process inter-tier dielectric layer 270. The layer stack is herein referred to as a second inter-tier dielectric layer stack (271, 272).

In one embodiment, the second alternating stack (232, 242) comprises second stepped surfaces. A second retro-stepped dielectric material portion 265 overlies and contacts the second stepped surfaces, and has a top surface that is coplanar with a top surface of the second inter-tier dielectric layer stack (271, 272). The upper surface portion of the second retro-stepped dielectric material portion 265 is doped with additional atoms of at least one dopant species.

Figure 15:
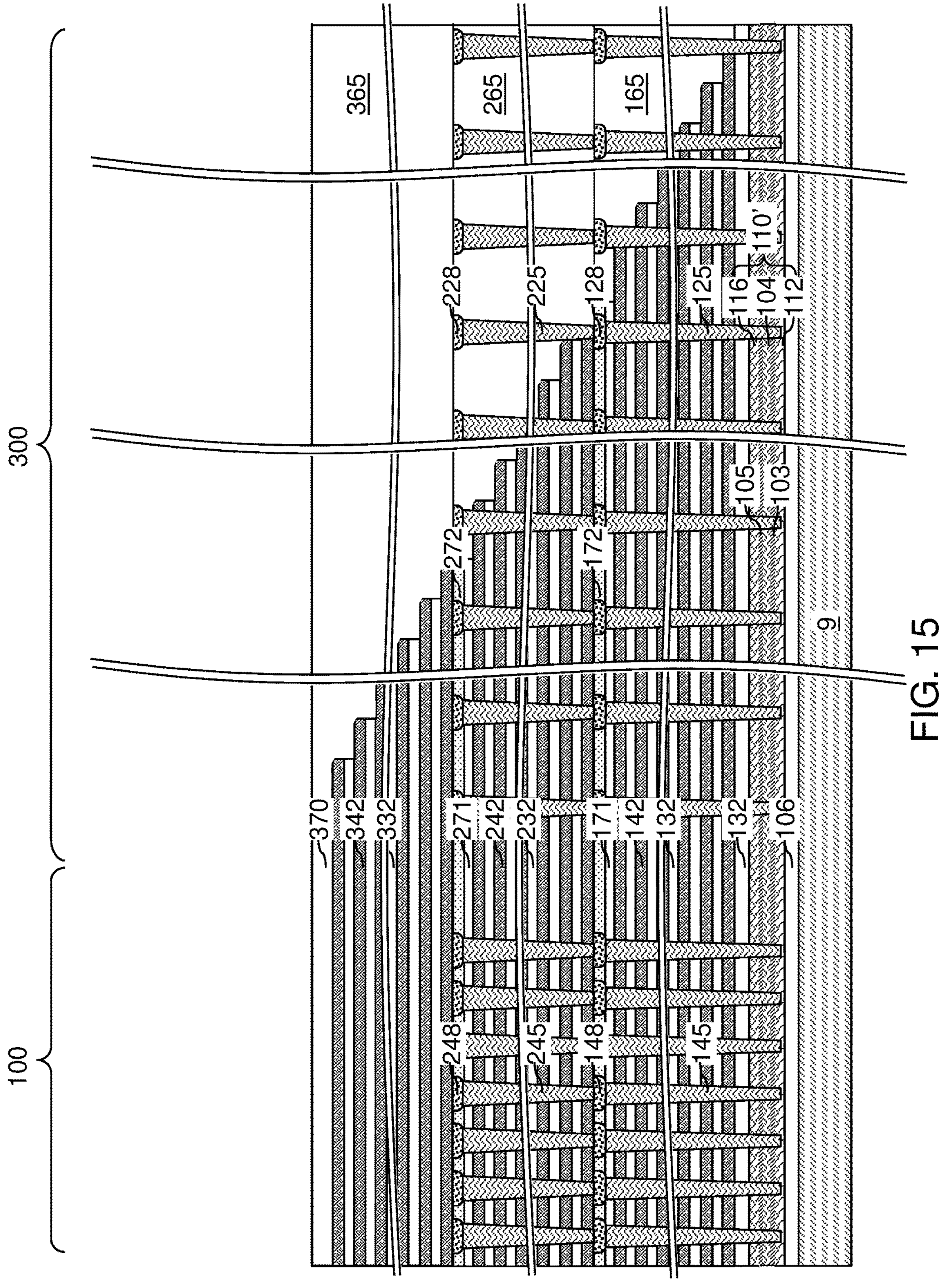
FIG. 15 is a schematic vertical cross-sectional view of the first exemplary structure after formation of a third alternating stack of third insulating layers and third sacrificial material layers, an insulating cap layer, third stepped surfaces, and a third retro-stepped dielectric material portion according to an embodiment of the present disclosure.

Referring to FIG. 15, a third alternating stack of third insulating layers 332 and third spacer material layers can be formed over the second inter-tier dielectric layer stack (271, 272). In one embodiment, the third spacer material layers may comprise third sacrificial material layers 342. In this case, a third alternating stack (332, 342) of third insulating layers 332 and third sacrificial material layers 342 can be formed over the second inter-tier dielectric layer stack (271, 272). In one embodiment, the third insulating layers 332 may comprise silicon oxide layers, and the third sacrificial material layers 342 may comprise silicon nitride layers. The third alternating stack (332, 342) may comprise multiple repetitions of a unit layer stack including a third insulating layer 332 and a third sacrificial material layer 342. The total number of repetitions of the unit layer stack within the third alternating stack (332, 342) may be, for example, in a range from 8 to 2,024, such as from 32 to 256, although lesser and greater number of repetitions may also be employed. An insulating cap layer 370, such as a silicon oxide layer, can be formed over the third alternating stack (332, 342). While an embodiment is described in which the third spacer material layers are formed as third sacrificial material layers 342, the third spacer material layers may be formed as third electrically conductive layers in an alternative embodiment.

Third stepped surfaces are formed in the contact region 300. A third stepped cavity is formed within the volume from which portions of the third alternating stack (332, 342)

and the insulating cap layer 370 are removed through formation of the third stepped surfaces. A third retro-stepped dielectric material portion 365 (i.e., an insulating fill material portion) can be formed in the third stepped cavity by deposition of a dielectric material therein followed by planarization. The remaining portion of the deposited dielectric material filling the third stepped cavity constitutes the third retro-stepped dielectric material portion 365.

Figure 16A:
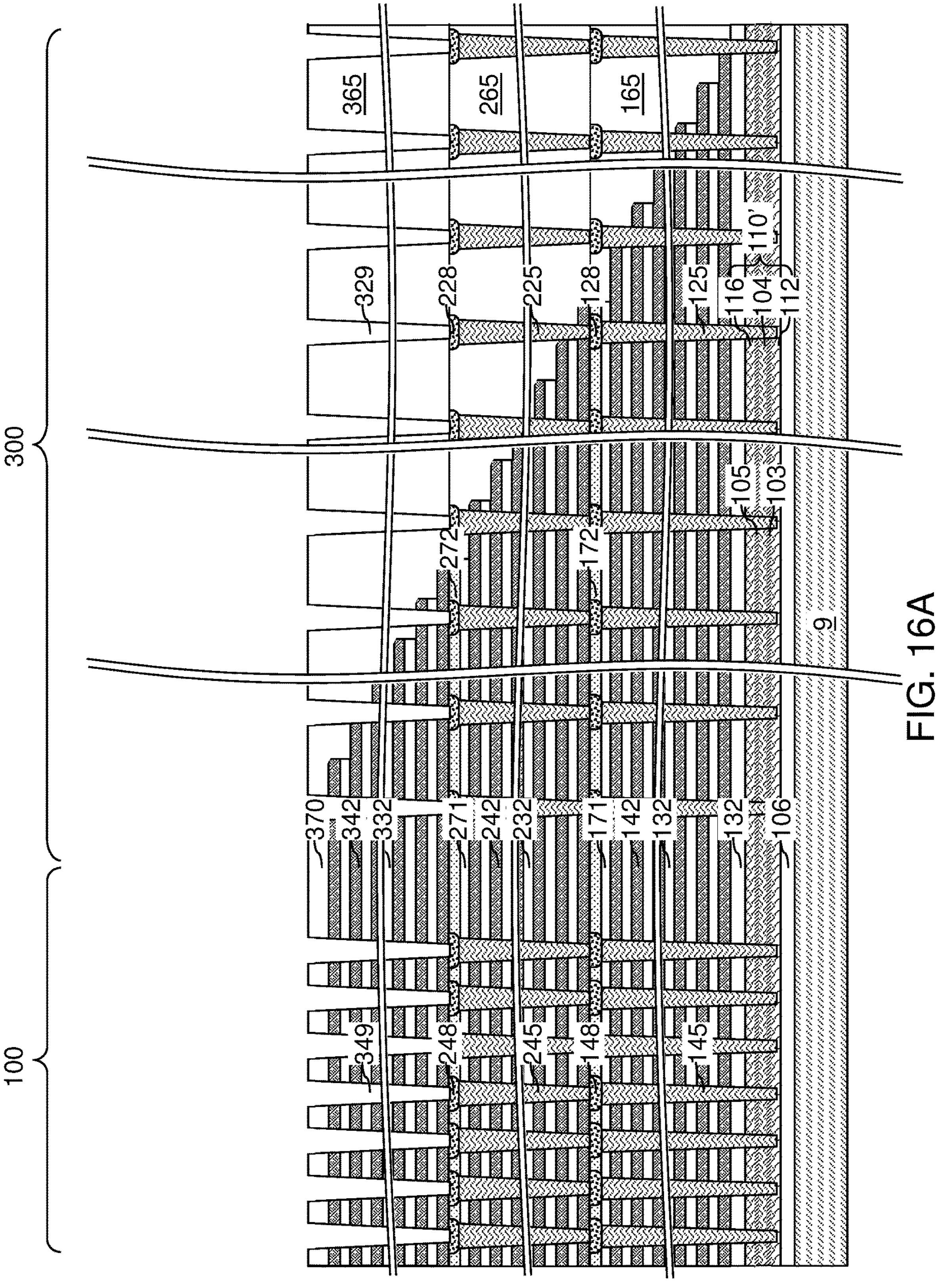
FIG. 16A is a schematic vertical cross-sectional view of the first exemplary structure after forming third memory openings and third support openings according to an embodiment of the present disclosure.
Figure 16B:
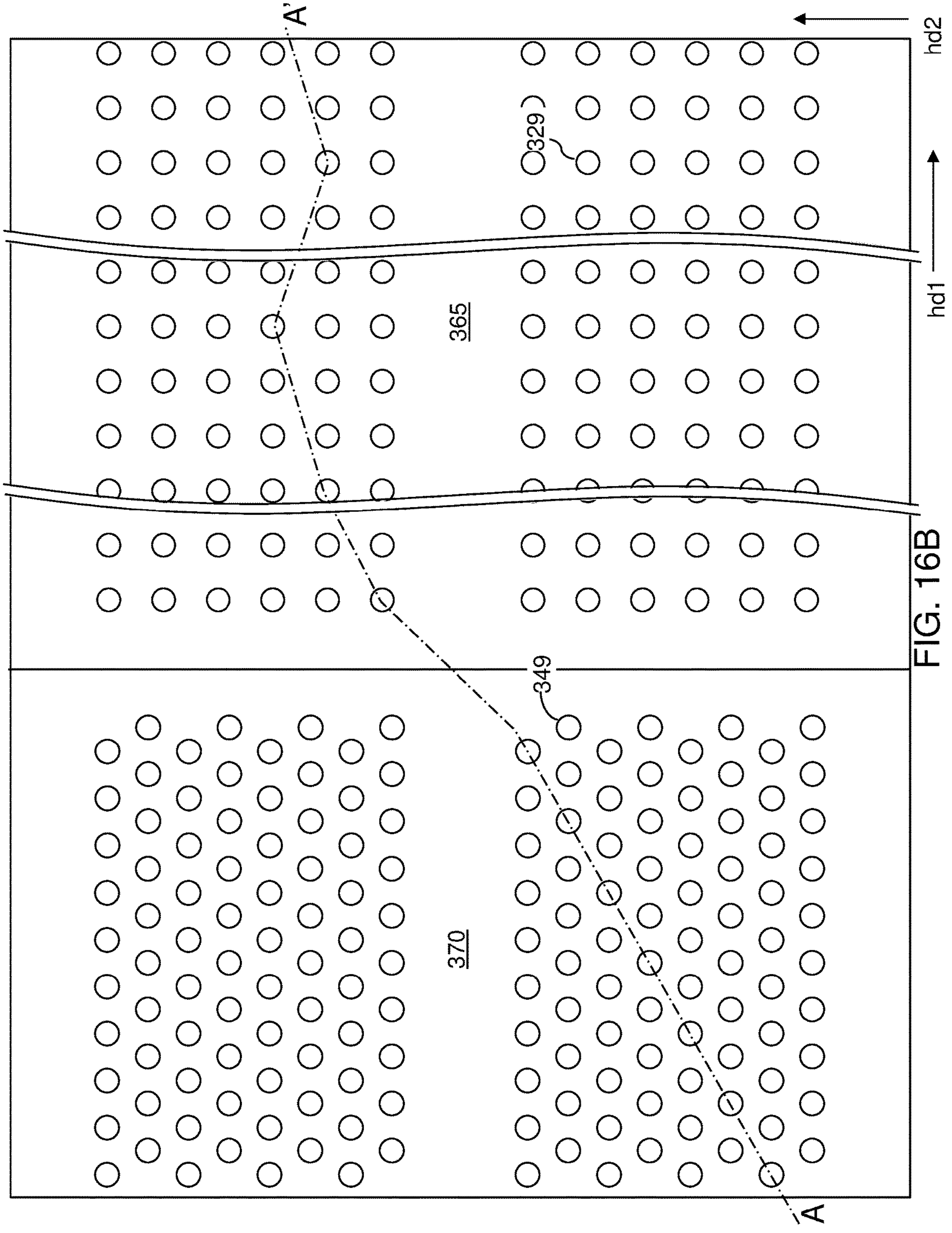
FIG. 16B is a top-down view of the first exemplary structure of FIG. 16A. The vertical plane A-A' is the cut plane of the vertical cross-sectional view of FIG. 16A.

Referring to FIGS. 16A and 16B, a third etch mask layer (not shown) can be formed over the insulating cap layer 370, and can be lithographically patterned to form various openings therein. A third anisotropic etch process can be performed to transfer the pattern of the openings in the third etch mask layer through the third alternating stack (332, 342) and the third retro-stepped dielectric material portion 365. Various openings can be formed through the third alternating stack (332, 342) and the third retro-stepped dielectric material portion 365. The various openings may comprise third memory openings 349 that are formed in the memory array region 100 and third support openings 329 that are formed in the contact region 300. Each of the third memory openings 349 and the third support openings 329 can vertically extend through the third alternating stack (332, 342) and on a top surface of a respective one of the second sacrificial opening fill structures {(245, 248), (225, 228)}. Specifically, a top surface of a second doped sacrificial memory opening capping portion 248 can be physically exposed underneath each third memory opening 349, and a top surface of a second doped sacrificial support opening capping portion 228 can be physically exposed underneath each third support opening 329.

According to an aspect of the present disclosure, the etch chemistry of the third anisotropic etch process and the species of the at least one dopant in the second doped sacrificial opening capping portions (248, 228) can be selected such that the second doped sacrificial fill material of the second doped sacrificial opening capping portions (248, 228) provides a higher etch resistance than the second sacrificial fill material of the second lower sacrificial opening fill material portions (245, 225) which is not doped with the at least one dopant. In an illustrative example, the third insulating layers 332 may comprise silicon oxide and the third sacrificial material layers 342 may comprise silicon nitride, and the third anisotropic etch process may employ $CF_4$, $CHF_3$, $C_4F_8$, $SF_6$, and/or $NF_3$ as an etchant gas. Examples of etch chemistries that can etch silicon oxide and silicon nitride include a combination of $CF_4$ and $CHF_3$, a combination of $C_4F_8$ and Ar, a combination of $SF_6$ and $O_2$, and a combination of $NF_3$ and Ar.

According to an aspect of the present disclosure, the increase in the etch resistivity of the second doped sacrificial fill material of the second doped sacrificial opening capping portions (248, 228) relative to the second sacrificial fill material of the second lower sacrificial opening fill material portions (245, 225) reduces the depth of the overetch into the second doped sacrificial fill material of the second doped sacrificial opening capping portions (248, 228).

Optionally, the steps described above with respect to FIGS. 10A, 10B and/or 10C may be repeated at this point in the process.

Figure 17:
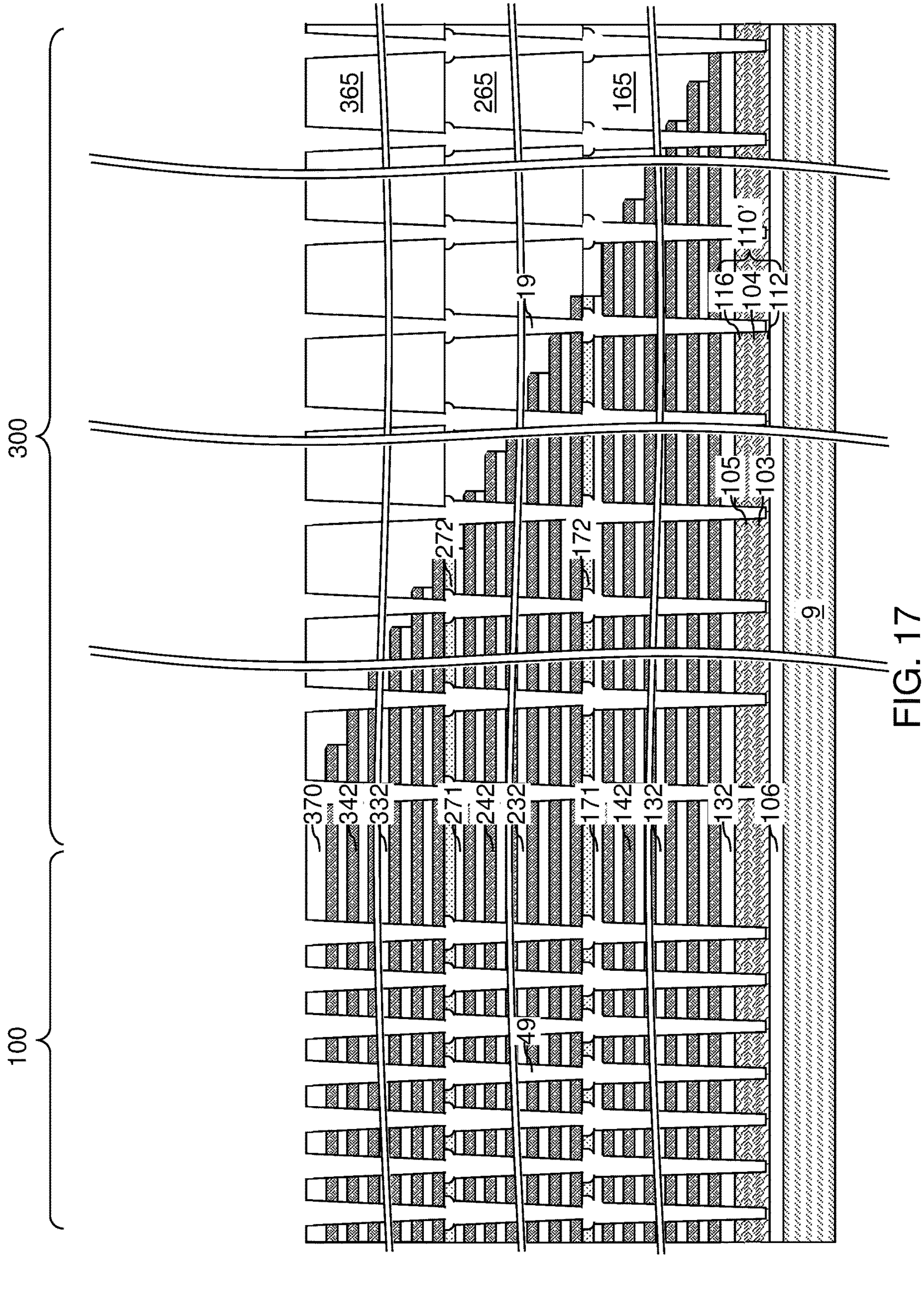
FIG. 17 is a schematic vertical cross-sectional view of the first exemplary structure after formation of multi-tier memory openings and multi-tier support openings according to an embodiment of the present disclosure.

Referring to FIG. 17, the sacrificial fill materials of the second sacrificial opening fill structures {(245, 248), (125, 128)} and the first sacrificial opening fill structure {(145, 148), (125, 128)} can be removed without significant removal of the materials of the alternating stacks {(132, 142), (232, 242), (332, 342)}, the inter-tier dielectric layer stacks {(171, 172), (271, 272)}, the insulating cap layer 370, or the retro-stepped dielectric material portions (165, 265, 365). In case etch stop liners are present around the sacrificial fill materials of the second sacrificial opening fill structures {(245, 248), (125, 128)} and the first sacrificial opening fill structure {(145, 148), (125, 128)}, the sacrificial fill materials of the second sacrificial opening fill structures {(245, 248), (125, 128)} and the first sacrificial opening fill structure {(145, 148), (125, 128)} can be removed selective to the materials of the etch stop liners, and the etch stop liners can be subsequently removed, for example, by performing an isotropic etch process. In case etch stop liners are not present, the sacrificial fill materials of the second sacrificial opening fill structures {(245, 248), (125, 128)} and the first sacrificial opening fill structure {(145, 148), (125, 128)} can be removed selective to the materials of the alternating stacks {(132, 142), (232. 242), (332, 342)}, the inter-tier dielectric layer stacks {(171, 172), (271, 272)}, the insulating cap layer 370, or the retro-stepped dielectric material portions (165, 265, 365).

The carbon sacrificial fill materials of the second sacrificial opening fill structures {(245, 248), (125, 128)} and the first sacrificial opening fill structure {(145, 148 or 147), (125, 128 or 147)} may be removed by ashing. Multi-tier memory openings 49 are formed in the volumes of the third memory openings 349 and the volumes from which the second sacrificial memory opening fill structures {(245, 248), (125, 128)} are removed. The multi-tier memory openings 49 may also be referred to as memory openings. Multi-tier support openings 19 can be formed in the volumes of the third support openings 329 and the volumes from which the first sacrificial support opening fill structures {(145, 148), (125, 128)} are removed.

Figure 18:
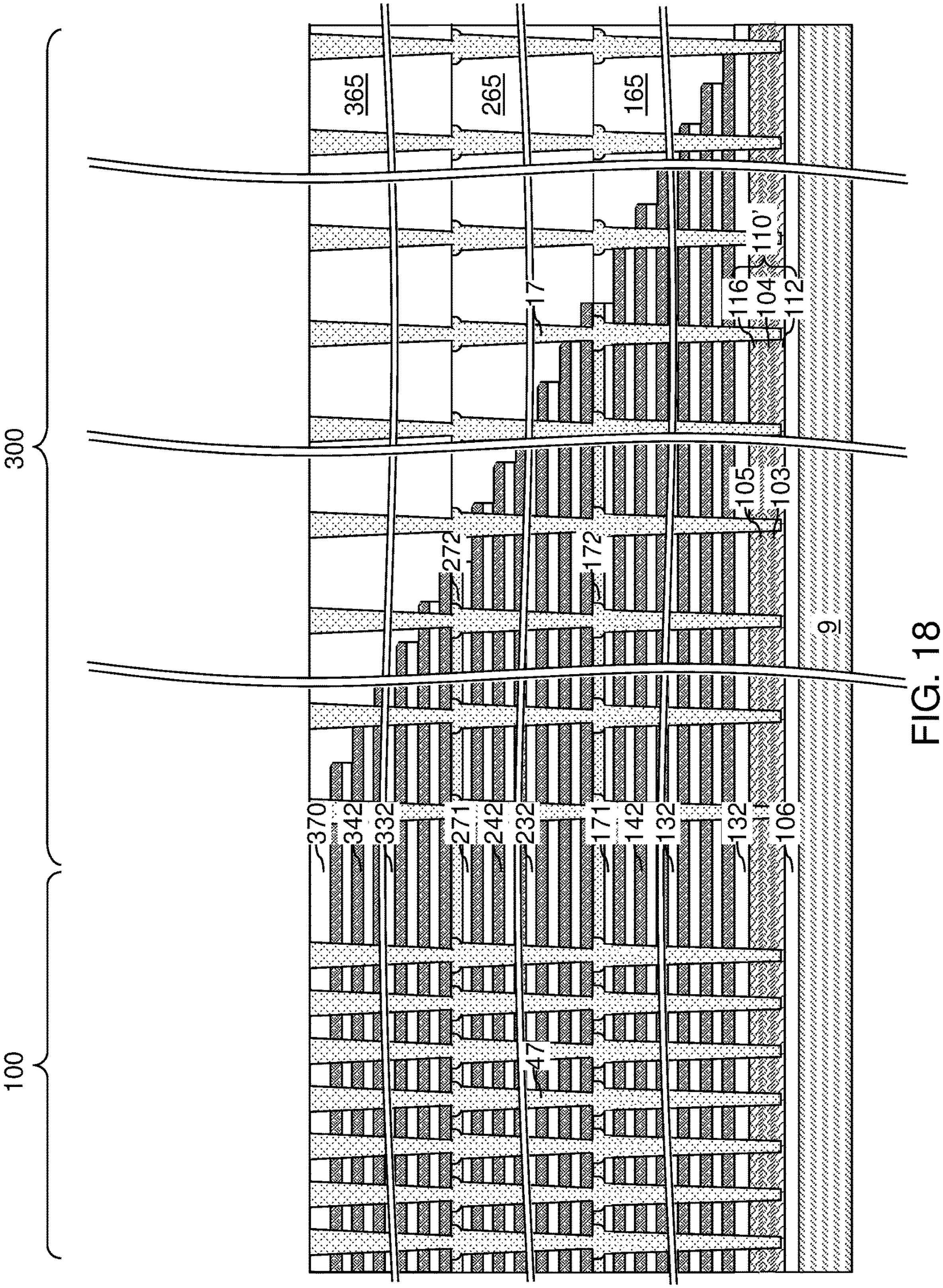
FIG. 18 is a schematic vertical cross-sectional view of the first exemplary structure after formation of sacrificial multi-tier memory opening fill structures and sacrificial multi-tier support opening fill structures according to an embodiment of the present disclosure.

Referring to FIG. 18, in an optional embodiment where memory opening fill structures and the support pillar structures comprise materials different from each other, an optional sacrificial fill material can be deposited in the memory openings 49 and the support openings 19. The sacrificial fill material may be formed by a non-conformal deposition or a conformal deposition method. The sacrificial fill material may comprise a carbon-based material (such as amorphous carbon or diamond-like carbon), a semiconductor material (such as amorphous silicon or polysilicon), a dielectric fill material (such as borosilicate glass or organosilicate glass), or a polymer material. Excess portions of the sacrificial fill material may be removed from above the horizontal plane including the top surfaces of the insulating cap layer 370 and the third retro-stepped dielectric material portion 365 by a planarization process such as a recess etch process. Sacrificial multi-tier memory opening fill structures 47 can be formed in the multi-tier memory openings 49, and sacrificial multi-tier support opening fill structures 17 can be formed in the multi-tier support openings 19.

Figure 19:
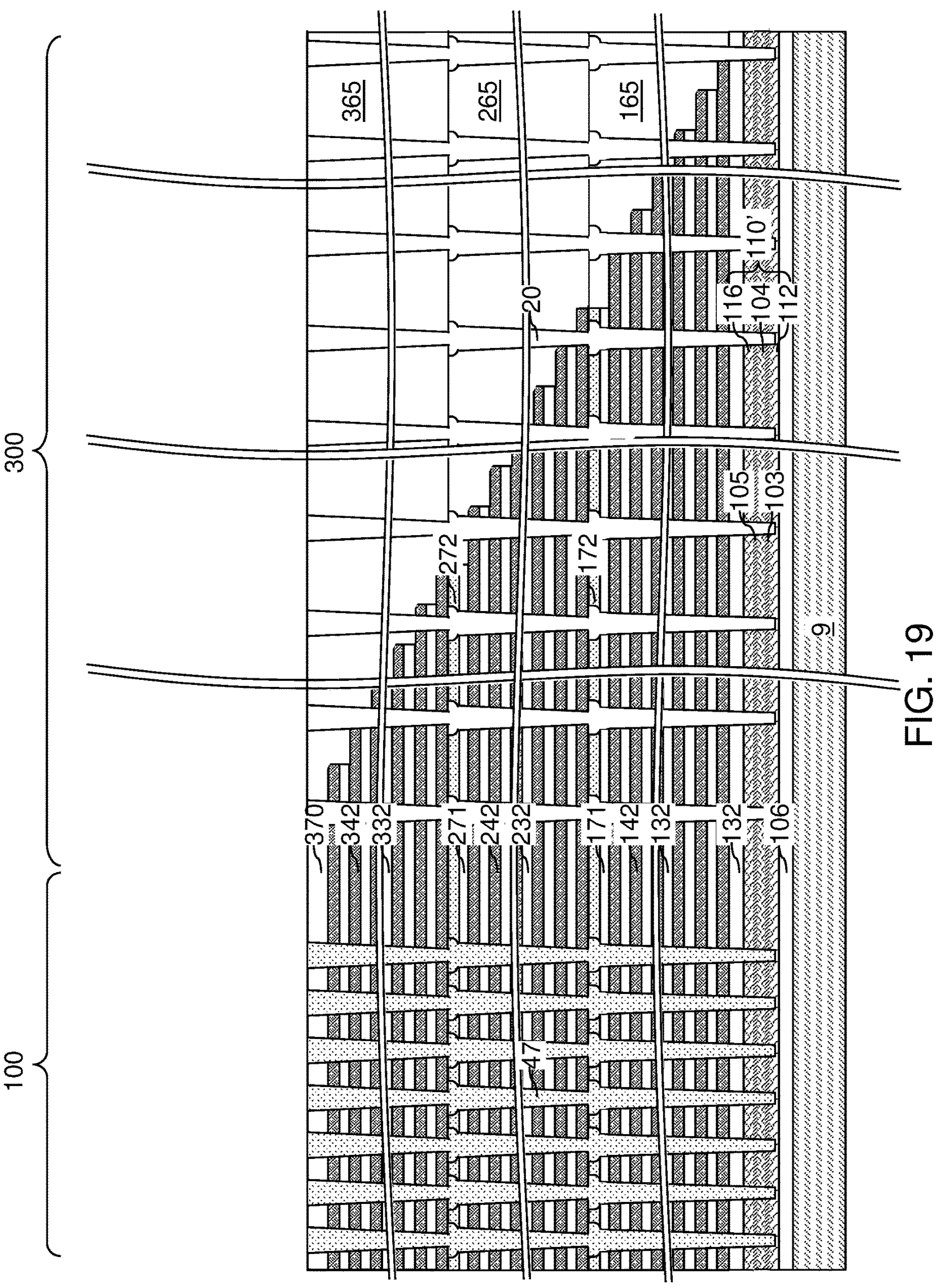
FIG. 19 is a schematic vertical cross-sectional view of the first exemplary structure after replacement of the sacrificial multi-tier support opening fill structures with support pillar structures according to an embodiment of the present disclosure.

Referring to FIG. 19, a photoresist layer (not shown) can be applied over the insulating cap layer 370 and the third retro-stepped dielectric material portion 365, and can be lithographically patterned to cover the memory array region 100 without covering the contact region 300. The sacrificial multi-tier support opening fill structures 17 in the contact region 300 can be removed selective to the materials of the alternating stacks {(132, 142), (232, 242), (332, 342)}, the inter-tier dielectric layer stacks {(171, 172), (271, 272)}, the insulating cap layer 370, and the retro-stepped dielectric material portions (165, 265, 365). For example, an etch process or an ashing process may be employed to remove the sacrificial multi-tier support opening fill structures 17 in the contact region 300. The photoresist layer can be subsequently removed.

A dielectric fill material, such as silicon oxide, can be deposited in the cavities in the multi-tier support openings 19 by a conformal deposition process. Excess portions of the dielectric fill material can be removed from above the top surface of the insulating cap layer 370, for example, by a recess etch process. Each portion of the dielectric fill material that fills a respective multi-tier support opening 19 constitutes a support pillar structure 20, which can be employed to provide structural support to the insulating layers (132, 232, 332) and the retro-stepped dielectric material portions (165, 265, 365) during replacement of the sacrificial material layers (142, 242, 343) with electrically conductive layers.

Each support pillar structure 20 vertically extends at least from a horizontal plane including the bottom surface of the first alternating stack (132, 142), and at least to a horizontal plane including the top surface of the third alternating stack (332, 342). In one embodiment, each support pillar structure 20 consists essentially of at least one dielectric fill material. In one embodiment, each support pillar structure 20 comprises a first dielectric sidewall that vertically extends through the first alternating stack (132, 142) and the lower first inter-tier dielectric layer 171; a second dielectric sidewall that vertically extends through the second alternating stack (232, 242); and a third dielectric sidewall that vertically extends through the third alternating stack (332, 342). In one embodiment, each support pillar structure 20 further comprises a first contoured dielectric surface that connects the first dielectric sidewall and the second dielectric sidewall. The first contoured dielectric surface comprises a first planar annular top dielectric surface segment located within a horizontal plane including a top surface of the first inter-tier dielectric layer stack (171, 172) and further comprises a first convex annular dielectric sidewall segment that contacts a concave surface segment of the first inter-tier dielectric layer stack (171, 172). Further, each support pillar structure 20 further comprises a second contoured dielectric surface that connects the second dielectric sidewall and the third dielectric sidewall. The second contoured dielectric surface comprises a second planar annular top dielectric surface segment located within a horizontal plane including a top surface of the second inter-tier dielectric layer stack (271, 272) and further comprises a second convex annular dielectric sidewall segment that contacts a concave surface segment of the second inter-tier dielectric layer stack (271, 272).

Figure 20A:
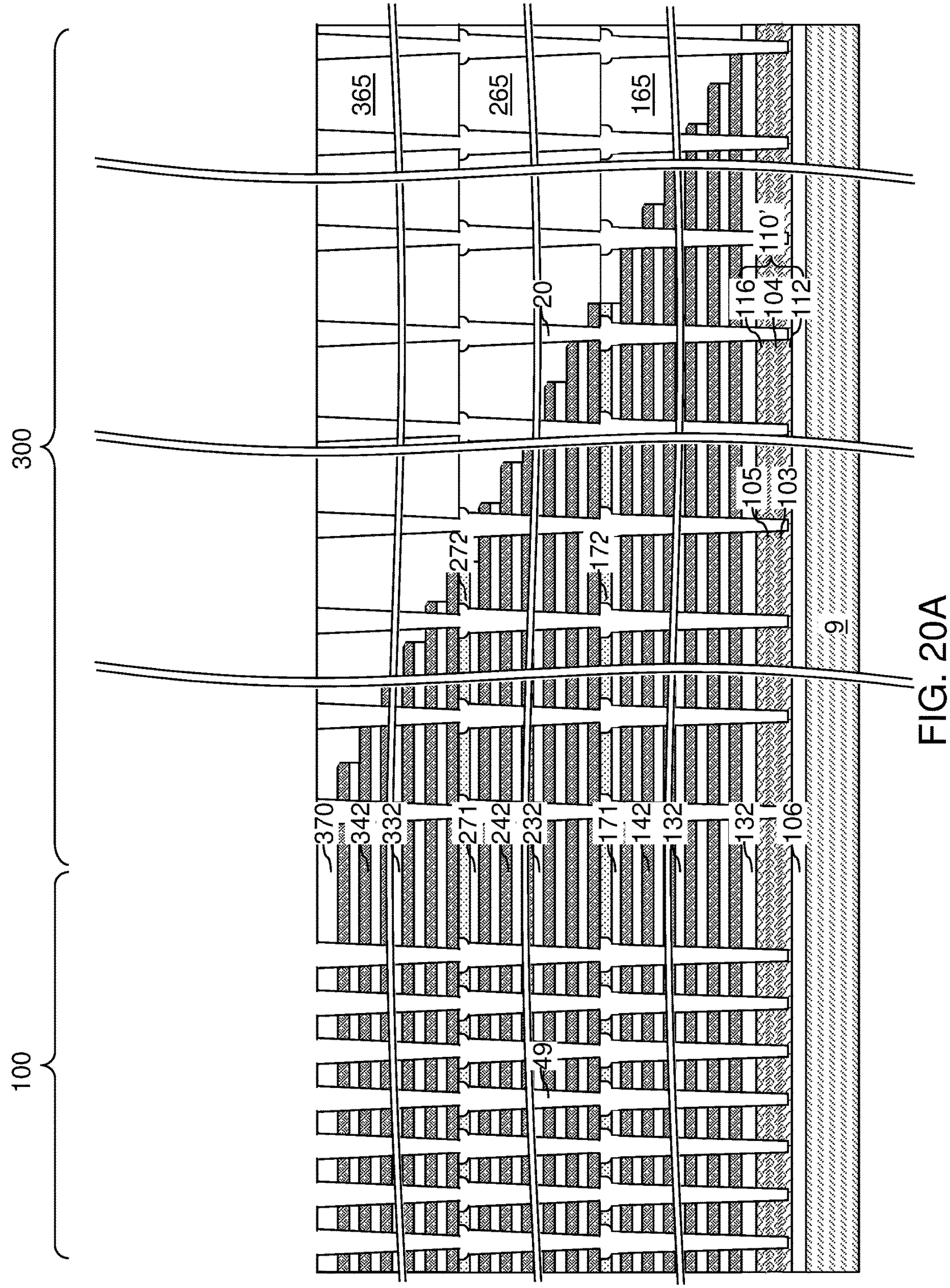
FIG. 20A is a schematic vertical cross-sectional view of the first exemplary structure after removal of the sacrificial multi-tier memory opening fill structures according to an embodiment of the present disclosure.
Figure 20B:
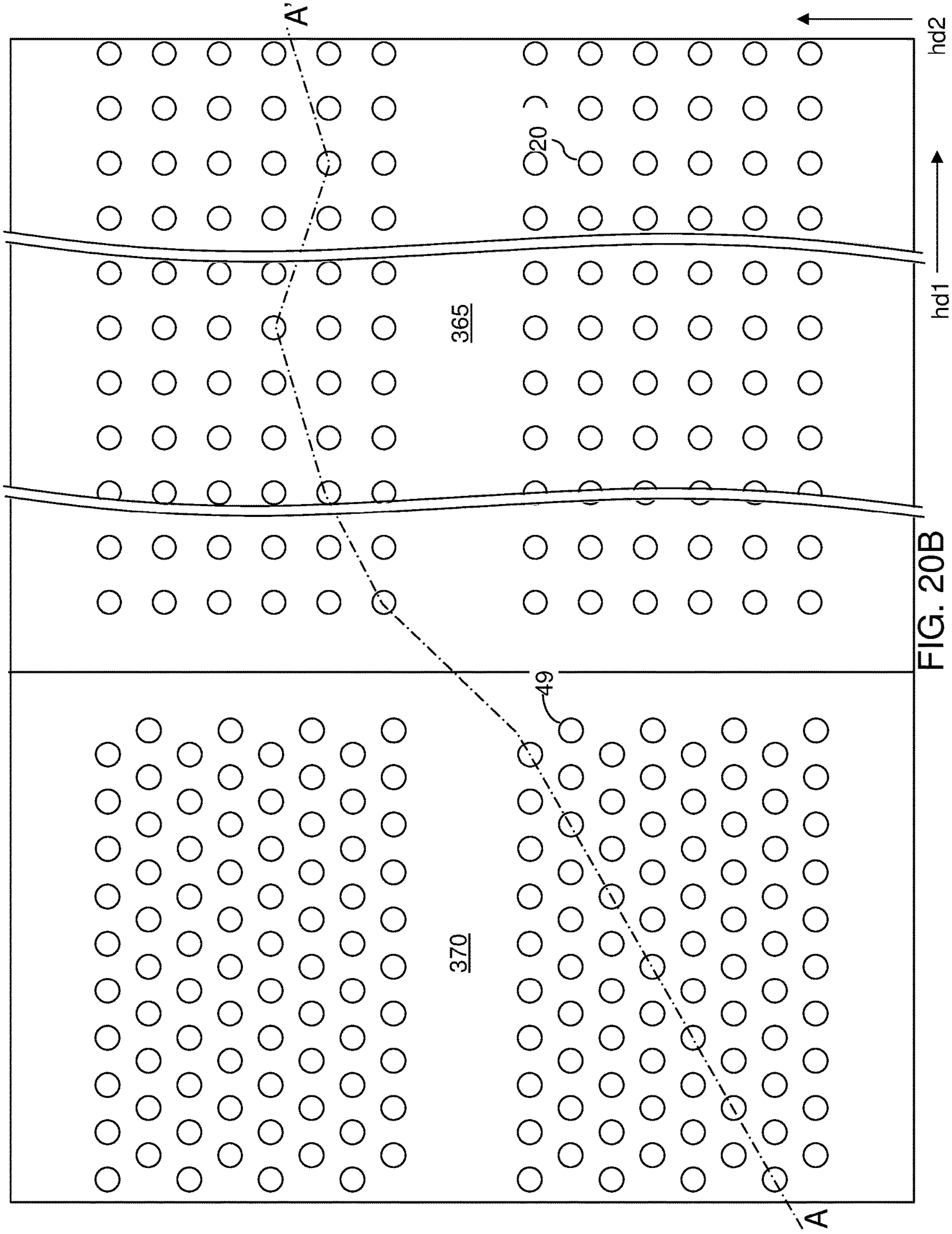
FIG. 20B is a top-down view of the first exemplary structure of FIG. 20A. The vertical plane A-A' is the cut plane of the vertical cross-sectional view of FIG. 20A.

Referring to FIGS. 20A and 20B, the sacrificial multi-tier memory opening fill structures 47 in the memory array region 100 can be removed selective to the materials of the alternating stacks {(132, 142), (232, 242), (332, 342)}, the inter-tier dielectric layer stacks {(171, 172), (271, 272)}, the insulating cap layer 370, and the retro-stepped dielectric material portions (165, 265, 365). For example, a selective etch process or an ashing process may be employed to remove the sacrificial multi-tier memory opening fill structures 47 in the memory array region 100. Cavities are formed in the volumes of the multi-tier memory openings 49.

FIGS. 21A-21D are sequential vertical cross-sectional views of a multi-tier memory opening 49 (i.e., a memory opening 49) during formation of a memory opening fill structure 58 according to an embodiments of the present disclosure.

Figure 21B:
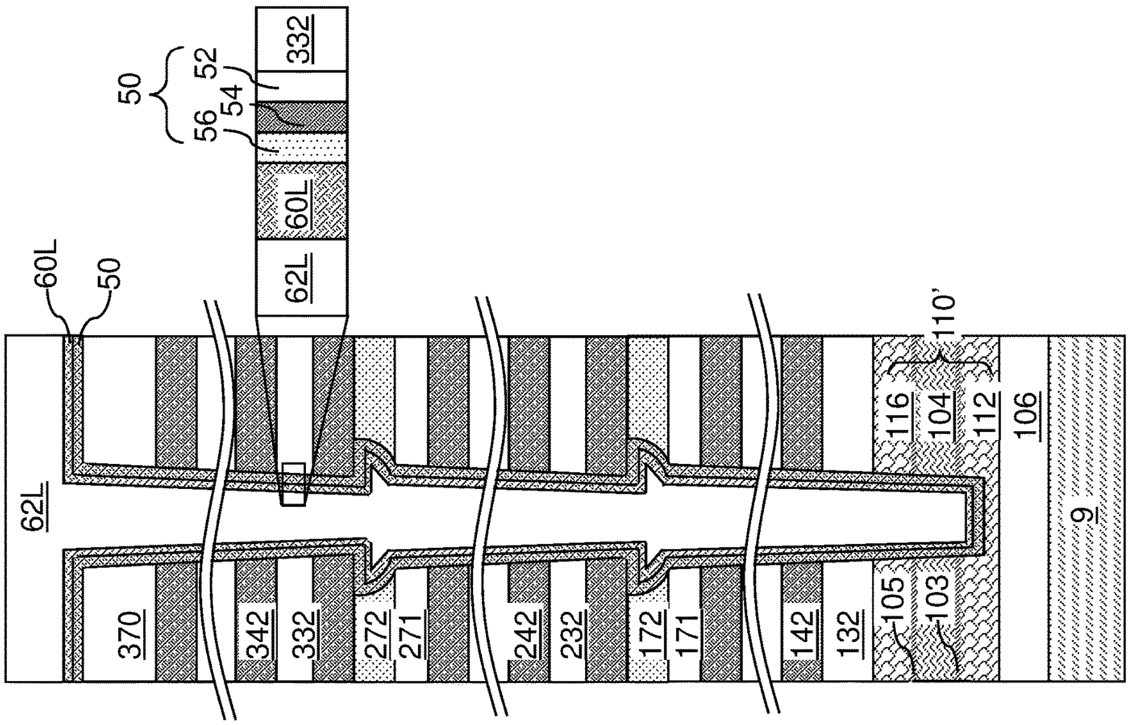
FIGS. 21A-21D are sequential vertical cross-sectional views of a region around an multi-tier memory opening during formation of a memory opening fill structure according to an embodiment of the present disclosure.
Figure 21A:
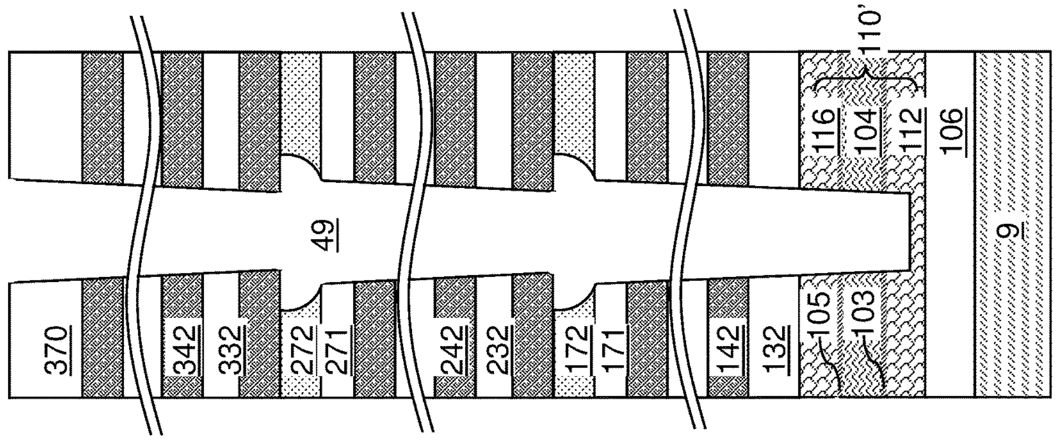

Referring to FIG. 21A, a memory opening 49 is illustrated after the processing steps of FIGS. 20A and 20B.

Referring to FIG. 21B, a layer stack including a memory material layer 54 can be conformally deposited. In an illustrative example, the layer stack may comprise an optional blocking dielectric layer 52, the memory material layer 54, and an optional dielectric liner 56. The memory material layer 54 includes a memory material, i.e., a material that can store data bits therein. The memory material layer 54 may comprise a charge storage material (such as silicon nitride), a ferroelectric material, a phase change memory material, or any other memory material that can store data bits by inducing a change in the electrical resistivity, ferroelectric polarization, or any other measurable physical property. In case the memory material layer 54 comprise a charge storage material, the optional dielectric liner 56 may comprise a tunneling dielectric layer.

A semiconductor channel material layer 60L can be deposited over the layer stack (52, 54, 56) by performing a conformal deposition process. If the semiconductor channel material layer 60L is doped, the semiconductor channel material layer 60L may have a doping of a first conductivity type, which may be p-type or n-type. In one embodiment, the first semiconductor material comprises a first doped silicon material having a doping of the first conductivity type. In an illustrative example, the atomic concentration of dopants of the first conductivity type in the semiconductor channel material layer 60L may be in a range from $1.0\times10^{13}/cm^3$ to $3.0\times10^{17}/cm^3$, such as $1.0\times10^{14}/cm^3$ to $3.0\times10^{16}/cm^3$, although lesser and greater atomic concentrations may also be employed. A dielectric core layer 62L comprising a dielectric fill material (e.g., silicon oxide) can be deposited in remaining volumes of the memory openings 49 and over the alternating stack (32, 42).

Figure 21D:
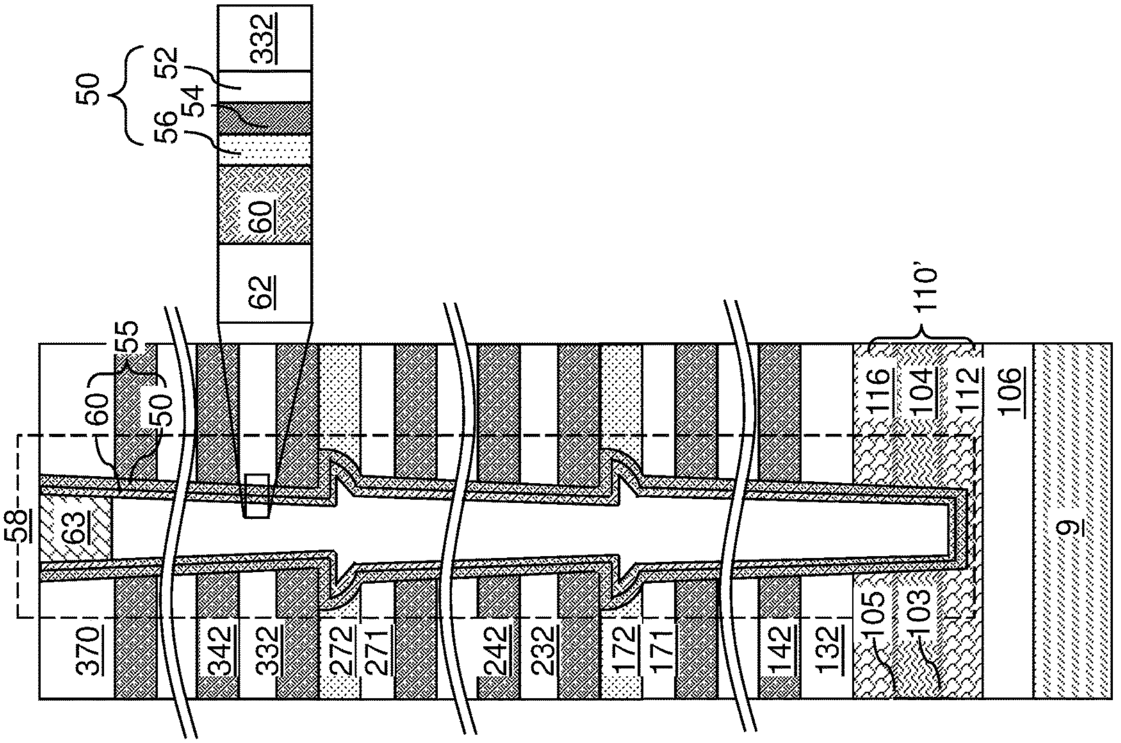
Figure 21C:
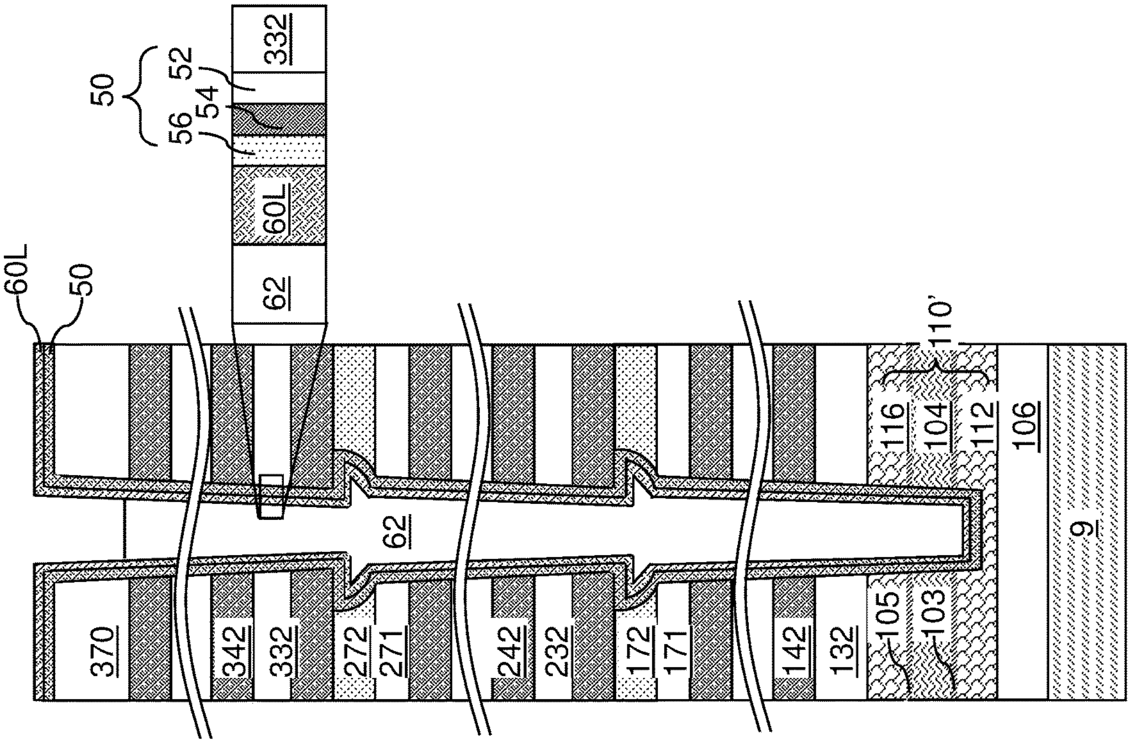

Referring to FIG. 21C, the dielectric core layer 62L can be vertically recessed such that each remaining portion of the dielectric core layer 62L has a top surface at, or about, the horizontal plane including the bottom surface of the insulating cap layer 370. Each remaining portion of the dielectric core layer 62L constitutes a dielectric core 62.

Figure 22:
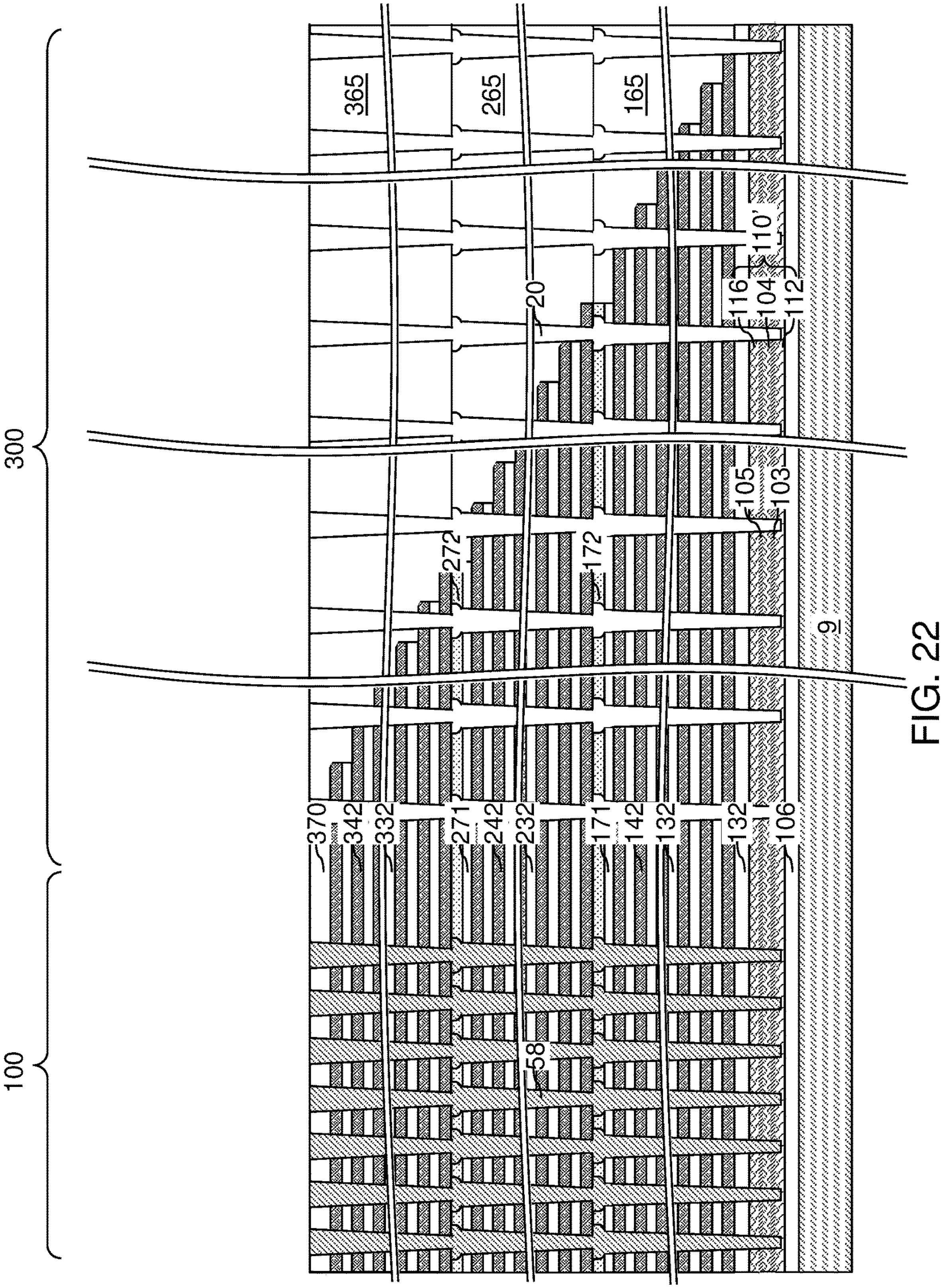
FIG. 22 is a vertical cross-sectional view of the first exemplary structure after formation of memory opening fill structures according to an embodiment of the present disclosure.

Referring to FIGS. 21D and 22, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration in the deposited semiconductor material can be in a range from $5.0\times10^{18}/cm^3$ to $2.0\times10^{21}/cm^3$, although lesser and greater dopant concentrations can also be employed. The doped semiconductor material can be, for example, doped polysilicon.

Excess portions of the deposited semiconductor material having a doping of the second conductivity type and a horizontal portion of the semiconductor channel layer 60L can be removed from above the horizontal plane including the top surface of the insulating cap layer 370, for example, by chemical mechanical planarization (CMP) or a recess etch process. Each remaining portion of the doped semiconductor material having a doping of the second conductivity type constitutes a drain region 63. Each remaining portion of the semiconductor channel layer 60L (which has a doping of the first conductivity type) constitutes a vertical semiconductor channel 60.

Each portion of the layer stack including the memory material layer 54 that remains in a respective memory opening 49 constitutes a memory film 50. In one embodiment, a memory film 50 may comprise an optional blocking dielectric layer 52, a memory material layer 54, and an optional dielectric liner 56. Each contiguous combination of a memory film 50 and a vertical semiconductor channel 60 constitutes a memory stack structure 55. Each combination of a memory stack structure 55, a dielectric core 62, and a drain region 63 within a memory opening 49 constitutes a memory opening fill structure 58. Each memory opening fill structure 58 comprises a respective vertical stack of memory elements, which may comprise portions of the memory material layer 54 located at levels of the sacrificial material layers 42.

In an alternative embodiment in which the memory opening fill structures 58 and the support pillar structures 20 comprise the same material (i.e., the same set of layers), the steps shown in FIGS. 18 to 20B may be omitted. In this alternative embodiment, the support pillar structures 20 are formed in the support openings 19 at the same time as the memory opening fill structures 58 are formed in the memory opening 49.

Figure 23A:
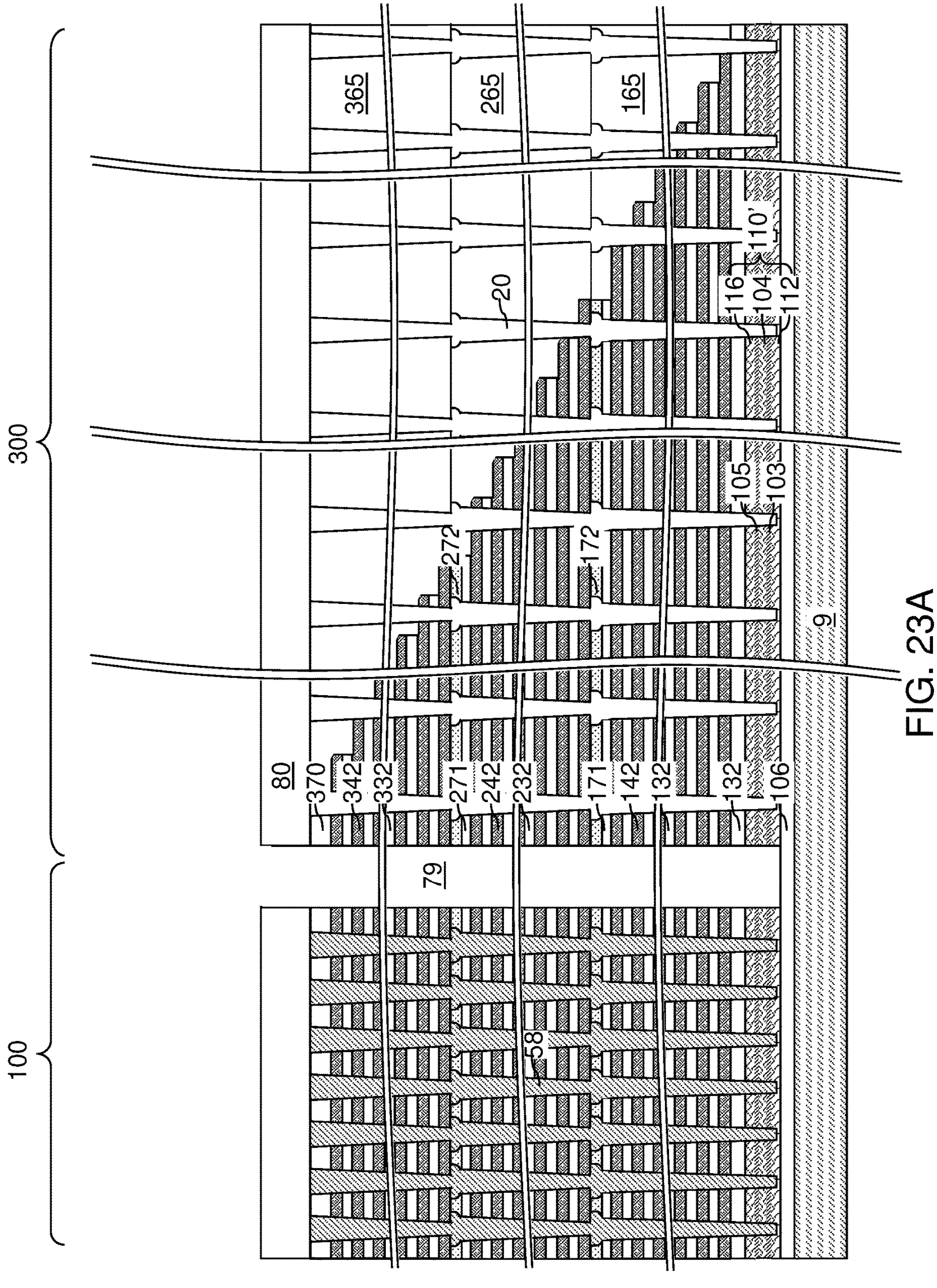
FIG. 23A is a vertical cross-sectional view of the first exemplary structure after formation of a contact-level dielectric layer and backside trenches according to an embodiment of the present disclosure.
Figure 23B:
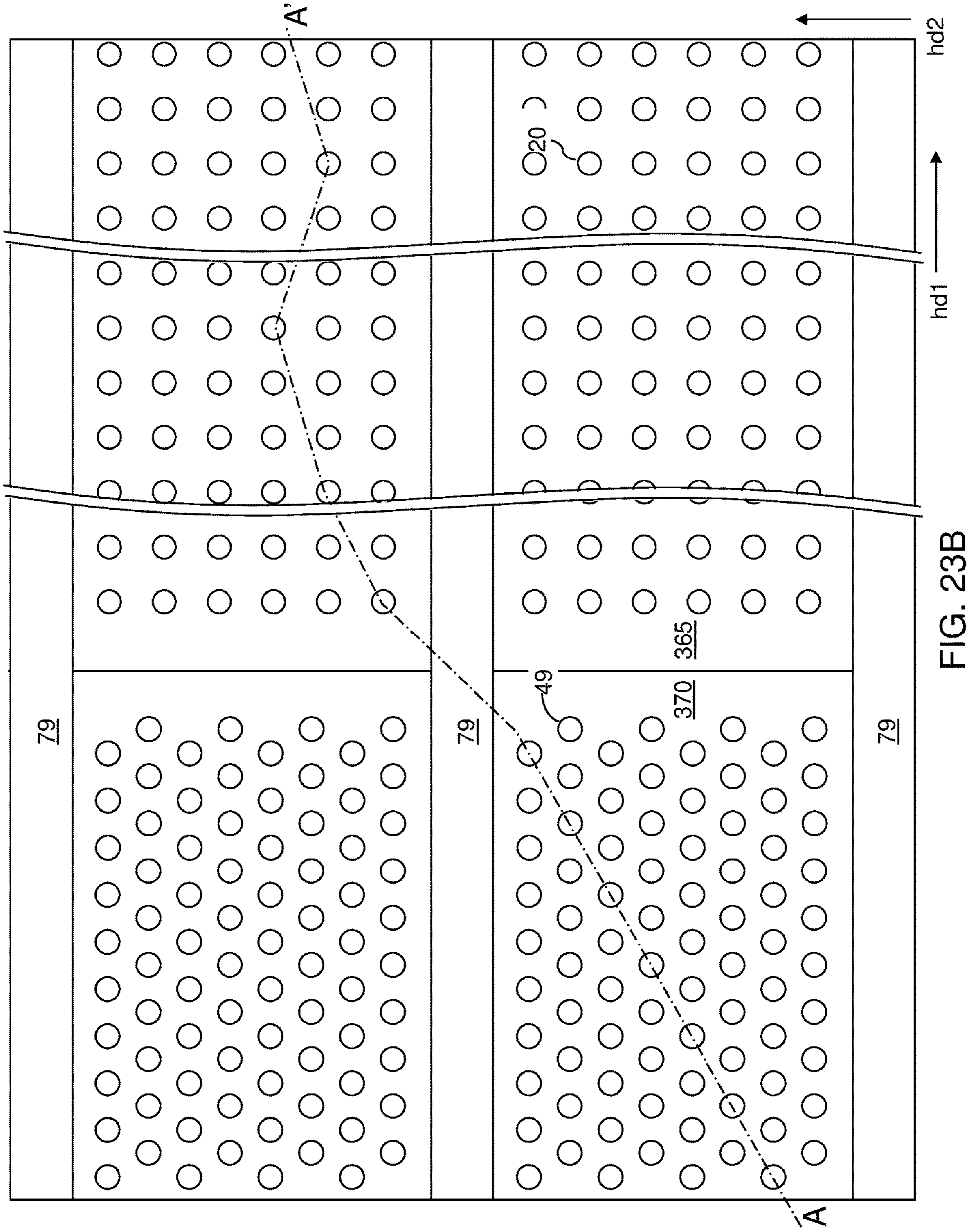
FIG. 23B is a top-down view of the first exemplary structure of FIG. 23A. The hinged vertical plane A-A' is a cut plane of the vertical cross-sectional view of FIG. 23A.

Referring to FIGS. 23A and 23B, a dielectric material such as undoped silicate glass or a doped silicate glass can be deposited over the alternating stacks {(132, 142), (232, 242), (332, 342)} to form a contact-level dielectric layer 80. The thickness of the contact-level dielectric layer 80 may be in a range from 100 nm to 600 nm, such as from 200 nm to 400 nm, although lesser and greater thicknesses may also be employed.

A photoresist layer (not shown) can be applied over the contact-level dielectric layer 80, and can be lithographically patterned to form elongated openings that laterally extend along the first horizontal direction hd1 between neighboring clusters of memory opening fill structures 58. An anisotropic etch process can be performed to transfer the pattern of the openings in the photoresist layer through the contact-level dielectric layer 80, the alternating stacks {(132, 142), (232, 242), (332, 342)}, the stepped dielectric material portion 65, and the in-process source-level material layers 110'. Lateral isolation trenches 79 laterally extending along the first horizontal direction (i.e., word line direction) hd1 can be formed through the alternating stacks {(132, 142), (232, 242), (332, 342)}, the retro-stepped dielectric material portions (165, 265, 365), the contact-level dielectric layer 80, and the in-process source-level material layers 110'. Each of the lateral isolation trenches 79 may comprise a respective pair of lengthwise sidewalls that are parallel to the first horizontal direction hd1 and vertically extend from the stopper insulating layer 106 to the top surface of the contact-level dielectric layer 80. A top surface of the stopper insulating layer 106 can be physically exposed underneath each lateral isolation trench 79. The photoresist layer can be subsequently removed, for example, by ashing.

Figure 24:
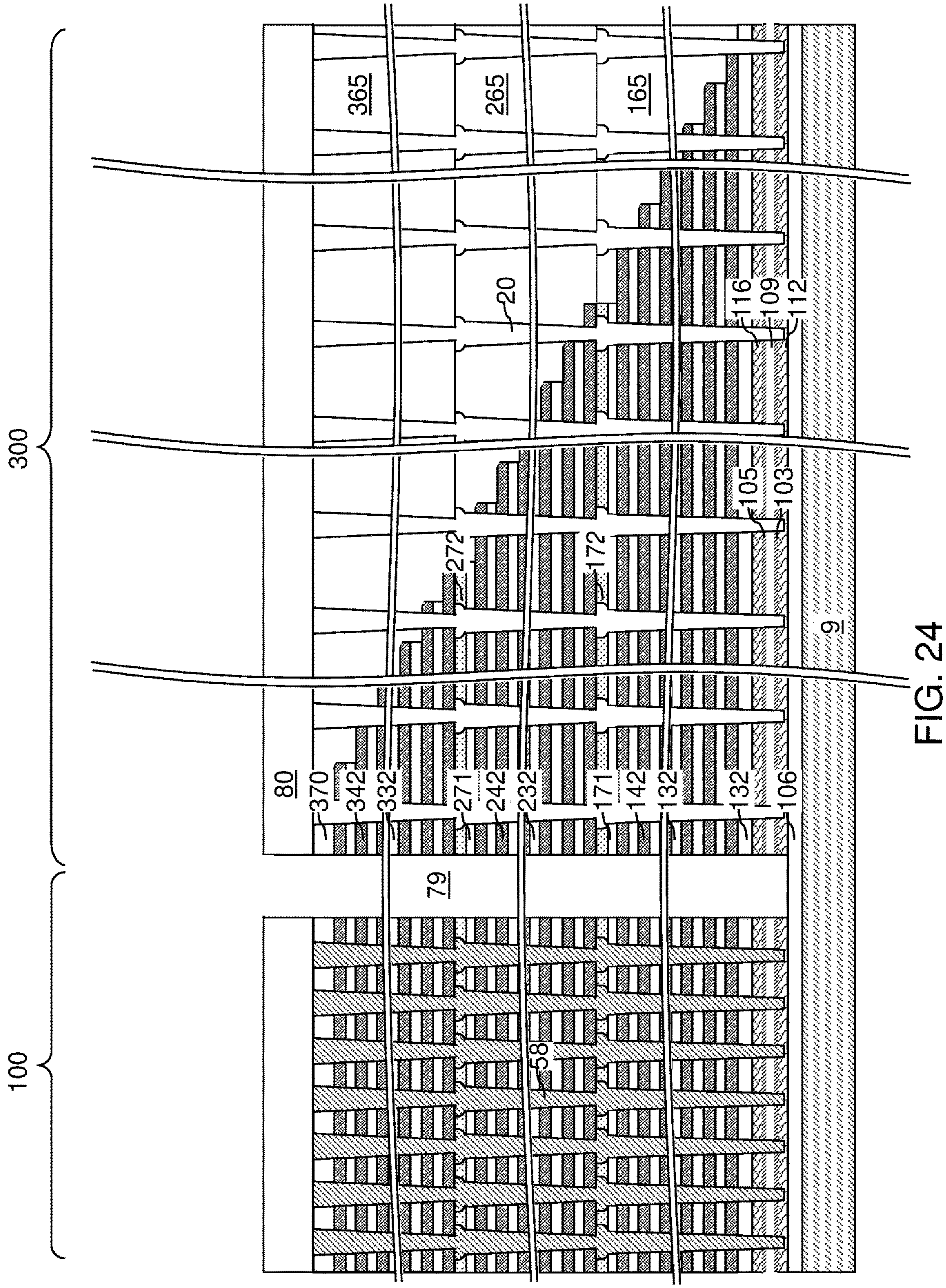
FIG. 24 is a vertical cross-sectional view of the first exemplary structure after formation of a source cavity according to an embodiment of the present disclosure.

Referring to FIG. 24, an etchant that etches the material of the source-level sacrificial layer 104 selective to the materials of the alternating stacks {(132, 142), (232, 242), (332, 342)}, the contact level dielectric layer 80, the retro-stepped dielectric material portions (165, 265, 365), the lower source-level semiconductor layer 112, the upper source-level semiconductor layer 116, the upper sacrificial liner 105 (if present), and the lower sacrificial liner 103 (if present) may be introduced into the lateral isolation trenches 79 by performing an isotropic etch process. For example, if the source-level sacrificial layer 104 includes undoped amorphous silicon or a silicon-germanium alloy, a wet etch process using hot trimethyl-2 hydroxyethyl ammonium hydroxide ("hot TMY") or tetramethyl ammonium hydroxide (TMAH) may be used to remove the source-level sacrificial layer 104 selective to the alternating stacks {(132, 142), (232, 242), (332, 342)}, the contact level dielectric layer 80, the stepped dielectric material portion 65, the lower source-level semiconductor layer 112, and the upper source-level semiconductor layer 116. A source cavity 109 is formed in the volume from which the source-level sacrificial layer 104 is removed. Each of the memory opening fill structures 58 is physically exposed to the source cavity 109. Specifically, each of the memory opening fill structures 58 includes a sidewall that is physically exposed to the source cavity 109.

Figure 25A:
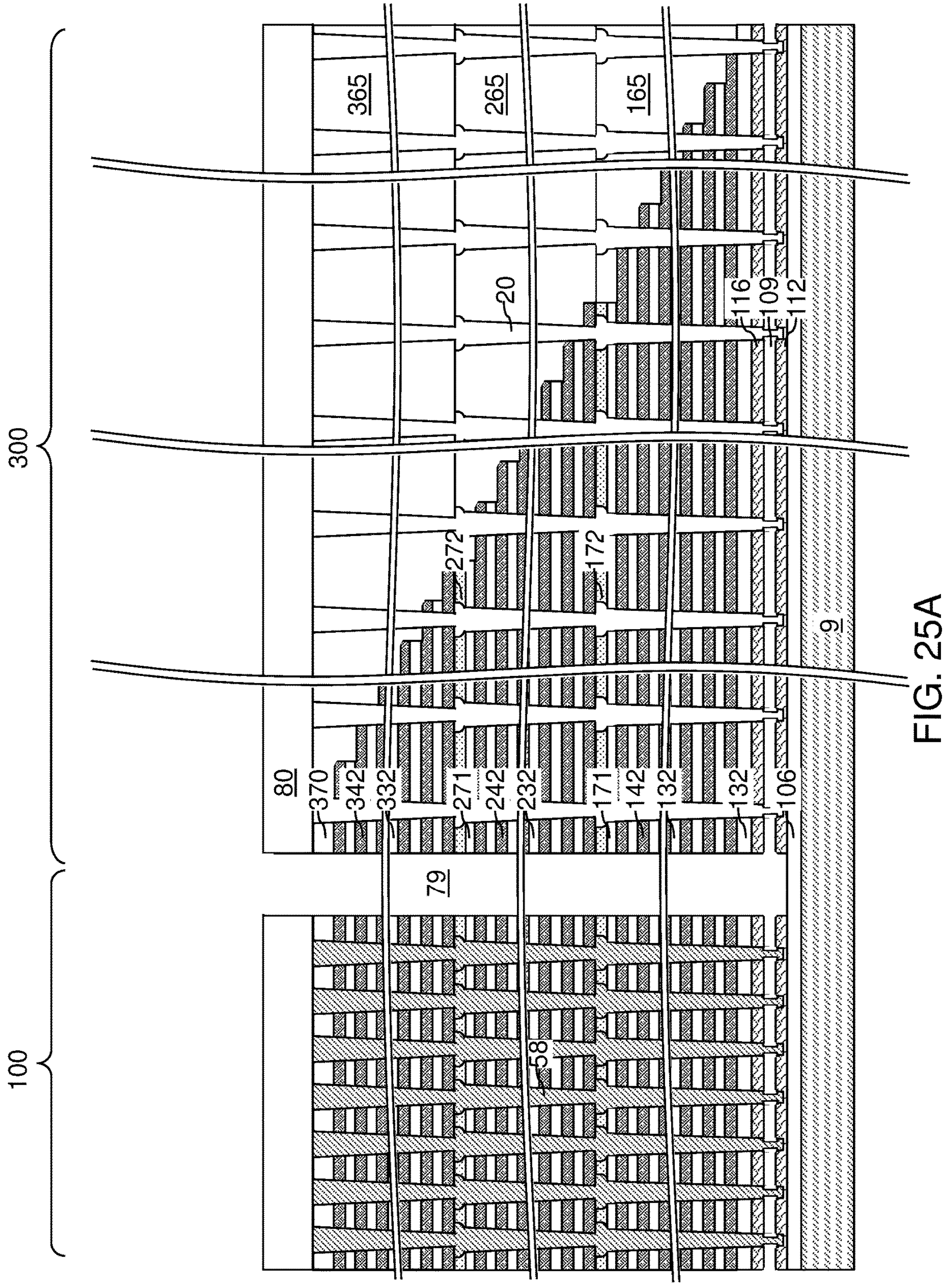
FIG. 25A is a vertical cross-sectional view of the first exemplary structure after removal portions of the memory films that are exposed to the source cavity according to an embodiment of the present disclosure.
Figure 25B:
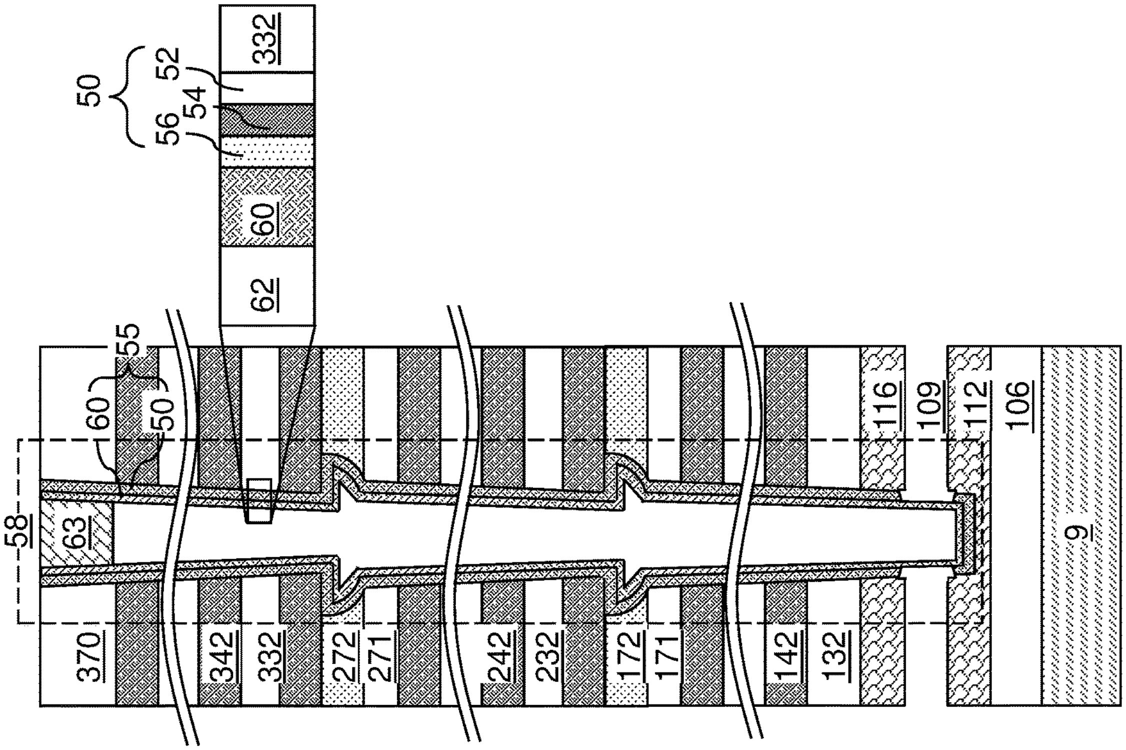
FIG. 25B is a magnified view of a region of the first exemplary structure of FIG. 25A around a memory opening fill structure.

Referring to FIGS. 25A and 25B, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper sacrificial liner 105 (if present) and the lower sacrificial liner 103 (if present) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners. A top surface of the lower source-level semiconductor layer 112 and a bottom surface of the upper source-level semiconductor layer 116 may be physically exposed to the source cavity 109. The source cavity 109 is formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 26A:
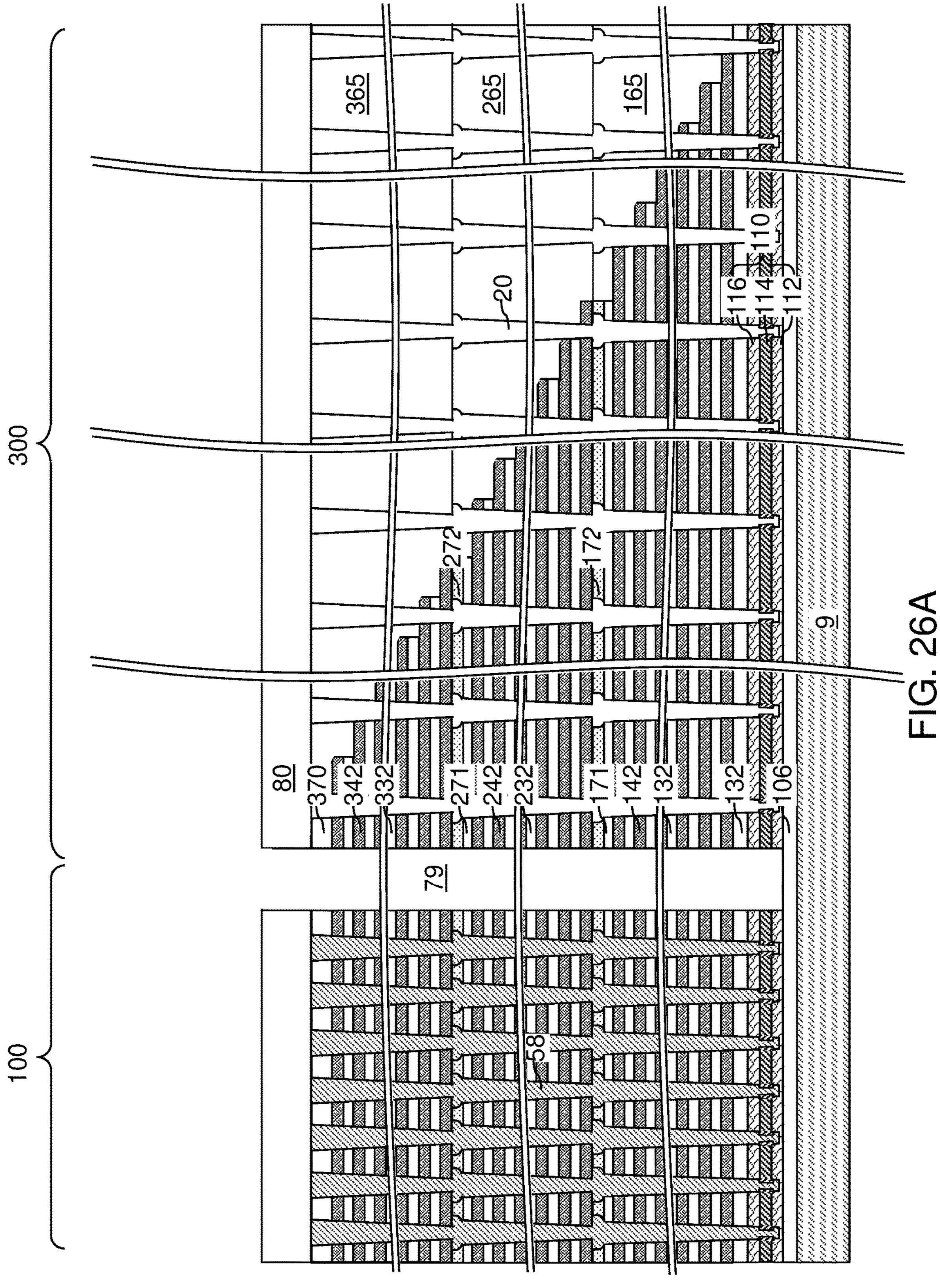
FIG. 26A is a vertical cross-sectional view of the first exemplary structure after formation of a source contact layer according to an embodiment of the present disclosure.
Figure 26B:
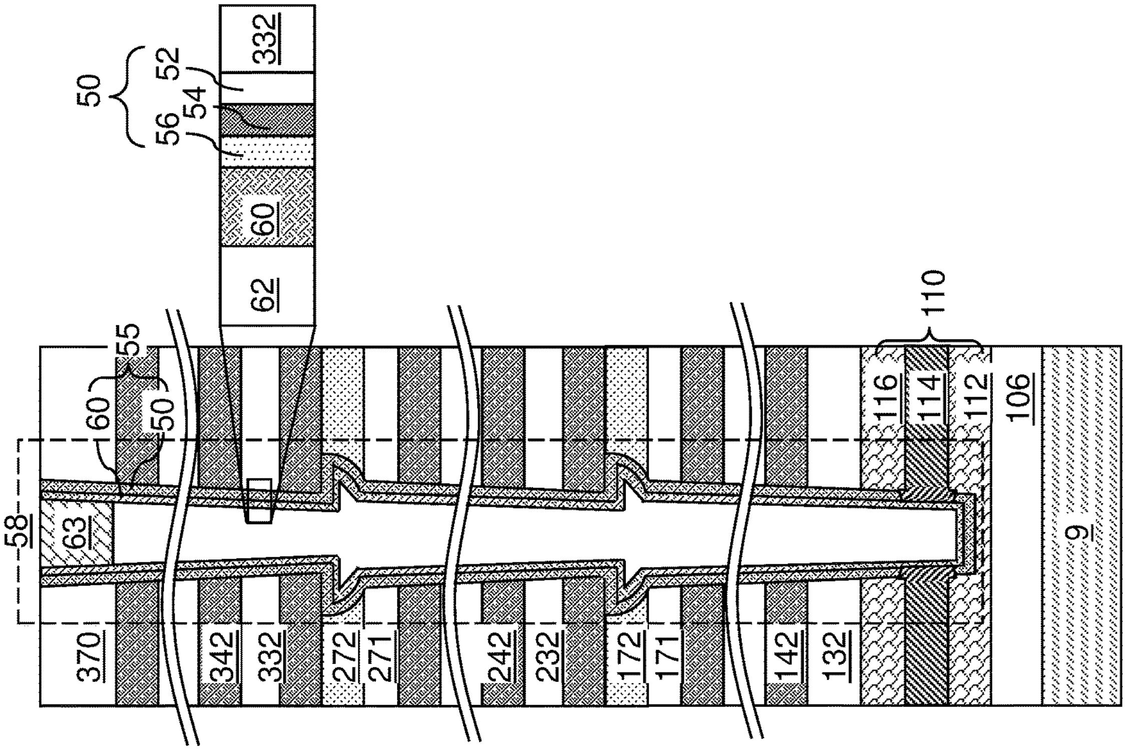
FIG. 26B is a magnified view of a region of the first exemplary structure of FIG. 26A around a memory opening fill structure.

Referring to FIGS. 26A and 26B, a semiconductor material having a doping of the second conductivity type may be deposited on the physically exposed semiconductor surfaces around the source cavity 109. The physically exposed semiconductor surfaces include bottom portions of outer sidewalls of the vertical semiconductor channels 60 and a horizontal surface of the at least one source-level semiconductor layer (such as a bottom surface of the upper source-level semiconductor layer 116 and/or a top surface of the lower source-level semiconductor layer 112). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{19}/cm^3$ to $2.0\times10^{21}/cm^3$, such as from $1.0\times10^{20}/cm^3$ to $8.0\times10^{20}/cm^3$. The source contact layer 114 as initially formed may consist essentially of semiconductor atoms and dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The layer stack including the lower source-level semiconductor layer 112, the source contact layer 114, and the upper source-level semiconductor layer 116 constitutes a source layer 110, which replaces the in-process source-level material layers 110'. The source layer 110 contacts an end portion of each of the vertical semiconductor channels 60.

Figure 27:
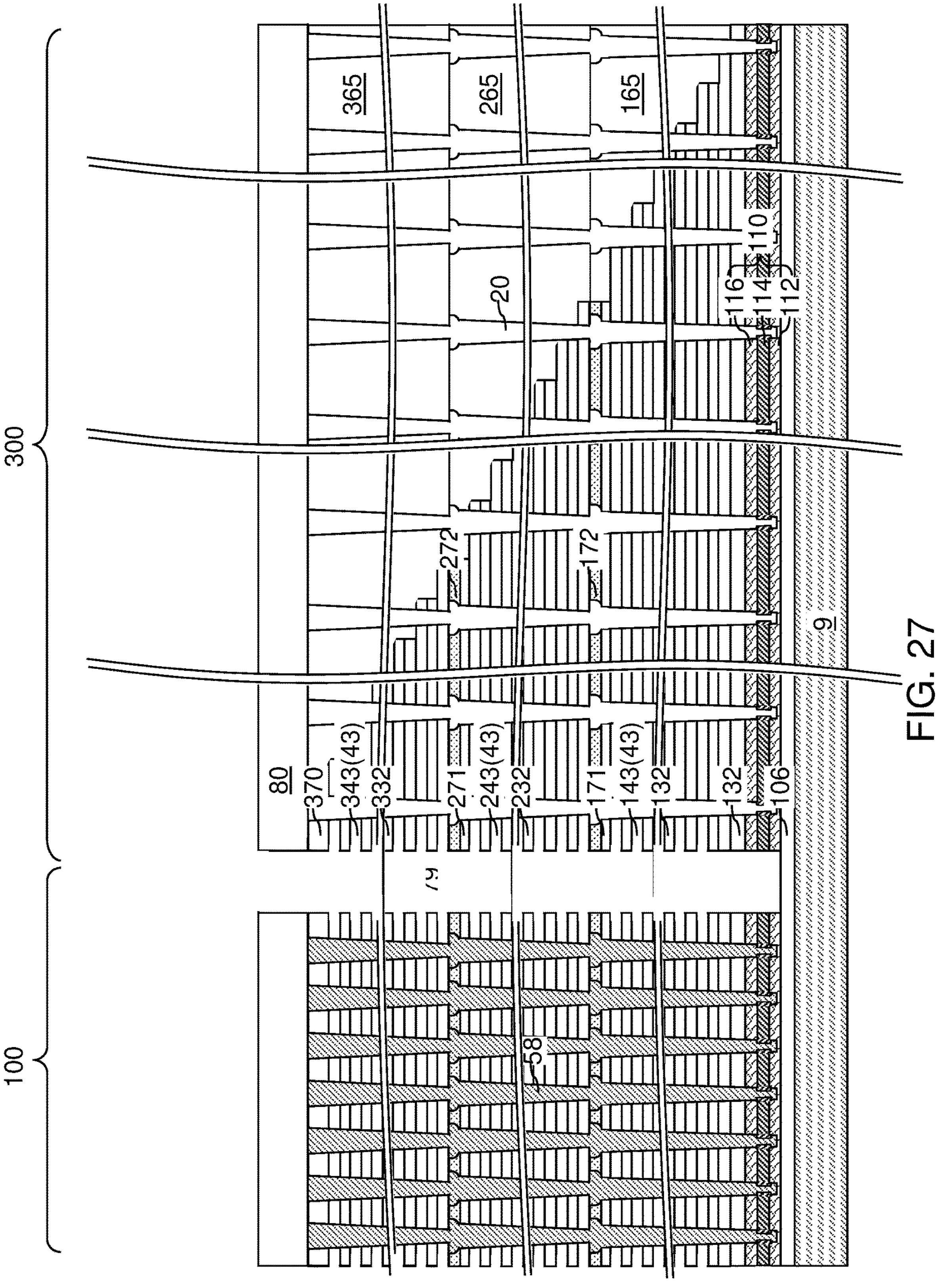
FIG. 27 is a vertical cross-sectional view of the first exemplary structure after formation of backside recesses according to an embodiment of the present disclosure.

Referring to FIG. 27, an isotropic etch process can be performed to remove the sacrificial material layers (142, 242, 342) selective to the insulating layers (132, 232, 332), the stopper insulating layer 106, the memory opening fill structures 58, and the source layer 110. Laterally-extending cavities 43 can be formed in volumes from which the sacrificial material layers (142, 242, 342) are removed. Sidewall surface segments of the memory opening fill structures 58 can be physically exposed to the laterally-extending cavities 43. In an illustrative example, if the sacrificial material layers (142, 242, 342) comprise silicon nitride, the isotropic etch process may comprise a wet etch process employing hot phosphoric acid.

Figure 28:
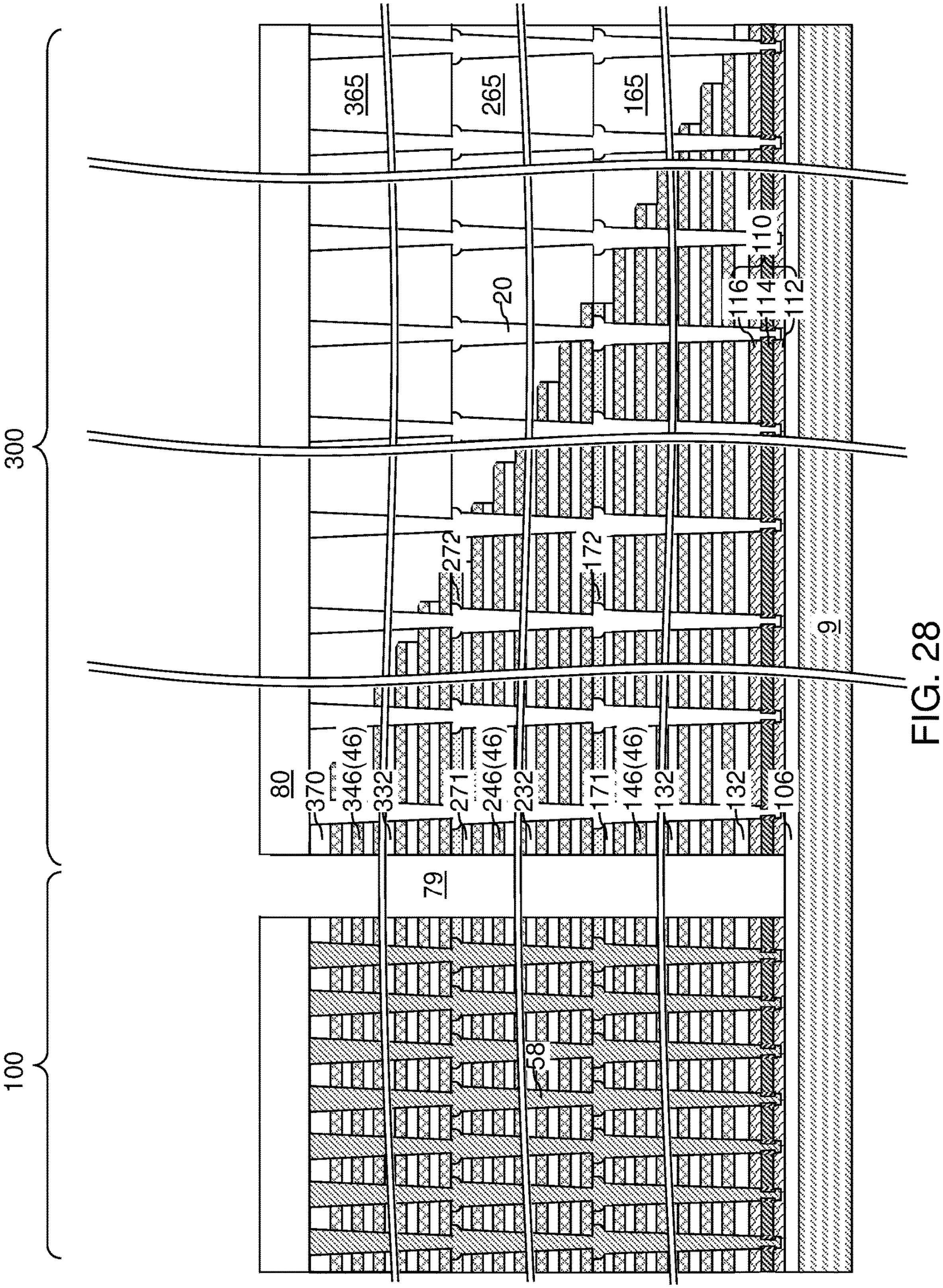
FIG. 28 is a vertical cross-sectional view of the first exemplary structure after formation of electrically conductive layers according to an embodiment of the present disclosure.

Referring to FIG. 28, a backside blocking dielectric layer (not shown), such as an aluminum oxide layer, can be optionally formed in the laterally-extending cavities 43 by a conformal deposition process. At least one conductive material, such as at least one metallic material, can be conformally deposited in the laterally-extending cavities 43. The at least one conductive material may comprise, for example, a combination of a metallic barrier material and a metallic fill material. The metallic barrier material may comprise, for example, TiN, TaN, WN, MON, TiC, TaC, WC, or a combination thereof. The metallic fill material may comprise, for example, Ti, Ta, Mo, Co, Ru, W, Cu, other transition metals, and/or alloys or layer stacks thereof. Excess portions of the at least one conductive material that are deposited in the lateral isolation trenches 79 or above the contact-level dielectric layer 80 can be removed by performing an etch-back process, which may comprise an isotropic etch process and/or an anisotropic etch process. Each remaining portion of the at least one conductive material filling a respective one of the laterally-extending cavities 43 constitutes an electrically conductive layer 46 (e.g., 146, 246, 346). An alternating stack of insulating layers (132, 232, 332) and electrically conductive layers 46 can be formed between each neighboring pair of lateral isolation trenches 79 over the carrier substrate 9. A plurality of alternating stacks of insulating layers (132, 232, 332) and electrically conductive layers 46 can be laterally spaced apart among one another by the lateral isolation trenches 79.

Figure 29A:
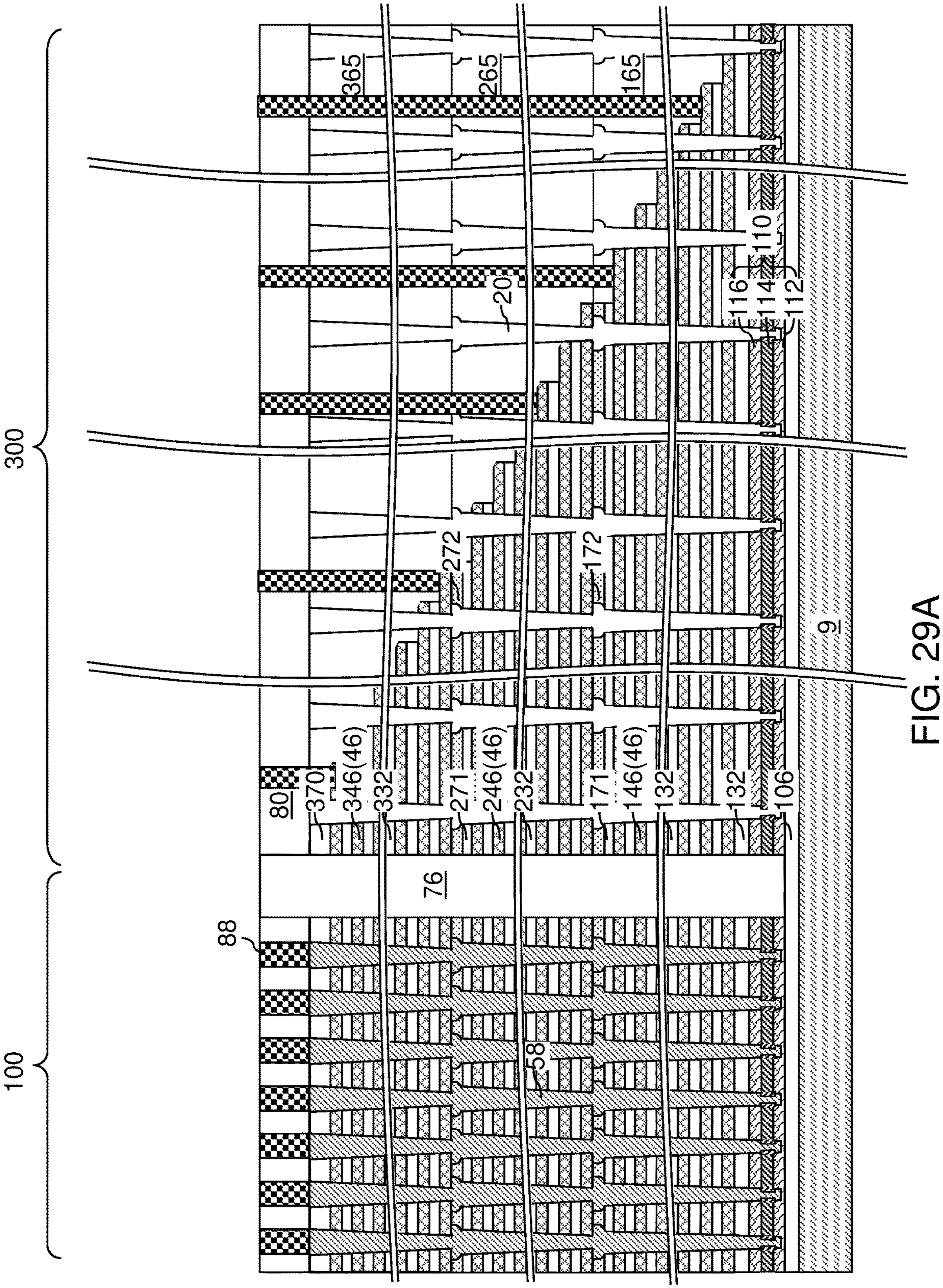
FIG. 29A is a vertical cross-sectional view of the first exemplary structure after formation of backside trench fill structures, drain contact via structures, and layer contact via cavities according to an embodiment of the present disclosure.
Figure 29B:
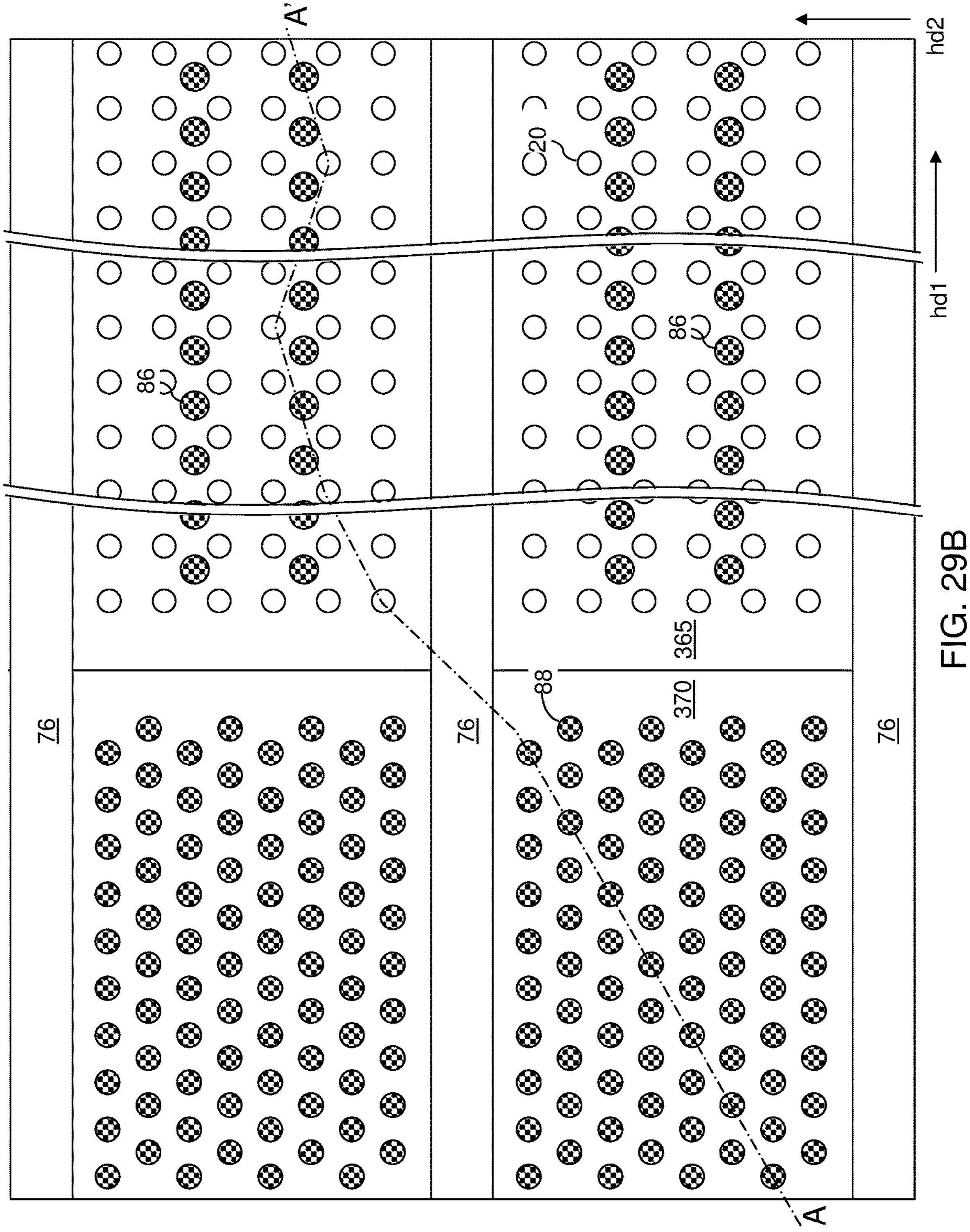
FIG. 29B is a magnified view of a region around a portion of a layer contact via cavity in the first exemplary structure of FIG. 29A.

Referring to FIGS. 29A and 29B, an insulating fill material may be conformally deposited in the lateral isolation trenches 79. Excess portions of the insulating fill material may be removed from above the contact-level dielectric layer 80, for example, by a recess etch process. Each remaining portion of the insulating fill material that fills a respective lateral isolation trench 79 constitutes an isolation trench fill structure 76. Alternatively, each isolation trench fill structure 76 may comprise a combination of a tubular insulating spacer (not expressly shown) and a conductive connection via structure (not expressly shown) that is laterally surrounded by the tubular insulating spacer.

A photoresist layer (not shown) can be applied over the contact-level dielectric layer 80, and can be lithographically patterned to form openings over each of the memory opening fill structures 58 over the horizontally-extending surfaces of the stepped surfaces in the contact region. An anisotropic etch process can be performed to transfer the pattern of the openings in the photoresist layer through the contact-level dielectric layer 80 and the retro-stepped dielectric material portions. Drain contact via cavities can be formed through the contact-level dielectric layer 80 over the memory opening fill structures 58. Layer contact via cavities can be formed through the contact-level dielectric layer 80 and the retro-stepped dielectric material portions on a top surface of a respective one of the electrically conductive layers 46. The photoresist layer can be subsequently removed, for example, by ashing.

At least one conductive material, such as a combination of a metallic barrier material and a metallic fill material, can be deposited in the drain contact via cavities and the layer contact via cavities. Excess portions of the at least one conductive material can be removed from above the horizontal plane including the top surface of the contact-level dielectric layer 80 by a planarization process, which may employ a recess etch process and/or a chemical mechanical polishing process. Remaining portions of the at least one conductive material that fill the drain contact via cavities constitute drain contact via structures 88 contacting a top surface of a respective one of the drain regions 63. Remaining portions of the at least one conductive material that fill the layer contact via cavities constitute layer contact via structures 86 contacting a top surface of a respective one of the electrically conductive layers 46. The electrically conductive layers 46 comprise first electrically conductive layers 146 that replace the first sacrificial material layers 142, second electrically conductive layers 246 that replace the second sacrificial material layers 242, and third electrically conductive layers 346 that replace the third sacrificial material layers 346.

Figure 30:
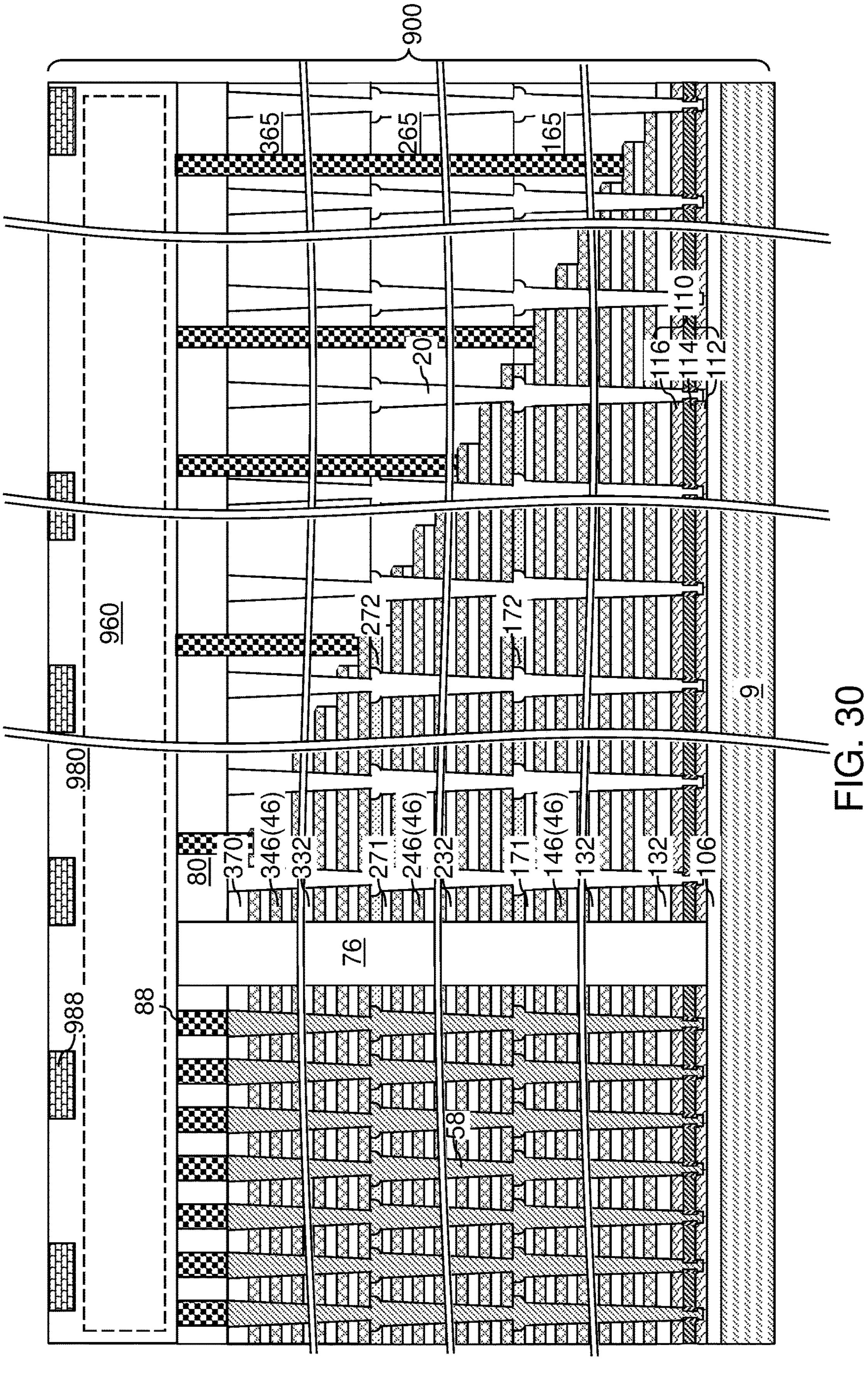
FIG. 30 is a vertical cross-sectional view of the first exemplary structure after formation of memory-side dielectric material layers and memory-side metal interconnect structures according to an embodiment of the present disclosure.

Referring to FIG. 30, additional dielectric material layers and additional metal interconnect structures can be formed over the contact-level dielectric layer 80. The additional dielectric material layers may include at least one via-level dielectric layer, at least one additional line-level dielectric layer, and/or at least one additional line-and-via-level dielectric layer. The additional metal interconnect structures may comprise metal via structures, metal line structures, and/or integrated metal line-and-via structures. The additional dielectric material layers that are formed above the contact-level dielectric layer 80 are herein referred to as memory-side dielectric material layers 960. The additional metal interconnect structures are collectively referred to as memory-side dielectric material layers 960. The memory-side dielectric material layers 960 comprise a bit-line-level dielectric material layer embedding bit lines, which are a subset of the memory-side metal interconnect structures 980.

In one embodiment, a peripheral (i.e., driver) circuit is formed on the substrate 9 below the stopper insulating layer 106. In this embodiment, the peripheral circuit is electrically connected to the various nodes of the memory device.

In another embodiment, described below, the peripheral circuit is formed on a separate substrate and is then bonded to the memory device. Metal bonding pads, which are herein referred to as upper bonding pads 988, may be formed at the topmost level of the memory-side dielectric material layers 960. The upper bonding pads 988 may be electrically connected to the memory-side metal interconnect structures 980 and various nodes of the three-dimensional memory array including the alternating stacks of insulating layers (132, 232, 332) and electrically conductive layers 46 and the memory opening fill structures 58. A memory die 900 is formed by the above steps.

In one embodiment, the memory die 900 may comprise: a three-dimensional memory array underlying the first dielectric material layer 110 and comprising an alternating stack of insulating layers (132, 232, 332) and electrically conductive layers 46, a two-dimensional array of memory openings 49 vertically extending through the alternating stack, and a two-dimensional array of memory opening fill structures 58 located in the two-dimensional array of memory openings 49 and comprising a respective vertical stack of memory elements and a respective vertical semiconductor channel 60, a two-dimensional array of drain contact via structures 88 electrically connected to a respective one of the vertical semiconductor channels 60 via respective drain regions 63; and a two-dimensional array of layer contact via structures 86 electrically connected to a respective one of the electrically conductive layers 46, a subset of which functions as word lines for the three-dimensional memory array.

Figure 31:
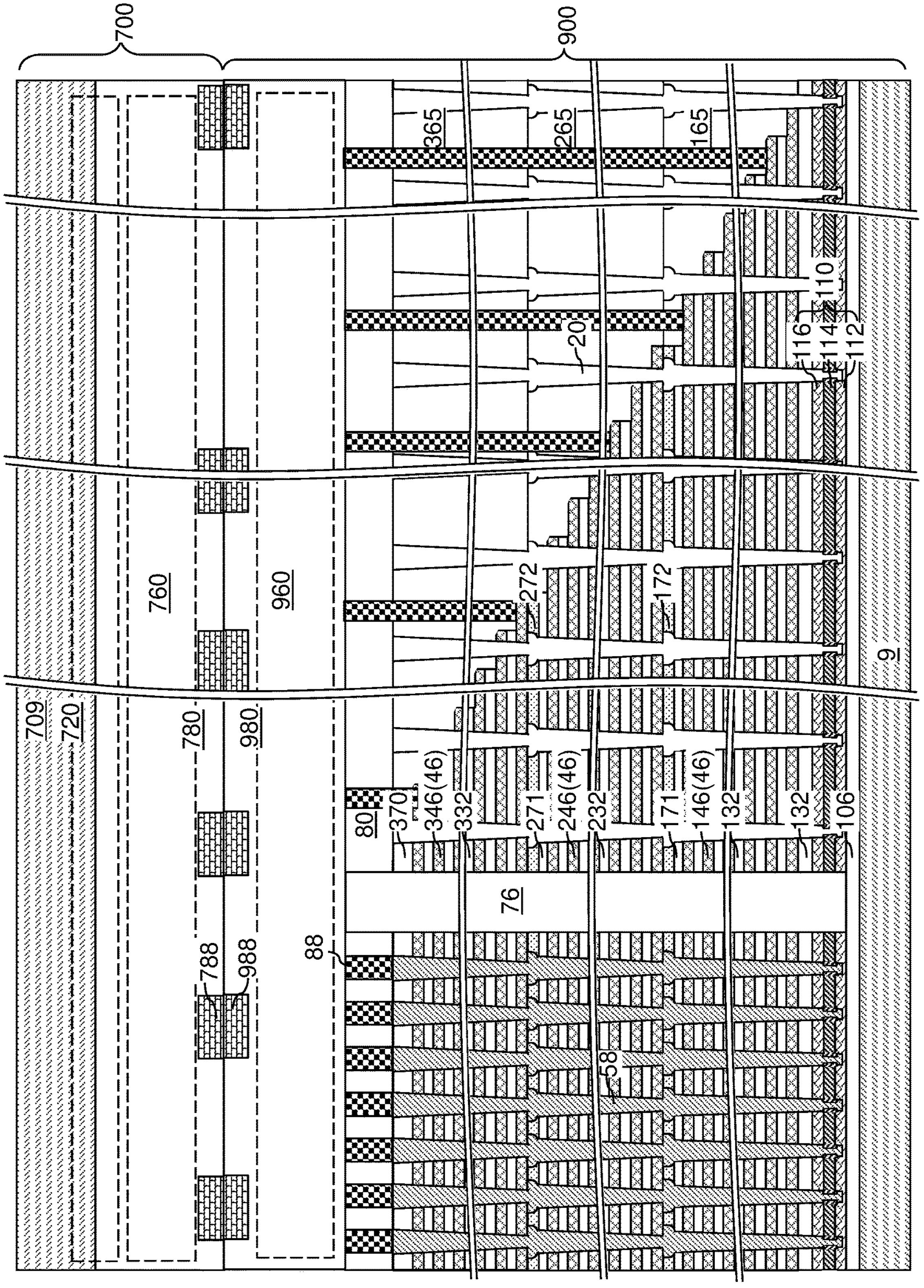
FIG. 31 is a vertical cross-sectional view of the first exemplary structure after attaching a logic die to a memory die according to an embodiment of the present disclosure.

Referring to FIG. 31, a peripheral circuit 720 can be formed on a logic-side substrate 709, which can be a semiconductor substrate. The peripheral circuit 720 can be configured to control operation of the memory array within the memory die 900. Logic-side metal interconnect structures 780 embedded within logic-side dielectric material layers 760 can be formed over the logic-side substrate 709 (which may comprise a semiconductor substrate) to form a logic die 700. The logic die 700 also comprises logic-side bonding pads 788 embedded within logic-side dielectric material layers 760.

A bonded assembly can be formed by bonding the logic die 700 with the memory die 900. The logic die 700 can be attached to the memory die 900, for example, by bonding the logic-side bonding pads 788 to the memory-side bonding pads 988. The bonding between the memory die 900 and the logic die 700 may be performed employing a wafer-to-wafer bonding process in which a two-dimensional array of memory dies 900 is bonded to a two-dimensional array of logic dies 700, by a die-to-bonding process, or by a die-to-die bonding process. The logic-side bonding pads 788 within each logic die 700 can be bonded to the memory-side bonding pads 988 within a respective memory die 900.

Figure 32:
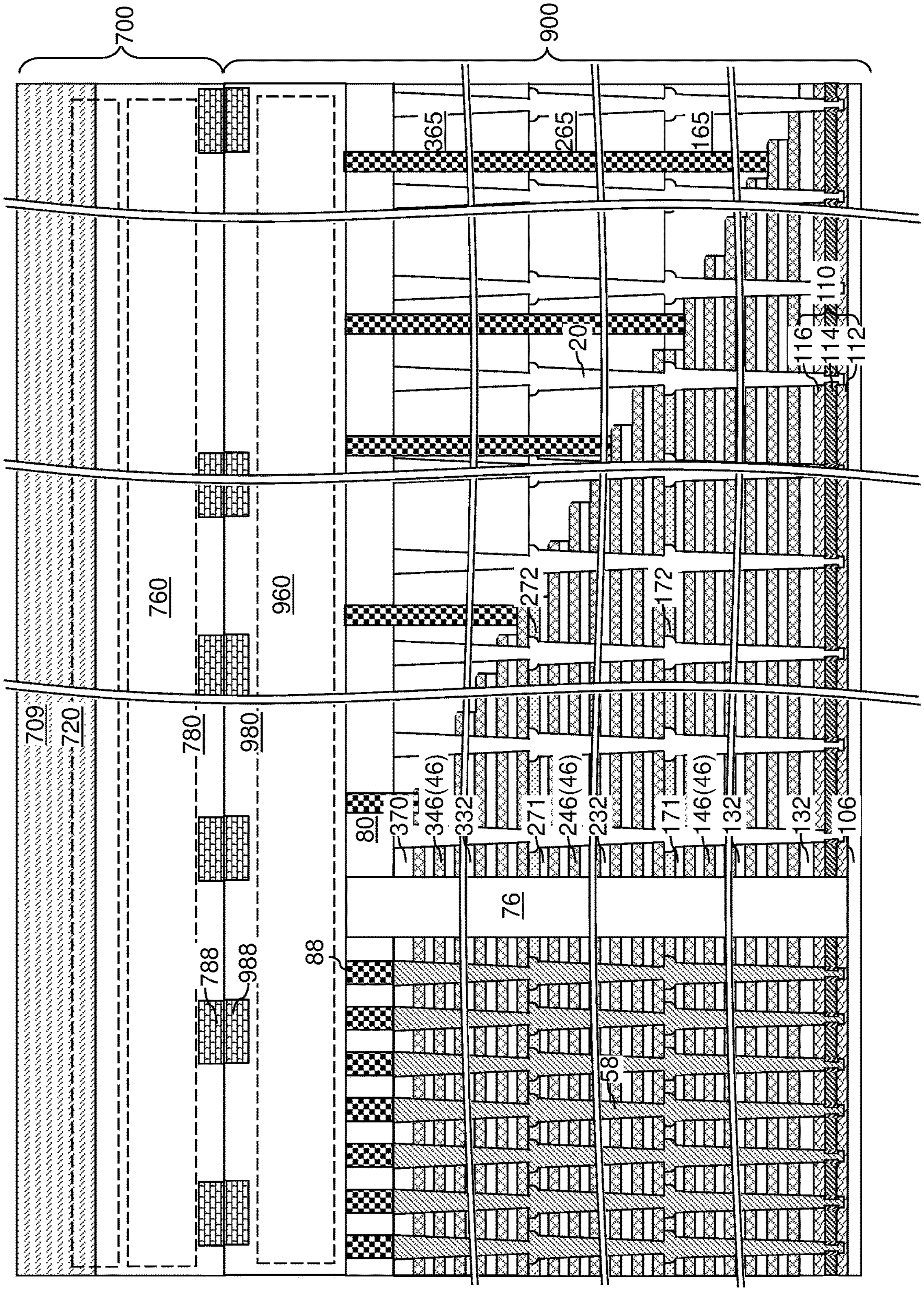
FIG. 32 is a vertical cross-sectional view of the first exemplary structure after removal of a carrier substrate according to an embodiment of the present disclosure.

Referring to FIG. 32, the carrier substrate 9 can optionally be removed, for example, by grinding, polishing, cleaving, an isotropic etch process, and/or an anisotropic etch process. If a polishing process such as a chemical mechanical polishing process is employed to remove the carrier substrate 9, the stopper insulating layer 106 may be subsequently employed as a polishing stopper material layer. If an etch process, such as a wet etch process, is employed to remove the carrier substrate 9, the stopper insulating layer 106 may be subsequently employed as an etch stop material layer.

Figure 33:
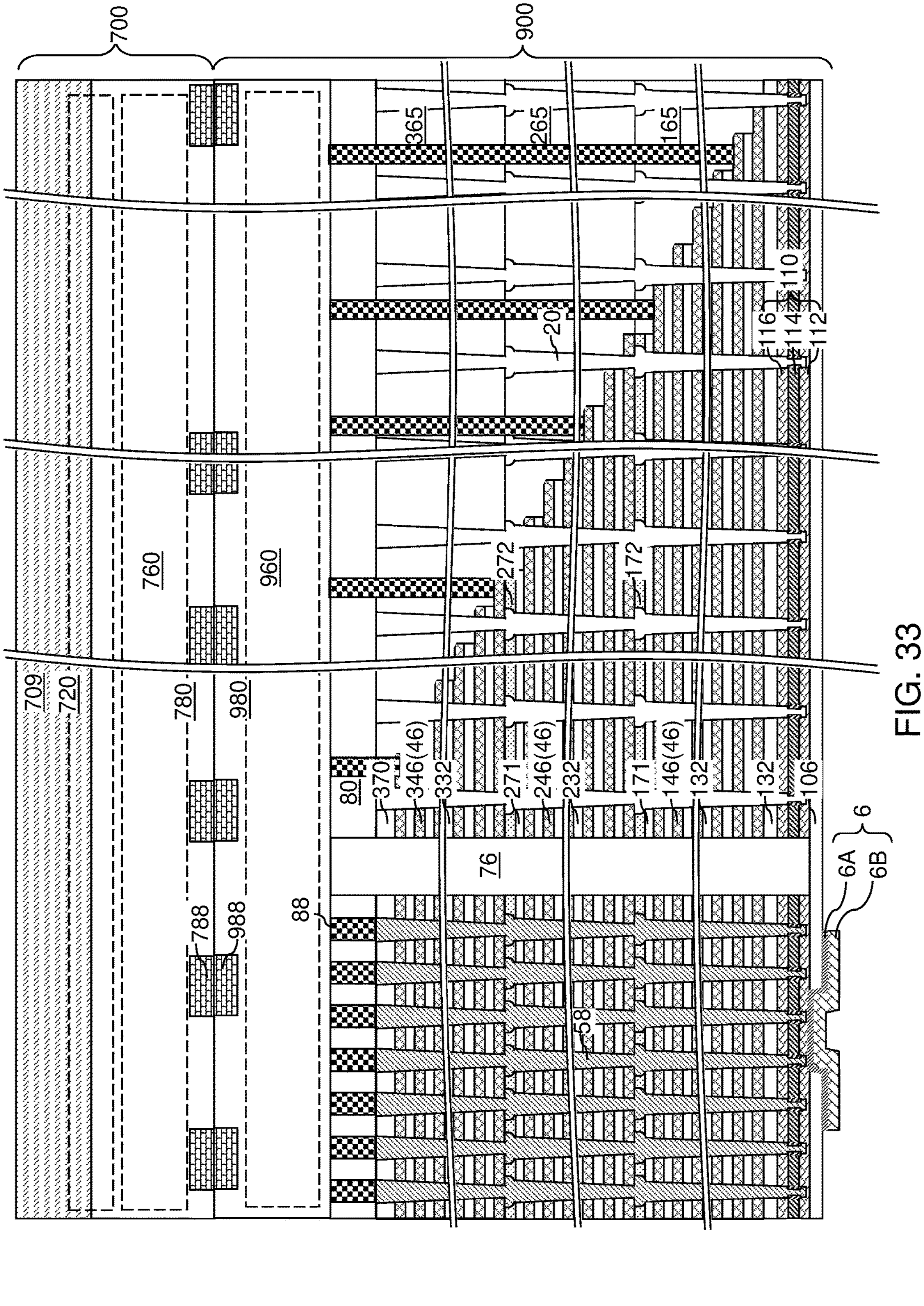
FIG. 33 is a vertical cross-sectional view of the first exemplary structure after formation of a source contact structure according to an embodiment of the present disclosure.

Referring to FIG. 33, a source contact structure 6 can be formed through the stopper insulating layer 106. The source contact structure 6 may comprise a metallic liner 6A and a metal plate portion 6B. Optionally, backside metal interconnect structures (not shown) embedded within backside dielectric material layers (not shown) may be formed. Backside bonding pads (not shown) may be formed as needed.

In the above described embodiment, a carbon sacrificial material was described. However, in alternative embodiments, other sacrificial materials may be used, such as a semiconductor material (e.g., amorphous silicon or polysilicon), an oxide material (e.g., silicon oxynitride or metal oxide) or a metal material.

Referring to FIGS. 1-33 and according to the first embodiment of the present disclosure, a semiconductor structure comprises: a first alternating stack (132, 146) of first insulating layers 132 and first electrically conductive layers 146; a second alternating stack (232, 246) of second insulating layers 232 and second electrically conductive layers 246 that overlies the first alternating stack (132, 146); a first inter-tier dielectric layer stack (171, 172) located between the first alternating stack (132, 146) and the second alternating stack (232, 246) and comprising a lower first inter-tier dielectric layer 171 having a first material composition and an upper first inter-tier dielectric layer 172 having a second material composition that differs from the first material composition by presence of atoms of at least one dopant species therein; a memory opening 49 vertically extending at least through each layer within the first alternating stack (132, 146) and the second alternating stack (232, 246); and a memory opening fill structure 58 located in the memory opening 49 and comprising a vertical semiconductor channel 60 and a vertical stack of memory elements located at levels of the first electrically conductive layers 146 and the second electrically conductive layers 246.

In one embodiment, the first material composition is a homogeneous material composition; and the second material composition is an inhomogeneous material composition having a non-uniform vertical atomic concentration profile of the atoms of the at least one dopant species. In one embodiment, the non-uniform vertical atomic concentration profile has a peak at a height below a top surface of the upper first inter-tier dielectric layer 172 and above a bottom surface of the upper first inter-tier dielectric layer 172.

In one embodiment, the at least one dopant species comprises a noble gas element, the upper first inter-tier dielectric layer 172 comprises a noble gas doped silicon oxide layer, and the lower first inter-tier dielectric layer comprises 171 an undoped silicon oxide layer.

In one embodiment, the first alternating stack (132, 146) comprises first stepped surfaces that continuously extends from a bottommost layer within the first alternating stack (132, 146) to a topmost layer within the first alternating stack (132, 146); a first retro-stepped dielectric material portion 165 overlies and contacts the first stepped surfaces and has a top surface that is coplanar with a top surface of the first inter-tier dielectric layer stack (171, 172); and an upper surface portion of the first retro-stepped dielectric material portion 165 is doped with additional atoms of at least one dopant species. In one embodiment, an areal concentration of the atoms of the at least one dopant species within the first inter-tier dielectric layer stack (171, 172) is the same as an areal concentration of the additional atoms of the at least one dopant species within the upper surface portion of the first retro-stepped dielectric material portion 165.

In one embodiment, the memory opening fill structure 58 comprises: a first sidewall that vertically extends through the first alternating stack (132, 146) and the lower first inter-tier dielectric layer 171; a second sidewall that vertically extends through the second alternating stack (232, 246); and a contoured surface that connects the first sidewall and the second sidewall and comprising a planar annular top surface segment located within a horizontal plane including a top surface of the first inter-tier dielectric layer stack (171, 172) and further including a convex annular sidewall segment that contacts a concave surface segment of the first inter-tier dielectric layer stack (171, 172). In one embodiment, an upper periphery of the convex annular sidewall segment is adjoined to an outer periphery of the planar annular top surface segment.

In one embodiment, the semiconductor structure further comprises: a third alternating stack (332, 346) of third insulating layers 332 and third electrically conductive layers 346 overlying the second alternating stack (232, 246); and a second inter-tier dielectric layer stack (271, 272) located between the second alternating stack (232, 246) and the third alternating stack (332, 346) and comprising a lower second inter-tier dielectric layer 271 having a third material composition and an upper second inter-tier dielectric layer 272 having a fourth material composition that differs from the third material composition by presence of atoms of at least one additional dopant species therein, wherein the memory opening 49 and the memory opening fill structure 58 vertically extend through the third alternating stack (332, 346) and the second inter-tier dielectric layer stack (271, 272). In one embodiment, the third material composition is a homogeneous material composition; and the fourth material composition is an inhomogeneous material composition having a non-uniform vertical atomic concentration profile of the atoms of the at least one additional dopant species.

In one embodiment, the semiconductor structure further comprises a support pillar structure 20 vertically extending at least through each layer within the first alternating stack (132, 146) and the second alternating stack (232, 246) and consisting essentially of at least one dielectric fill material and comprising: a first dielectric sidewall that vertically extends through the first alternating stack (132, 146) and the lower first inter-tier dielectric layer 171; a second dielectric sidewall that vertically extends through the second alternating stack (232, 246); and a contoured dielectric surface that connects the first dielectric sidewall and the second dielectric sidewall and comprising a planar annular top dielectric surface segment located within a horizontal plane including a top surface of the first inter-tier dielectric layer stack (171, 172) and further including a convex annular dielectric sidewall segment that contacts a concave surface segment of the first inter-tier dielectric layer stack (171, 172).

Figure 34:
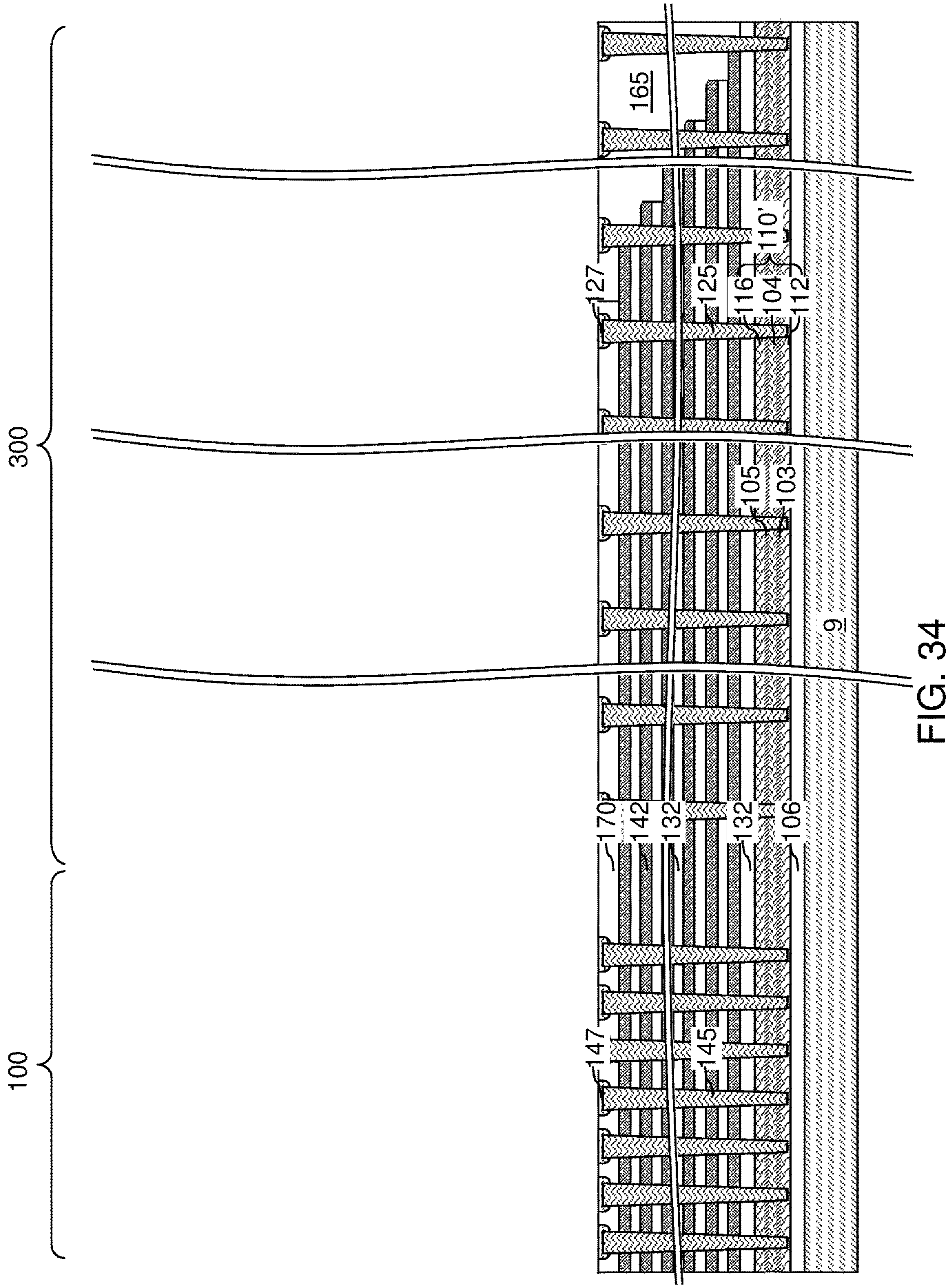
FIG. 34 is a schematic vertical cross-sectional view of a second exemplary structure after formation of first upper sacrificial opening fill material portions according to an embodiment of the present disclosure.

Referring to FIG. 34, a second exemplary structure according to a second embodiment of the present disclosure is illustrated, which may be the same as the first exemplary structure illustrated in FIG. 6. In the second exemplary structure, the first in-process inter-tier dielectric layer 170 is not modified after this processing step, and is hereafter referred to as a first inter-tier dielectric layer 170.

Figure 35:
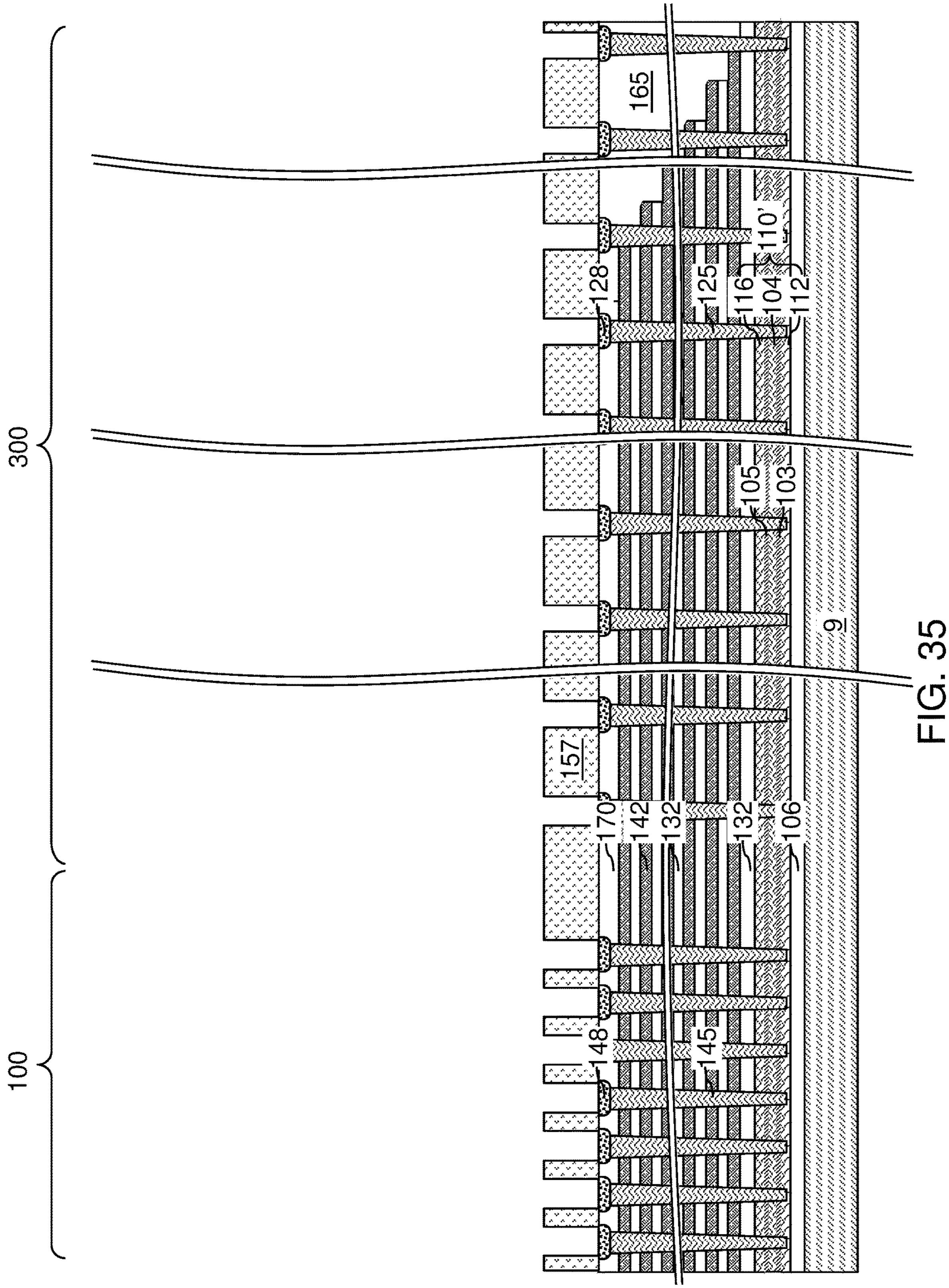
FIG. 35 is a schematic vertical cross-sectional view of the second exemplary structure after formation of a patterned ion implantation layer and performing a first ion implantation process according to an embodiment of the present disclosure.

Referring to FIG. 35, a first photoresist layer 157 can be applied over the first inter-tier dielectric layer 170, and can be lithographically patterned to form openings over the first sacrificial opening fill structures {(145, 147), (125, 127)}. The sacrificial opening fill structures {(145, 147), (125, 127)} may comprise a carbon material, a semiconductor material (e.g., amorphous silicon or polysilicon), an oxide material (e.g., silicon oxynitride or metal oxide) or a metal material.

The periphery of each opening in the first photoresist layer 157 can be located inside the periphery of a top surface of a respective underlying one of the first upper sacrificial memory opening capping material portions 147 and the first upper sacrificial support opening capping material portions 127.

The first ion implantation process described with reference to FIG. 7 can be performed while the patterned first photoresist layer 157 is present over the first inter-tier dielectric layer 170. The process parameters of the first ion implantation process at the processing steps of FIG. 35 can be the same as the process parameters of the first ion implantation process of FIG. 7. Additionally, the species of the dopant employed in the first ion implantation process at the processing steps of FIG. 35 may comprise a noble gas, a semiconductor (e.g., silicon), metal (e.g., Al, Ga, In, Sn, W, etc.) carbon, phosphorus, or nitrogen. In the second embodiment, dopant ions which may degrade the performance of the inter-tier dielectric layer 170 may be used because the patterned first photoresist layer 157 prevents or reduces incorporation of such dopant ions into the inter-tier dielectric layer 170.

Generally, a patterned ion implantation mask layer (such as the patterned first photoresist layer 157) can be formed over the first inter-tier dielectric layer 170 such that the patterned ion implantation mask layer comprises openings overlying the sacrificial memory opening fill structure {(145, 147), (125, 127)}. Each opening can have a bottom periphery that is laterally offset inward from a periphery of a top surface of a respective underlying sacrificial memory opening fill structure {(145, 147), (125, 127)}. The first ion implantation process can be performed, in which atoms of the at least one dopant species are implanted into the upper portion of each first sacrificial memory opening fill structure {(145, 147), (125, 127)} through openings in the patterned ion implantation mask layer 157.

The implanted upper portion of each first sacrificial opening fill structure {(145, 147), (125, 127)} can be converted into a doped sacrificial material portion (148, 128) as described above with respect to the first embodiment. The doped sacrificial material portions (148, 128) comprise first doped sacrificial memory opening capping portions 148 that are formed in the first memory openings 149, and first doped sacrificial support opening capping portions 128 that are formed in the first support openings 129. Each first sacrificial memory opening fill structure (145, 148) can comprise a respective first lower sacrificial memory opening fill material portion 145 and a respective first doped sacrificial memory opening capping portion 148. Each first sacrificial support opening fill structure (125, 128) can comprise a respective first lower sacrificial support opening fill material portion 125 and a respective first doped sacrificial support opening capping portion 128.

In the second exemplary structure, the patterned ion implantation mask layer 157 prevents incorporation of the dopants into the first inter-tier dielectric layer 170 or the first retro-stepped dielectric material portion 165. Thus, the entirety of the first inter-tier dielectric layer 170 may be homogeneous. Likewise, the entirety of the first retro-stepped dielectric material portion 165 may be homogeneous. The patterned ion implantation mask layer (such as the patterned first photoresist layer 157) can be subsequently removed, for example, by ashing.

Figure 36:
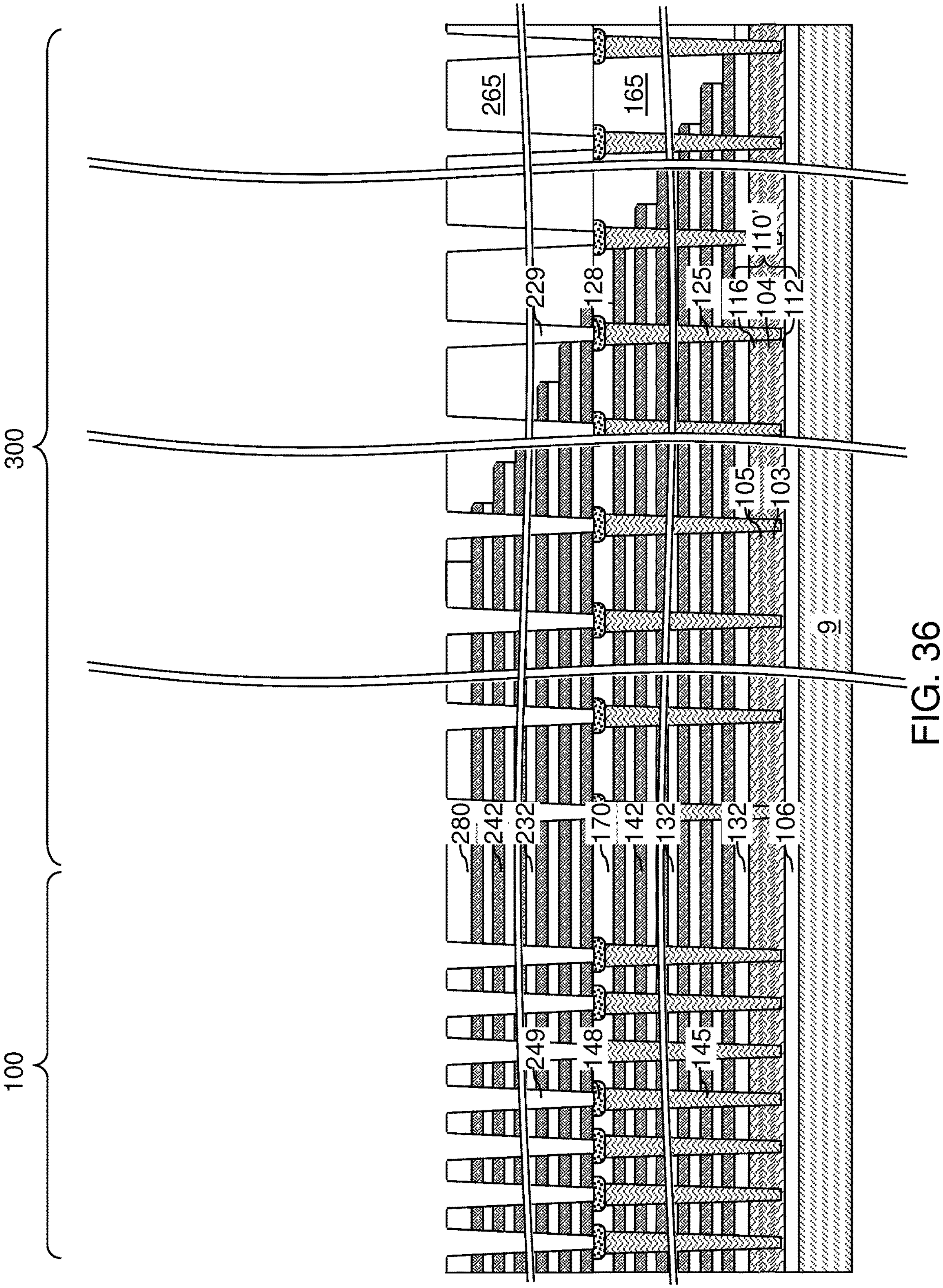
FIG. 36 is a schematic vertical cross-sectional view of the second exemplary structure after formation of a second alternating stack of second insulating layers and second sacrificial material layers, a second first in-process inter-tier dielectric layer, second stepped surfaces, a second retro-stepped dielectric material portion, second memory openings, and second support openings according to an embodiment of the present disclosure.

Referring to FIG. 36, the processing steps described with reference to FIGS. 8 and 9 can be performed. The first doped sacrificial opening capping portions (148, 128) including the first doped sacrificial fill material can function as high-etch resistance etch stop structures during formation of the second memory openings 249 and the second support openings 219. Optionally, the steps described above with respect to FIGS. 10A, 10B and/or 10C may be performed.

Figure 37:
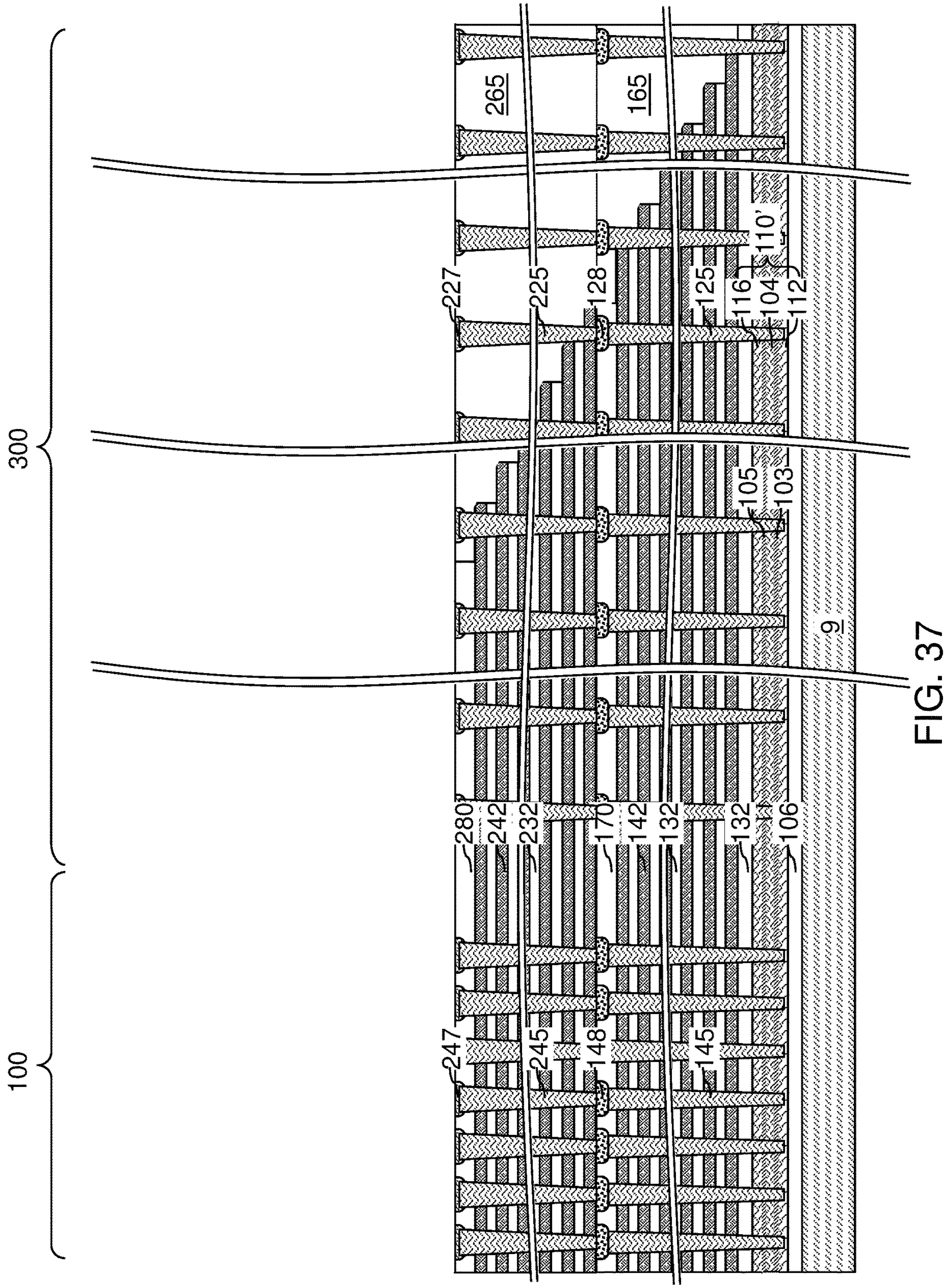
FIG. 37 is a schematic vertical cross-sectional view of the second exemplary structure after formation of second lower sacrificial opening fill material portions, isotropically recessing the second first in-process inter-tier dielectric layer, and formation of second upper sacrificial opening fill material portions according to an embodiment of the present disclosure.

Referring to FIG. 37, the processing steps described with reference to FIGS. 11, 12, and 13 can be performed to form second sacrificial opening fill structure {(245, 247), (225, 227)}. The second in-process inter-tier dielectric layer 270 is not modified after the processing steps of FIG. 37, and thus, is hereafter referred to as a second inter-tier dielectric layer 270.

Figure 38:
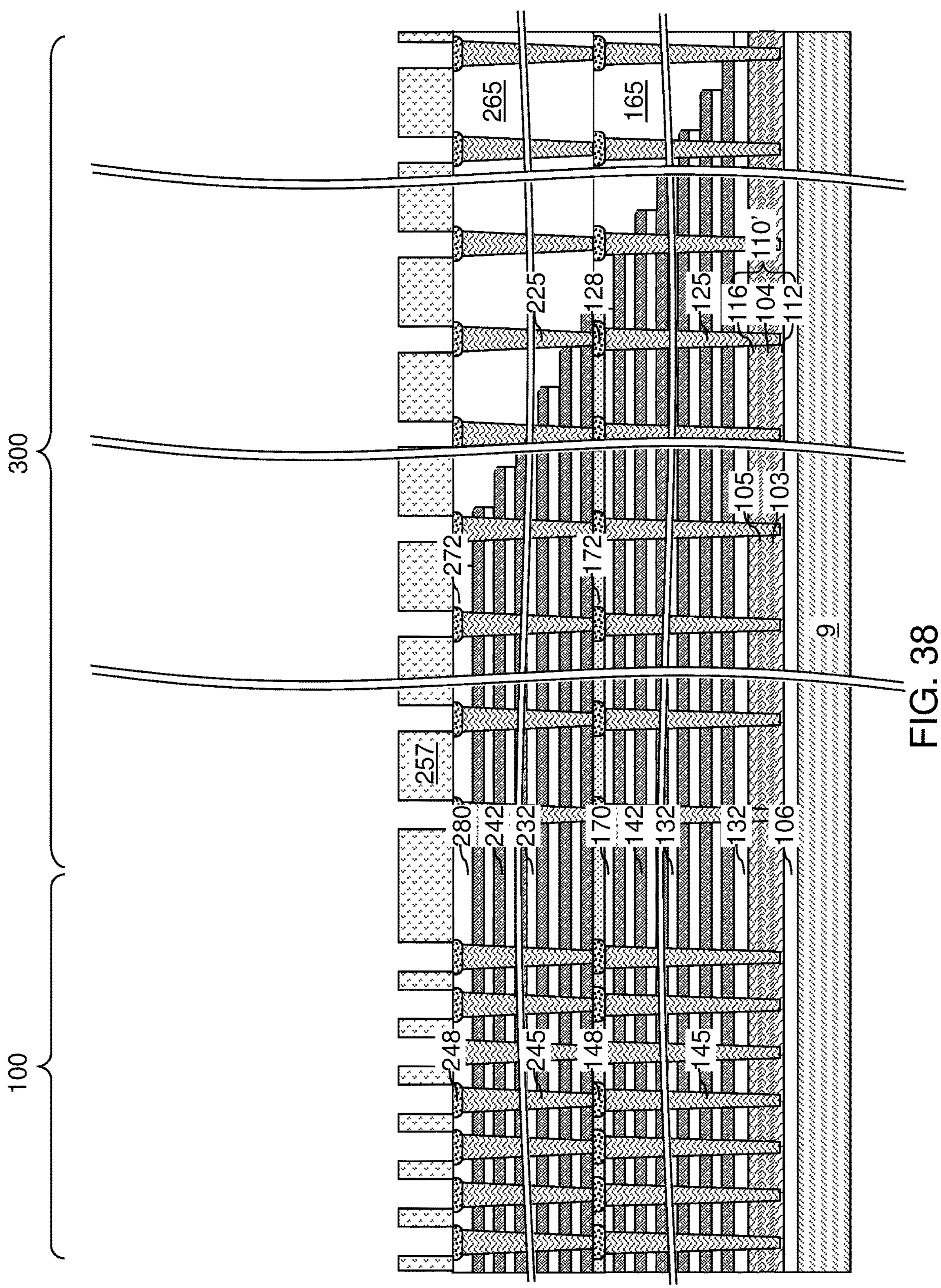
FIG. 38 is a schematic vertical cross-sectional view of the second exemplary structure after formation of a patterned ion implantation layer and performing a second ion implantation process according to an embodiment of the present disclosure.

Referring to FIG. 38, a second photoresist layer 257 can be applied over the second inter-tier dielectric layer 270, and can be lithographically patterned to form openings over the second sacrificial opening fill structures {(245, 247), (225, 227)}. The periphery of each opening in the second photoresist layer 257 can be located inside the periphery of a top surface of a respective underlying one of the second upper sacrificial memory opening capping material portions 247 and the second upper sacrificial support opening capping material portions 227.

The second ion implantation process described with reference to FIG. 14 can be performed while the patterned second photoresist layer 257 is present over the second inter-tier dielectric layer 270. The process parameters of the second ion implantation process at the processing steps of FIG. 38 can be the same as the process parameters of the second ion implantation process of FIG. 13. Additionally, the species of the dopant employed in the second ion implantation process at the processing step of FIG. 38 may be the same as the species employed in the first ion implantation process at the process step of FIG. 35.

The implanted upper portion of each second sacrificial opening fill structure {(245, 247), (225, 227)} can be converted into a doped sacrificial material portion (248, 228), as described above with respect to the first embodiment. In the second exemplary structure, the patterned ion implantation mask layer prevents incorporation of the dopants into the second inter-tier dielectric layer 270 or the second retro-stepped dielectric material portion 265. Thus, the entirety of the second inter-tier dielectric layer 270 may be homogeneous. Likewise, the entirety of the second retro-stepped dielectric material portion 265 may be homogeneous. The patterned ion implantation mask layer (such as the patterned second photoresist layer 257) can be subsequently removed, for example, by ashing.

Figure 39:
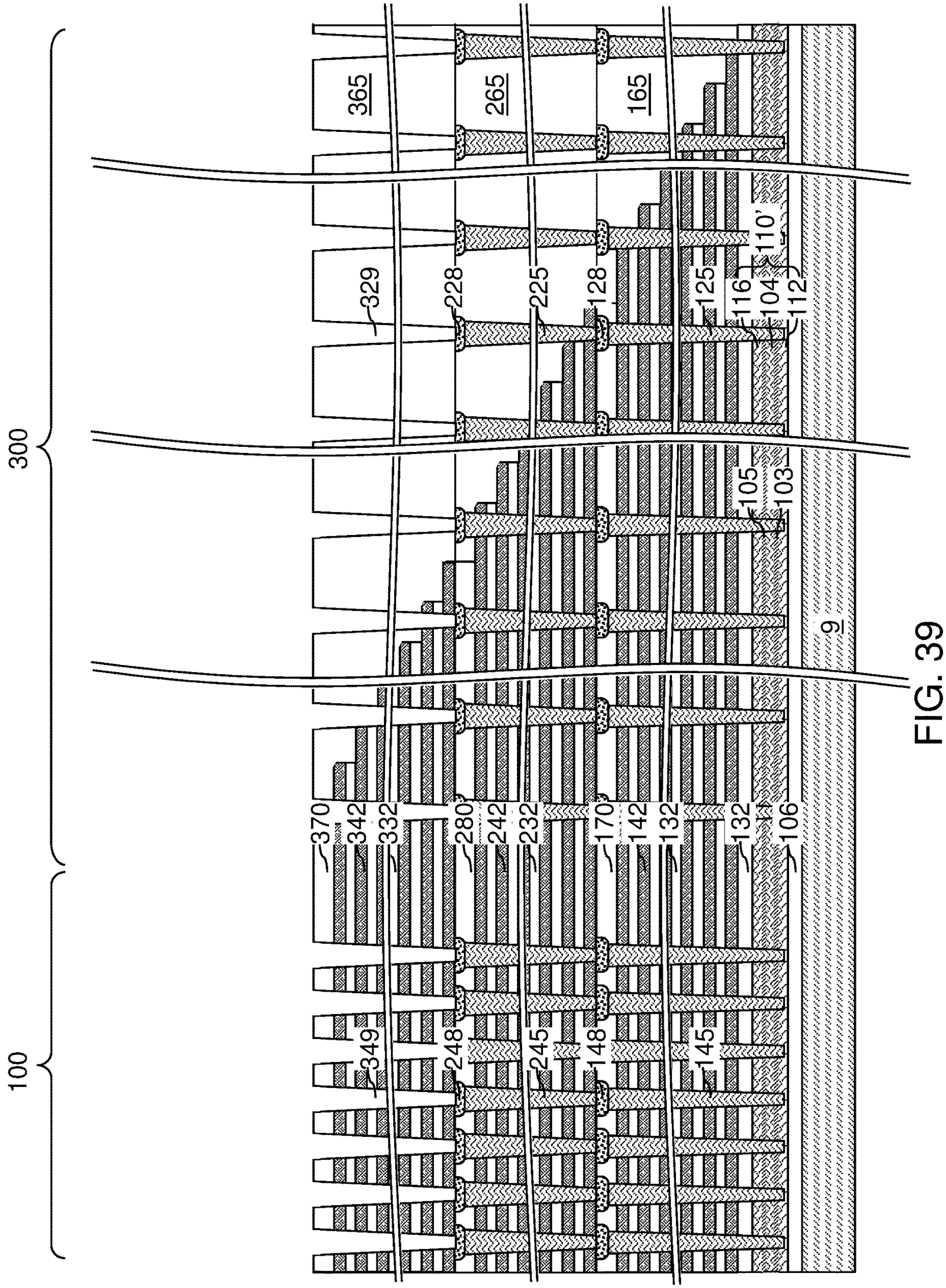
FIG. 39 is a schematic vertical cross-sectional view of the second exemplary structure after formation of a third alternating stack of third insulating layers and third sacrificial material layers, an insulating cap layer, third stepped surfaces, a third retro-stepped dielectric material portion, third memory openings, and third support openings according to an embodiment of the present disclosure.

Referring to FIG. 39, the processing steps described with reference to FIGS. 15, 16A, and 16B can be performed. The second doped sacrificial opening capping portions (248, 228) including the second doped sacrificial fill material can function as high-etch resistance etch stop structures during formation of the third memory openings 249 and the third support openings 219.

Figure 40:
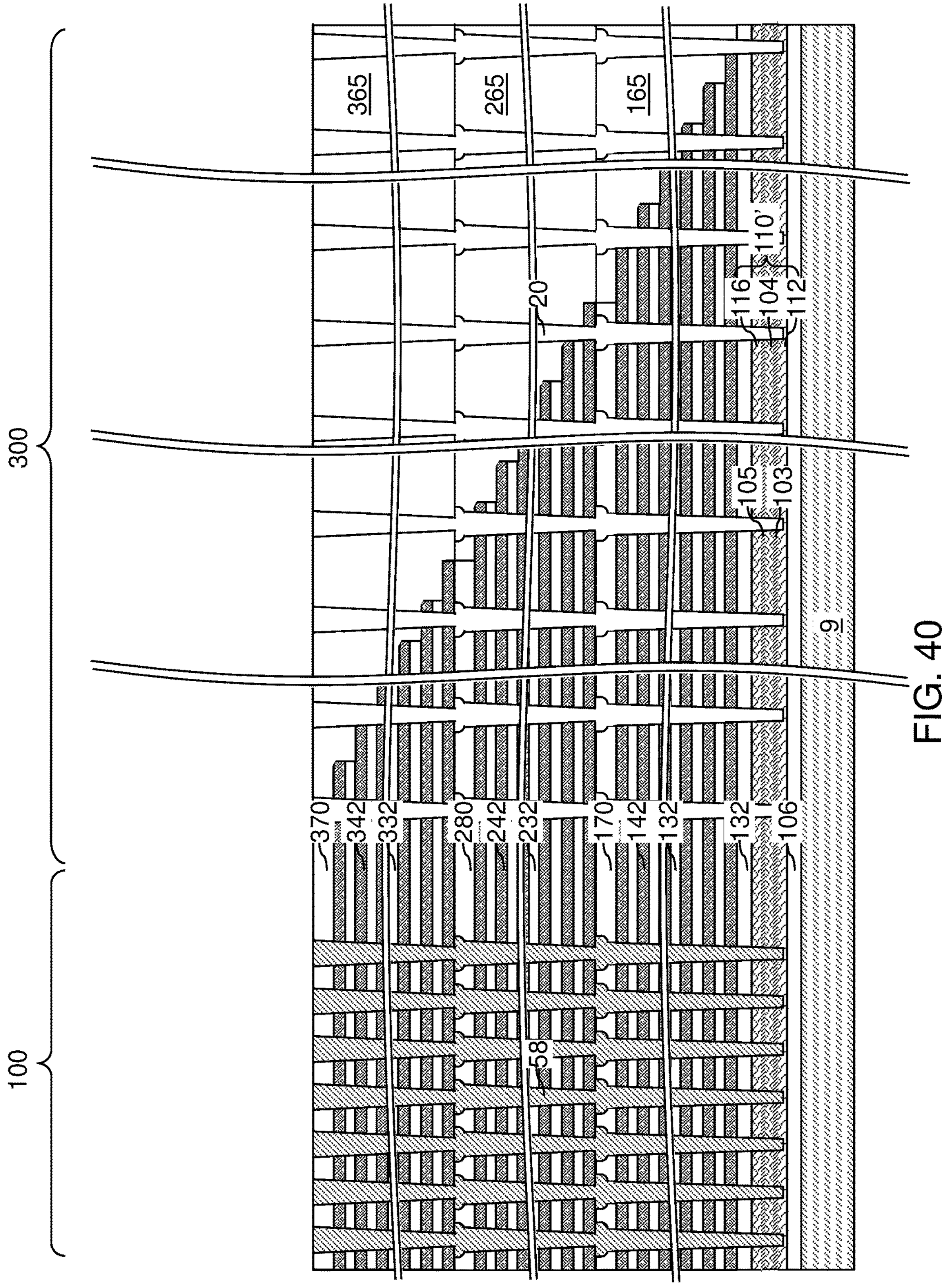
FIG. 40 is a schematic vertical cross-sectional view of the second exemplary structure after formation of memory opening fill structures and support pillar structures according to an embodiment of the present disclosure.

Referring to FIG. 40, the processing steps described with reference to FIGS. 17, 18, 19, 20A and 20B, 21A-21D, and 22 can be performed to form support pillar structures 20 and memory opening fill structures.

Figure 41:
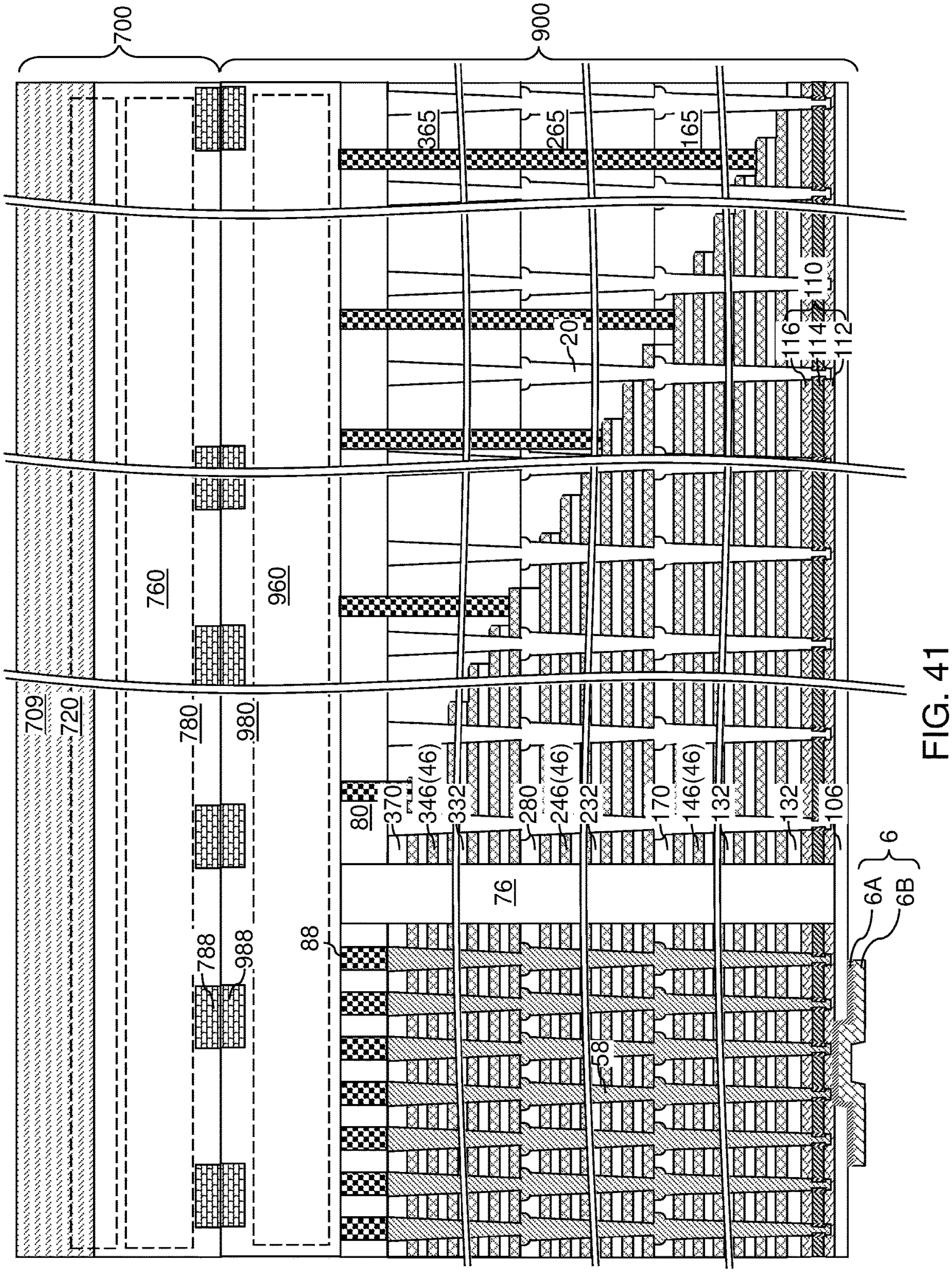
FIG. 41 is a vertical cross-sectional view of the second exemplary structure after formation of a memory die, boding of a logic die to the memory die, removal of a carrier substrate, and formation of a source contact structure according to an embodiment of the present disclosure.

Referring to FIG. 41, the processing steps described with reference to FIGS. 23A-33 can be performed to provide a second exemplary structure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method, comprising:

forming a first alternating stack of first insulating layers and first sacrificial material layers over a substrate;

forming a first in-process inter-tier dielectric layer over the first alternating stack;

forming a first memory opening through the first in-process inter-tier dielectric layer and the first alternating stack;

forming a sacrificial memory opening fill structure in the first memory opening;

doping an upper portion of the sacrificial memory opening fill structure with atoms of at least one dopant species, wherein a lower portion of the sacrificial memory opening fill structure comprises a sacrificial fill material that is not doped with the at least one dopant species and an upper portion of the sacrificial memory opening fill structure comprises a doped sacrificial fill material that is doped with the atoms of the at least one dopant species;

forming a second alternating stack of second insulating layers and second sacrificial material layers over the first alternating stack;

forming a second memory opening through the second alternating stack by performing an anisotropic etch process that has an etch chemistry to which the doped sacrificial fill material provides a higher etch resistance than the sacrificial fill material;

forming a multi-tier memory opening that includes a volume of the second memory opening and a volume of the first memory opening by removing the sacrificial memory opening fill structure;

forming a memory opening fill structure in the multi-tier memory opening, wherein the memory opening fill structure comprises a vertical semiconductor channel and a vertical stack of memory elements; and replacing the first sacrificial material layers and the second sacrificial material layers with first electrically conductive layers and second electrically conductive layers, respectively.

2. The method of claim 1, wherein the doping the upper portion of the first sacrificial memory opening fill structure is performed by implanting ions of the at least one dopant species into the upper portion of the first sacrificial memory opening fill structure.

3. The method of claim 2, wherein:

the implanting ions comprises an unmasked ion implantation process that implants the ions of the at least one first dopant species into an upper portion of the first in-process inter-tier dielectric layer;

the first in-process inter-tier dielectric layer is converted into a layer stack including a lower first inter-tier dielectric layer and an upper first inter-tier dielectric layer;

the lower first inter-tier dielectric layer is not doped with the ions of the at least one dopant species; and the upper first inter-tier dielectric layer is doped with the ions of the at least one dopant species.

4. The method of claim 3, wherein the at least one dopant species comprises noble gas atoms.

5. The method of claim 4, the upper first inter-tier dielectric layer comprises a noble gas doped silicon oxide layer, and the doped sacrificial fill material comprises noble gas doped carbon.

6. The method of claim 1, further comprising:

forming a patterned ion implantation mask layer over the first in-process inter-tier dielectric layer, wherein the patterned ion implantation mask layer comprises an opening overlying the sacrificial memory opening fill structure and having a bottom periphery that is laterally offset inward from a periphery of a top surface of the sacrificial memory opening fill structure; and implanting ions of the at least one dopant species into the upper portion of the sacrificial memory opening fill structure through the opening in the patterned ion implantation mask layer.

7. The method of claim 6, wherein the at least one dopant species comprises noble gas atoms.

8. The method of claim 6, the upper first inter-tier dielectric layer comprises a noble gas doped silicon oxide layer, and the doped sacrificial fill material comprises noble gas doped carbon.

9. The method of claim 6, wherein:

the at least one dopant species comprises carbon, nitrogen, phosphorus, silicon or a metal;

the first inter-tier dielectric layer comprises silicon oxide; and the sacrificial memory opening fill structure comprises a carbon material, a semiconductor material, an oxide material or a metal material.

10. The method of claim 1, wherein the upper portion of the sacrificial memory opening fill structure functions as an etch stop during the anisotropic etch process.

11. The method of claim 1, further comprising removing the upper portion of the sacrificial memory opening fill structure after forming the second memory opening.

12. The method of claim 11, wherein the upper portion of the sacrificial memory opening fill structure comprises a doped carbon material, and the removing the upper portion of the sacrificial memory opening fill structure comprises performing a timed ashing process.

13. The method of claim 11, further comprising selectively regrowing the upper portion of the sacrificial memory opening fill structure after the removing.

14. The method of claim 13, further comprising wet etching the second memory opening after the selectively regrowing the upper portion of the sacrificial memory opening fill structure to widen the second memory opening.

* * * * *